(12) United States Patent
Nishikawa et al.

(10) Patent No.: US 10,559,582 B2
(45) Date of Patent: Feb. 11, 2020

(54) THREE-DIMENSIONAL MEMORY DEVICE CONTAINING SOURCE CONTACT TO BOTTOM OF VERTICAL CHANNELS AND METHOD OF MAKING THE SAME

(71) Applicant: SANDISK TECHNOLOGIES LLC, Addison, TX (US)

(72) Inventors: Masatoshi Nishikawa, Yokkaichi (JP); Shinsuke Yada, Yokkaichi (JP); Masanori Tsutsumi, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 15/997,194

(22) Filed: Jun. 4, 2018

(65) Prior Publication Data
US 2019/0371807 A1 Dec. 5, 2019

(51) Int. Cl.
| H01L 27/24 | (2006.01) |
| H01L 27/11575 | (2017.01) |
| H01L 27/11556 | (2017.01) |
| H01L 27/11582 | (2017.01) |
| H01L 27/11548 | (2017.01) |

(Continued)

(52) U.S. Cl.
CPC .. *H01L 27/11575* (2013.01); *H01L 27/11519* (2013.01); *H01L 27/11529* (2013.01); *H01L 27/11548* (2013.01); *H01L 27/11556* (2013.01); *H01L 27/11565* (2013.01); *H01L 27/11573* (2013.01); *H01L 27/11582* (2013.01)

(58) Field of Classification Search
CPC ......... H01L 27/11575; H01L 27/11519; H01L 27/11573; H01L 27/11529; H01L 27/11548; H01L 27/11582; H01L 27/11556; H01L 27/11565
See application file for complete search history.

(56) References Cited

U.S. PATENT DOCUMENTS

| 5,915,167 A | 6/1999 | Leedy |
| 9,601,503 B2 | 3/2017 | Fukuzumi et al. |

(Continued)

FOREIGN PATENT DOCUMENTS

KR 1020100096865 A 9/2010

OTHER PUBLICATIONS

Endoh et al., "Novel Ultra High Density Memory with a Stacked-Surrounding Gate Transistor (S-SGT) Structured Cell," IEDM Proc. pp. 33-36, (2001).

(Continued)

*Primary Examiner* — Thanh T Nguyen
(74) *Attorney, Agent, or Firm* — The Marbury Law Group PLLC

(57) ABSTRACT

A three-dimensional memory device includes source-level material layers located over a substrate, the source-level material layers containing a source contact layer, an alternating stack of insulating layers and electrically conductive layers located over the substrate-level material layers, memory stack structures extending through the alternating stack, such that each of the memory stack structures includes a memory film and a vertical semiconductor channel having a bottom surface that contacts a respective horizontal surface of the source contact layer, and dielectric pillar structures embedded within the substrate-level material layers and located between the memory stack structures.

10 Claims, 57 Drawing Sheets

(51) Int. Cl.
*H01L 27/11565* (2017.01)
*H01L 27/11529* (2017.01)
*H01L 27/11573* (2017.01)
*H01L 27/11519* (2017.01)

(56) References Cited

U.S. PATENT DOCUMENTS

| | | |
|---|---|---|
| 9,799,670 B2 | 10/2017 | Nishikawa et al. |
| 9,824,966 B1 | 11/2017 | Kanakamedala et al. |
| 9,831,266 B2 | 11/2017 | Kai et al. |
| 9,887,200 B2 | 2/2018 | Lin |
| 9,917,100 B2 | 3/2018 | Zhang et al. |
| 9,941,296 B2 | 4/2018 | Fukuzumi et al. |
| 9,972,641 B1* | 5/2018 | Zhang ............... H01L 27/11582 |
| 9,985,098 B2 | 5/2018 | Matsumoto et al. |
| 2002/0017668 A1 | 2/2002 | Hofmann et al. |
| 2002/0109173 A1 | 8/2002 | Forbes et al. |
| 2002/0109176 A1 | 8/2002 | Forbes et al. |
| 2002/0110039 A1 | 8/2002 | Forbes et al. |
| 2002/0119620 A1 | 8/2002 | Menut et al. |
| 2002/0161461 A1 | 10/2002 | Lobb et al. |
| 2003/0006446 A1 | 1/2003 | Forbes et al. |
| 2003/0218199 A1 | 11/2003 | Forbes et al. |
| 2004/0007721 A1 | 1/2004 | Forbes et al. |
| 2004/0079988 A1 | 4/2004 | Harari |
| 2004/0139604 A1 | 7/2004 | Kinsman et al. |
| 2004/0197997 A1 | 10/2004 | Lee et al. |
| 2005/0145911 A1 | 7/2005 | Forbes et al. |
| 2005/0190617 A1 | 9/2005 | Forbes et al. |
| 2005/0247966 A1 | 11/2005 | Adkisson et al. |
| 2006/0048382 A1 | 3/2006 | Kinsman et al. |
| 2006/0091442 A1 | 5/2006 | Adkisson et al. |
| 2006/0098485 A1 | 5/2006 | Leenders et al. |
| 2006/0113587 A1 | 6/2006 | Thies et al. |
| 2006/0237706 A1 | 10/2006 | Enda et al. |
| 2007/0018201 A1 | 1/2007 | Specht et al. |
| 2007/0237002 A1 | 10/2007 | Enda et al. |
| 2008/0150012 A1 | 6/2008 | Thies et al. |
| 2010/0052029 A1* | 3/2010 | Huang ............... H01L 27/10876 257/309 |
| 2010/0244119 A1 | 9/2010 | Fukuzumi et al. |
| 2010/0295106 A1 | 11/2010 | Huang |
| 2011/0147818 A1 | 6/2011 | Katsumata et al. |
| 2011/0286175 A1 | 11/2011 | Iyengar et al. |
| 2012/0182805 A1* | 7/2012 | Liu ............... G11C 16/0483 365/185.17 |
| 2012/0217612 A1 | 8/2012 | Baars et al. |
| 2014/0117434 A1 | 5/2014 | Fukuzumi et al. |
| 2015/0364489 A1 | 12/2015 | Fukuzumi et al. |
| 2016/0086970 A1* | 3/2016 | Peng ............... H01L 27/11565 257/324 |
| 2016/0190152 A1 | 6/2016 | Fukuzumi et al. |
| 2017/0125423 A1 | 5/2017 | Lin |
| 2017/0148800 A1* | 5/2017 | Nishikawa ......... H01L 27/1157 |
| 2017/0148810 A1 | 5/2017 | Kai et al. |
| 2017/0148811 A1 | 5/2017 | Zhang et al. |
| 2017/0148815 A1 | 5/2017 | Fukuzumi et al. |
| 2018/0122904 A1 | 5/2018 | Matsumoto et al. |
| 2018/0122905 A1 | 5/2018 | Ogawa et al. |
| 2018/0122906 A1 | 5/2018 | Yu et al. |

OTHER PUBLICATIONS

U.S. Appl. No. 15/626,444, filed Jun. 19, 2017, SanDisk Technologies LLC.
U.S. Appl. No. 15/633,131, filed Jun. 26, 2017, SanDisk Technologies LLC.
Notification of Transmittal of the International Search Report and Written Opinion of the International Search Authority for International Patent Application No. PCT/US2019/017959, dated Jun. 17, 2019, 13 pages.

* cited by examiner

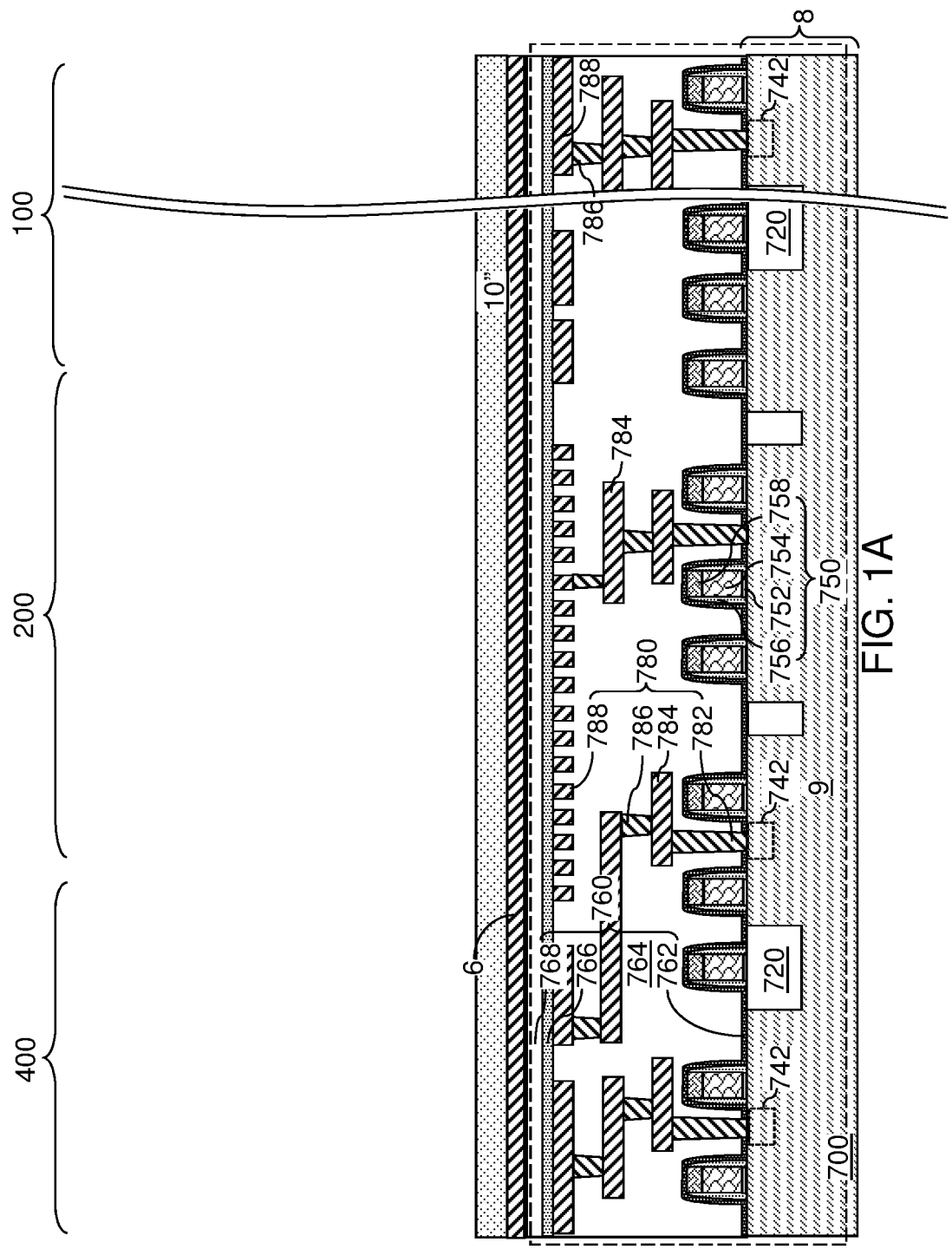

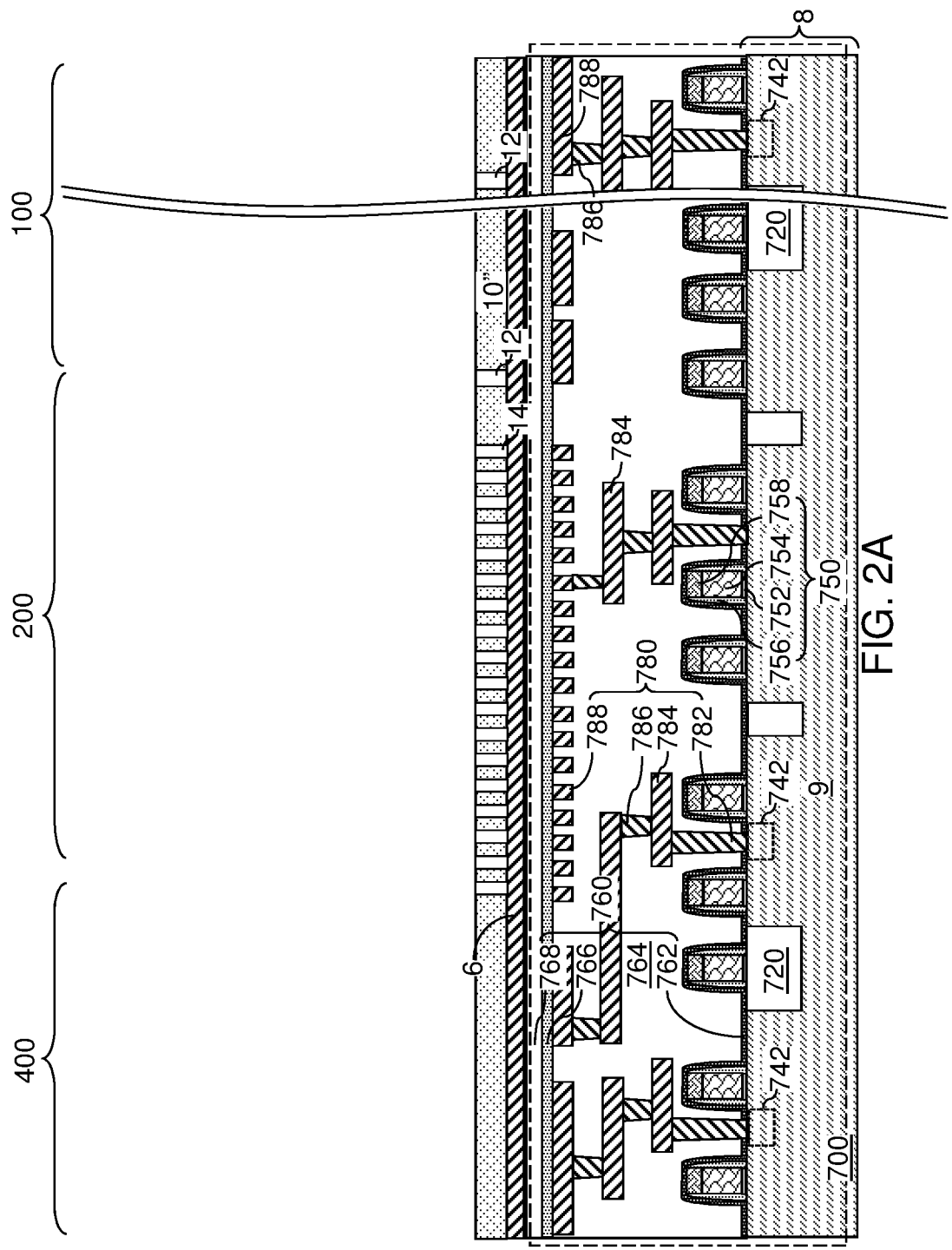

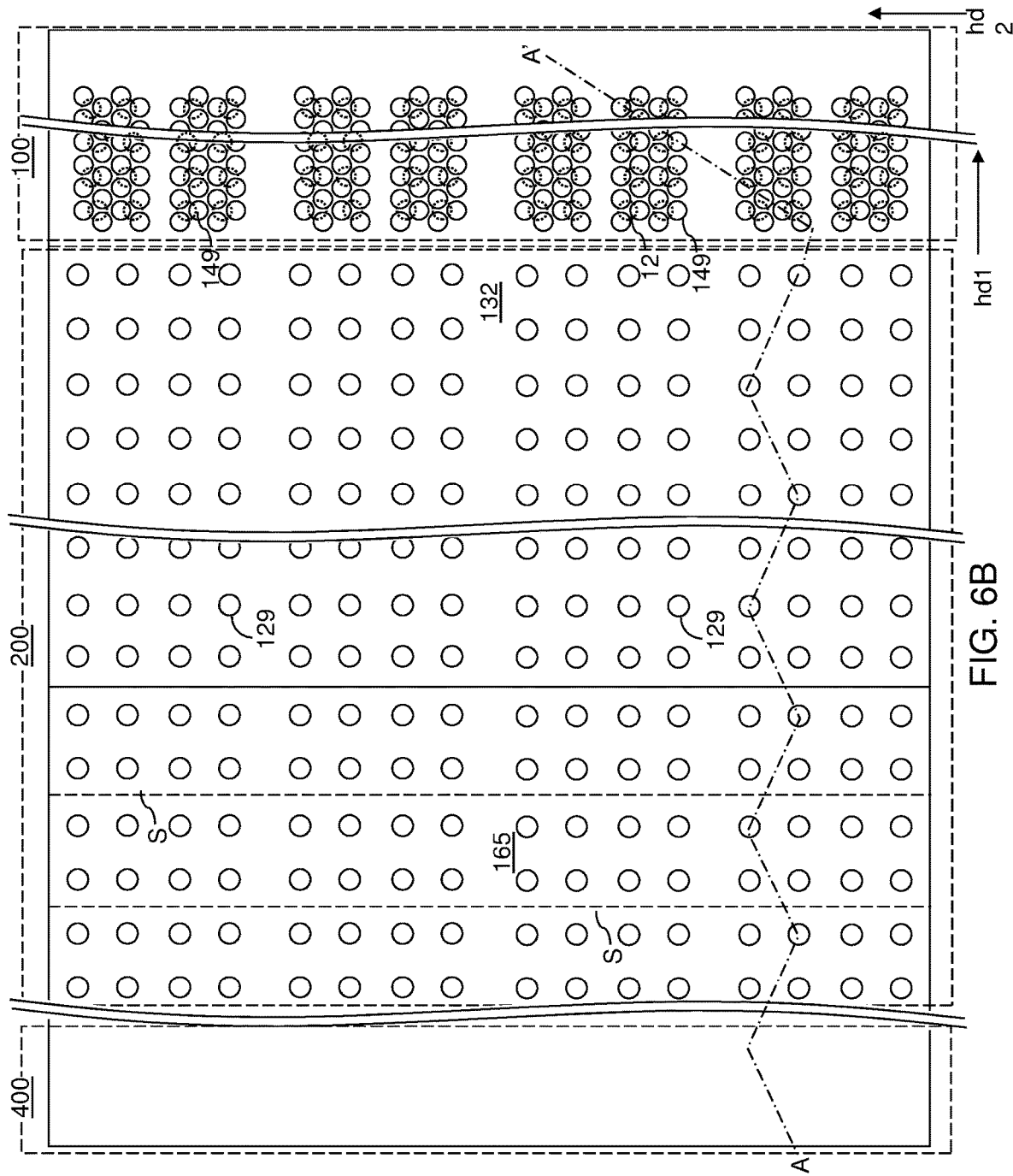

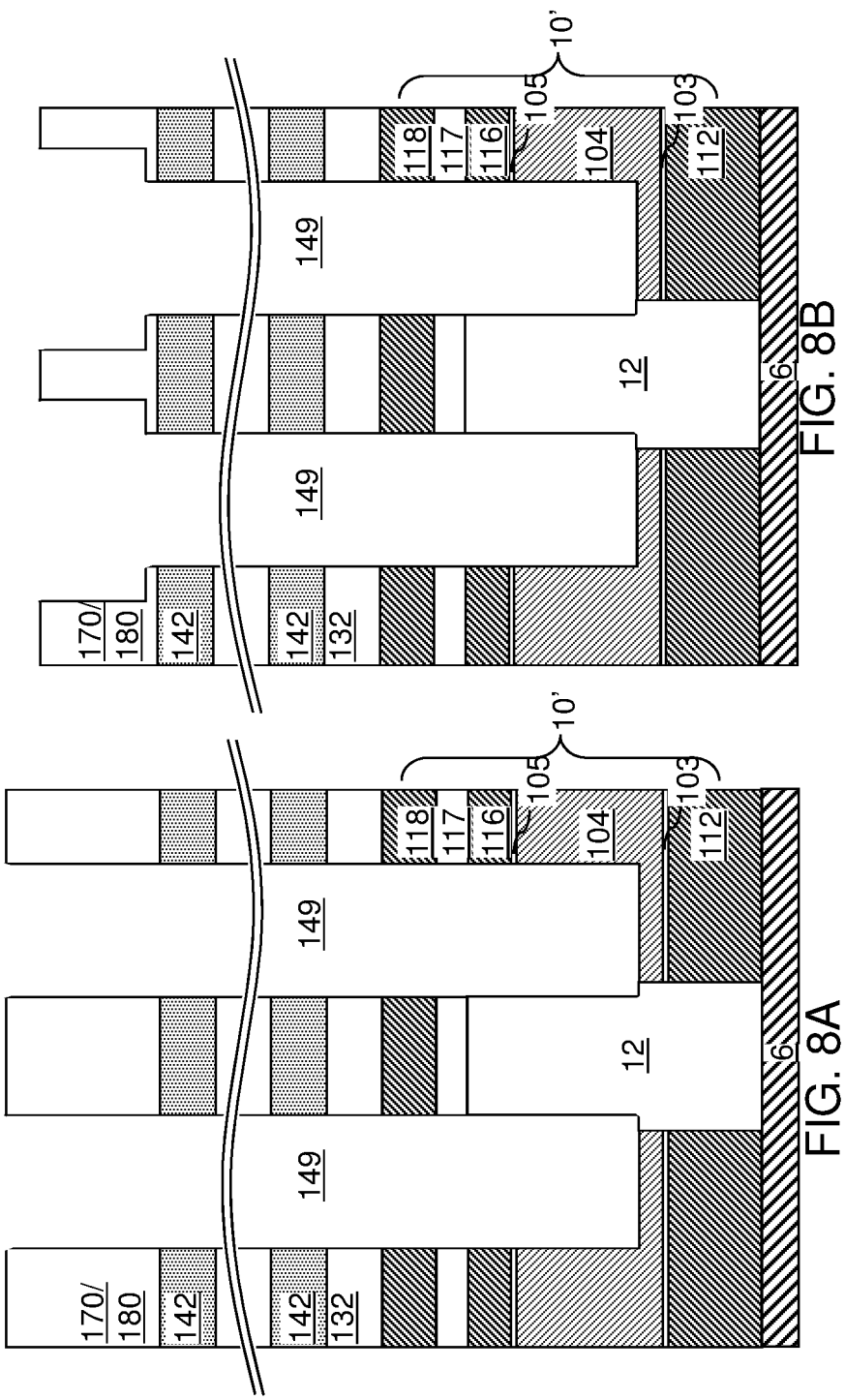

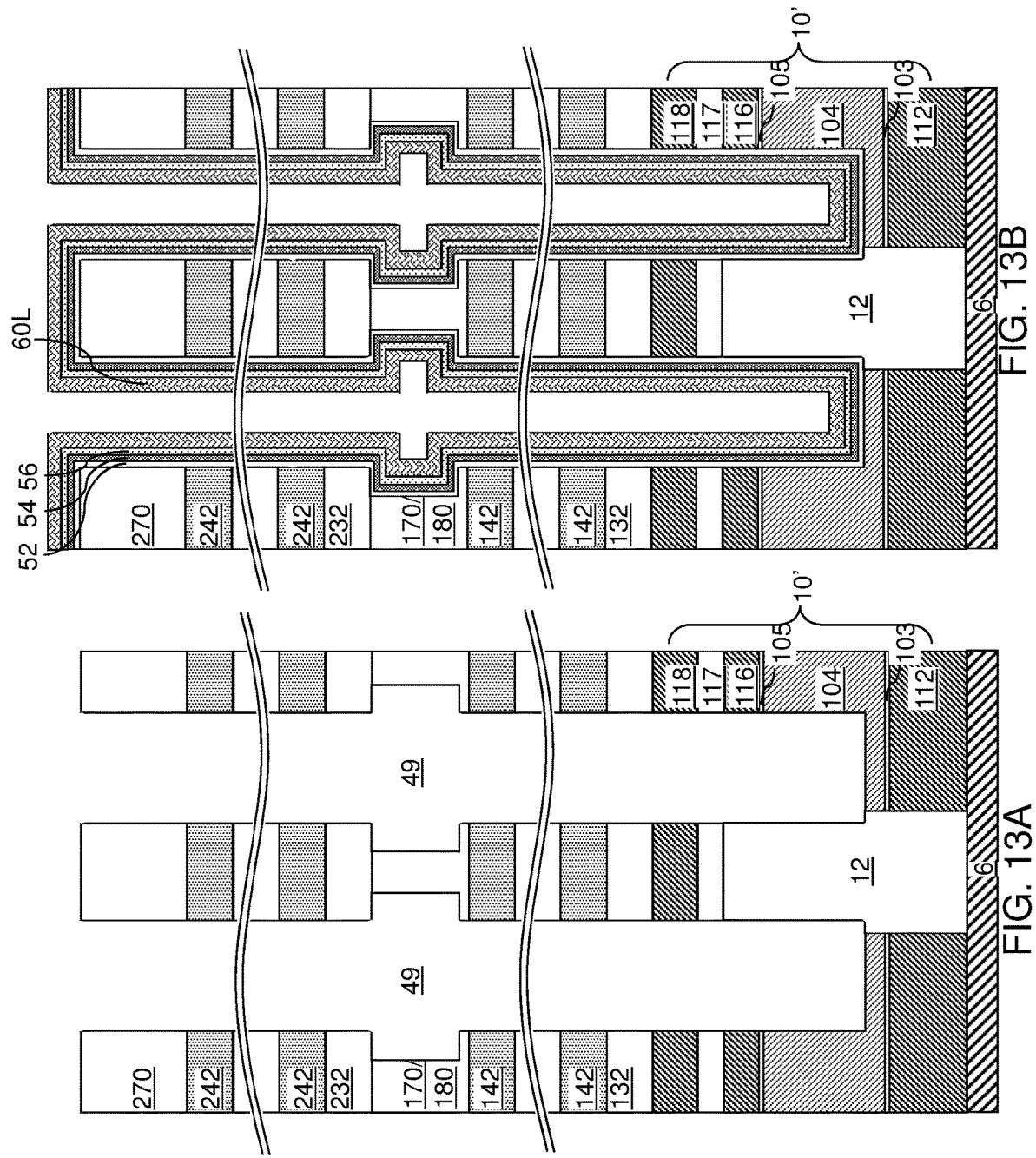

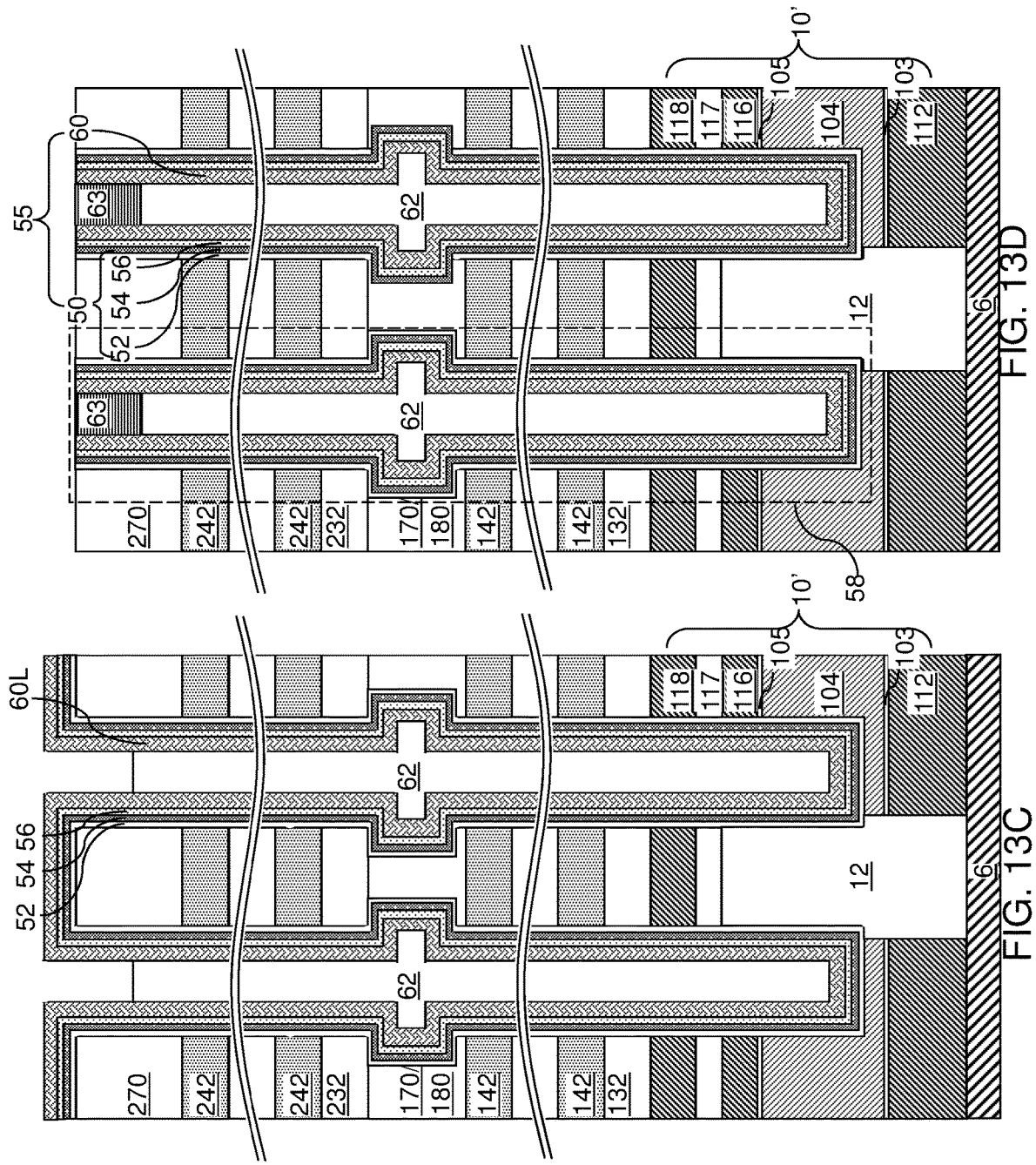

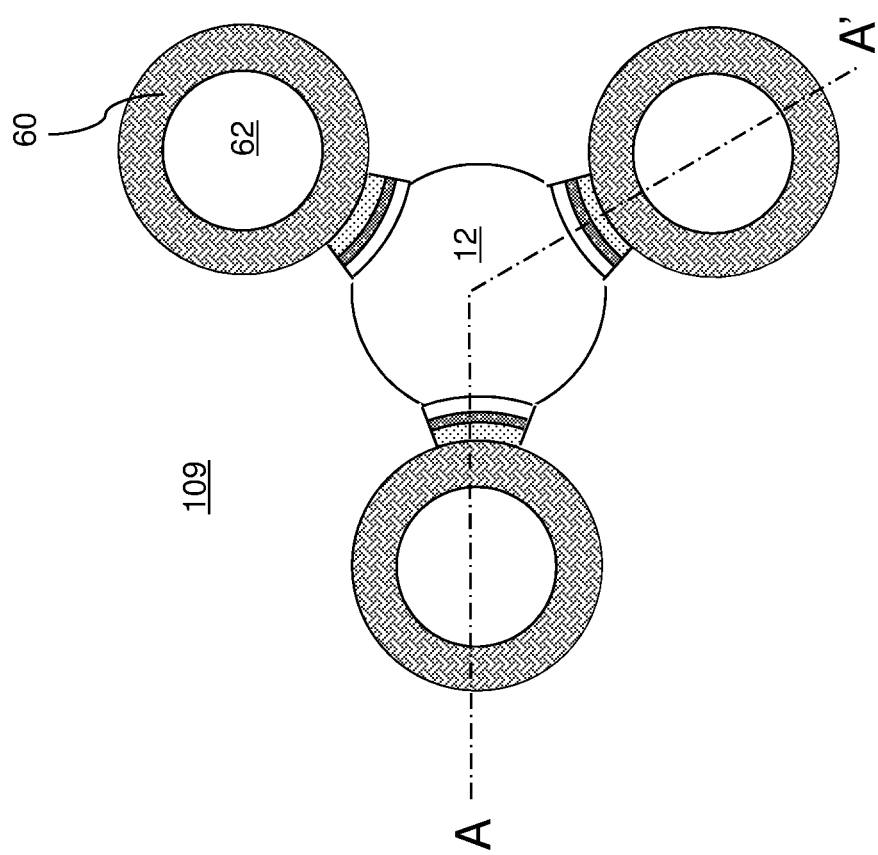

THREE-DIMENSIONAL MEMORY DEVICE CONTAINING SOURCE CONTACT TO BOTTOM OF VERTICAL CHANNELS AND METHOD OF MAKING THE SAME

FIELD

The present disclosure relates generally to the field of semiconductor devices, and particular to a three-dimensional memory device having enhanced source contact between a replacement source contact layer and vertical semiconductor channels and methods of manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a three-dimensional memory device is provided, which comprises: source-level material layers located over a substrate, the source-level material layers comprising a source contact layer; an alternating stack of insulating layers and electrically conductive layers located over the substrate-level material layers; memory stack structures extending through the alternating stack, wherein each of the memory stack structures comprises a memory film and a vertical semiconductor channel having a bottom surface that contacts a respective horizontal surface of the source contact layer; and dielectric pillar structures embedded within the substrate-level material layers and located between the memory stack structures.

According to another aspect of the present disclosure, a method of forming a three-dimensional memory device includes forming in-process source-level material layers embedding dielectric pillar structures therein over a substrate, the in-process source-level material layers comprising a source-level sacrificial layer; forming an alternating stack of insulating layers and spacer material layers over the substrate-level material layers, wherein the spacer material layers are formed as, or are subsequently replaced with, electrically conductive layers; forming memory stack structures extending through the alternating stack, wherein each of the memory stack structures comprises a memory film and a vertical semiconductor channel; forming a source cavity by removing the source-level sacrificial layer, wherein the dielectric pillar structures provide structural support to the alternating stack overlying the source cavity; and forming a source contact layer on a bottom surface of each vertical semiconductor channel in the source cavity.

BRIEF DESCRIPTION OF THE DRAWINGS

FIG. 1A is a vertical cross-sectional view of an exemplary structure after formation of semiconductor devices, lower level dielectric layers, lower metal interconnect structures, and in-process lower source-level material layers on a semiconductor substrate according to an embodiment of the present disclosure.

FIG. 2A is a vertical cross-sectional view of the exemplary structure after formation of dielectric pillar structures according to an embodiment of the present disclosure.

FIG. 6B is a top-down view of the exemplary structure of FIG. 6A. The zig-zag vertical plane A-A' corresponds to the plane of the vertical cross-sectional view of FIG. 6A.

FIGS. 8A and 8B illustrate sequential vertical cross-sectional views of first-tier memory openings during expansion of upper regions of the first-tier memory openings according to an embodiment of the present disclosure.

FIGS. 13A-13D are sequential vertical cross-sectional views of a pair of inter-tier memory openings during formation of a pair of memory opening fill structures according to an embodiment of the present disclosure.

FIG. 21B is a horizontal cross-sectional view along the horizontal plane B-B' of FIG. 21A.

DETAILED DESCRIPTION

Figure 1B:
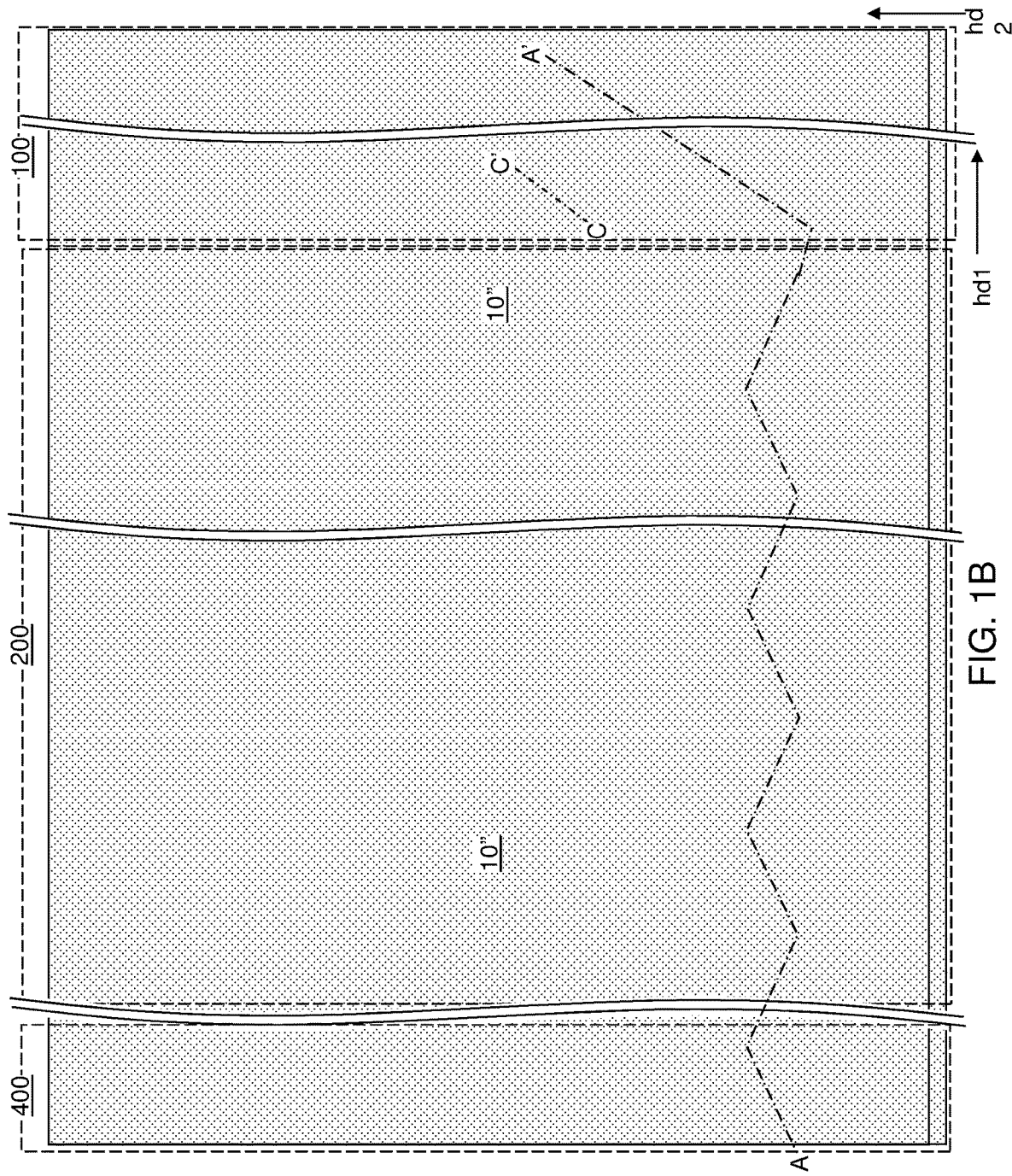
FIG. 1B is a top-down view of the exemplary structure of FIG. 1A. The zig-zag vertical plane A-A' is the plane of the vertical cross-sectional view of FIG. 1A.

As discussed above, the present disclosure is directed to a three-dimensional memory device having enhanced source contact between a replacement source contact layer and vertical semiconductor channels and methods of manufacturing the same, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The same reference numerals refer to the same element or similar element. Unless otherwise indicated, elements having the same reference numerals are presumed to have the same composition. Unless otherwise indicated, a "contact" between elements refers to a direct contact between elements that provides an edge or a surface shared by the elements. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array.

In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Figure 1C:
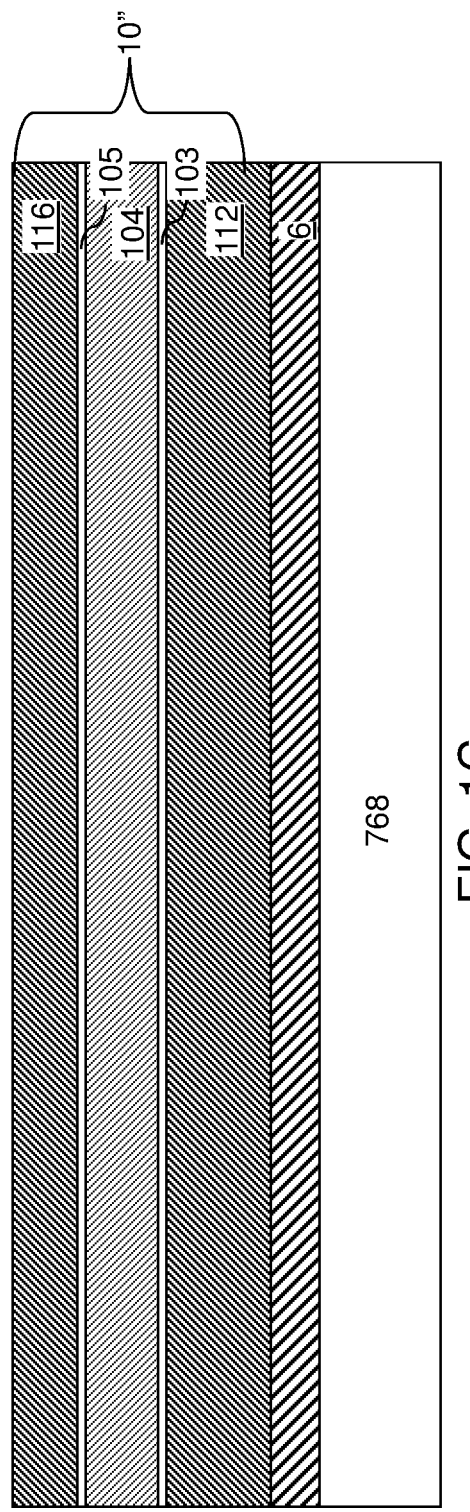
FIG. 1C is a magnified view of the in-process lower source-level material layers along the vertical plane C-C' of FIG. 1B.

Referring to FIGS. 1A-1C, a first exemplary structure according to a first embodiment of the present disclosure is illustrated. FIG. 1C is a magnified view of an in-process source-level material layers 10" illustrated in FIGS. 1A and 1B. The first exemplary structure includes a semiconductor substrate 8 and a complementary metal oxide semiconductor (CMOS) circuitry 700 formed thereupon. The first exemplary structure includes a memory array region 100 in which a three-dimensional memory array is to be subsequently formed, a staircase region 200 in which stepped surfaces of electrically conductive layers and contact via structures are to be subsequently formed, and a peripheral region 400 in which peripheral contact via structures are to be subsequently formed.

The semiconductor substrate 8 includes a substrate semiconductor layer 9 at least at an upper portion thereof. Various doped wells can be formed in upper portions of the substrate semiconductor layer 9. Shallow trench isolation structures 720 can be formed in an upper portion of the substrate semiconductor layer 9 to provide electrical isolation among the semiconductor devices. The CMOS circuitry 700 includes field effect transistors including respective transistor active regions 742 (i.e., source regions and drain regions), channel regions 746, and gate structures 750. The field effect transistors may be arranged in a CMOS configuration. Each gate structure 750 can include, for example, a gate dielectric 752, a gate electrode 754, a dielectric gate spacer 756 and a gate cap dielectric 758.

The CMOS circuitry 700 can include additional semiconductor devices in addition to p-type field effect transistors and n-type field effect transistors, which can be employed to support operation of a memory structure to be subsequently formed. The CMOS circuitry 700 includes a driver circuitry, which is also referred to as a peripheral circuitry. As used herein, a peripheral circuitry refers to any, each, or all, of word line decoder circuitry, word line switching circuitry, bit line decoder circuitry, bit line sensing and/or switching circuitry, power supply/distribution circuitry, data buffer and/or latch, or any other semiconductor circuitry that can be implemented outside a memory array structure for a memory device. For example, the semiconductor devices can include word line switching devices for electrically biasing word lines of three-dimensional memory structures to be subsequently formed.

Dielectric material layers are formed over the semiconductor devices, which are herein referred to as lower-level dielectric material layers 760. The lower-level dielectric material layers 760 can include, for example, a dielectric liner 762 (such as a silicon nitride liner that blocks diffusion of mobile ions and/or apply appropriate stress to underlying structures), first dielectric material layers 764 that overlie the dielectric liner 762, a silicon nitride layer (e.g., hydrogen diffusion barrier) 766 that overlies the first dielectric material layers 764, and at least one second dielectric layer 768.

The dielectric layer stack including the lower-level dielectric material layers 760 functions as a matrix for lower-level metal interconnect structures 780 that provide electrical wiring among the various nodes of the semiconductor devices and landing pads for through-memory-level contact via structures to be subsequently formed. The lower-level metal interconnect structures 780 are embedded within the dielectric layer stack of the lower-level dielectric material layers 760, and comprise a lower-level metal line structure located under and optionally contacting a bottom surface of the silicon nitride layer 766.

For example, the lower-level metal interconnect structures 780 can be embedded within the first dielectric material layers 764. The first dielectric material layers 764 may be a plurality of dielectric material layers in which various elements of the lower-level metal interconnect structures 780 are sequentially embedded. Each dielectric material layer among the first dielectric material layers 764 may include any of doped silicate glass, undoped silicate glass, organosilicate glass, silicon nitride, silicon oxynitride, and dielectric metal oxides (such as aluminum oxide). In one embodiment, the first dielectric material layers 764 can comprise, or consist essentially of, dielectric material layers having dielectric constants that do not exceed the dielectric constant of undoped silicate glass (silicon oxide) of 3.9. The lower-level metal interconnect structures 780 can include various device contact via structures 782 (e.g., source and drain electrodes which contact the respective source and drain nodes of the device or gate electrode contacts), intermediate lower-level metal line structures 784, lower-level metal via structures 786, and landing-pad-level metal line structures 788 that are configured to function as landing pads for through-memory-level contact via structures to be subsequently formed.

The landing-pad-level metal line structures 788 can be formed within a topmost dielectric material layer of the first dielectric material layers 764 (which can be a plurality of dielectric material layers). The landing-pad-level metal line structures 788 can be employed as landing pads for metal via structures to be subsequently formed thereabove. Each of the lower-level metal interconnect structures 780 can include a metallic nitride liner and a metal fill structure. Top surfaces of the landing-pad-level metal line structures 788 and the topmost surface of the first dielectric material layers 764 may be planarized by a planarization process, such as chemical mechanical planarization. The silicon nitride layer 766 can be formed directly on the top surfaces of the landing-pad-level metal line structures 788 and the topmost surface of the first dielectric material layers 764.

The at least one second dielectric material layer 768 may include a single dielectric material layer or a plurality of dielectric material layers. Each dielectric material layer among the at least one second dielectric material layer 768 may include any of doped silicate glass, undoped silicate glass, and organosilicate glass. In one embodiment, the at least one first second material layer 768 can comprise, or consist essentially of, dielectric material layers having dielectric constants that do not exceed the dielectric constant of undoped silicate glass (silicon oxide) of 3.9.

The CMOS circuitry 700 can include peripheral devices for the memory-level assembly to be subsequently formed. The lower-level metal interconnect structures 780 are embedded in the lower-level dielectric layers 760. The combination of the lower-level dielectric layers 760 and the lower-level metal interconnect structures 780 overlie the CMOS circuitry 700.

The lower-level metal interconnect structures 780 can be electrically connected to active nodes (e.g., transistor active regions 742 or gate electrodes 754) of the CMOS circuitry 700 (e.g., CMOS devices), and are located at the level of the lower-level dielectric layers 760. Through-memory-level contact via structures can be subsequently formed directly on the lower-level metal interconnect structures 780 to provide electrical connection to memory devices to be subsequently formed. In one embodiment, the pattern of the lower-level metal interconnect structures 780 can be selected such that the landing-pad-level metal line structures 788 (which are a subset of the lower-level metal interconnect structures 780 located at the topmost portion of the lower-level metal interconnect structures 780) can provide landing pad structures for the through-memory-level contact via structures to be subsequently formed.

A conductive plate layer 6 and in-process lower source-level material layers 10" are formed over the at least one second dielectric layer. The conductive plate layer 6 can include a metallic compound material such as a conductive metallic nitride (e.g., TiN), a metal alloy (e.g., tungsten silicide) and/or a metal (e.g., W). The conductive plate layer 6 provides a high conductivity conduction path for electrical current that flows into, or out of, the in-process lower source-level material layers 10". The conductive plate layer 6 may include, for example, a tungsten or tungsten silicide layer having a thickness in a range from 3 nm to 100 nm, although lesser and greater thicknesses can also be employed. The conductive plate layer 6 may function as a component of a source layer in the completed device. In addition, the conductive plate layer 6 may function as an etch stop layer. The thickness of the conductive plate layer 6 may be in a range from 5 nm to 100 nm, although lesser and greater thicknesses can also be employed.

The in-process lower source-level material layers 10" can include components layers that are subsequently modified to form source-level material layers. The source-level material layers, upon formation, include a source contact layer that functions as a common source region for vertical field effect transistors of a three-dimensional memory device. In one embodiment, the in-process source-level material layer 10" can include, from bottom to top, a lower source-level material layer 112, a lower sacrificial liner 103, a source-level sacrificial layer 104, an upper sacrificial liner 105, and an upper source-level material layer 116.

The lower source-level material layer 112 and the upper source-level material layer 116 can include a doped semiconductor material such as doped polysilicon or doped amorphous silicon. The conductivity type of the lower source-level material layer 112 and the upper source-level material layer 116 can be the opposite of the conductivity of vertical semiconductor channels to be subsequently formed. For example, if the vertical semiconductor channels to be subsequently formed have a doping of a first conductivity type, the lower source-level material layer 112 and the upper source-level material layer 116 have a doping of a second conductivity type that is the opposite of the first conductivity type. The thickness of each of the lower source-level material layer 112 and the upper source-level material layer 116 can be in a range from 10 nm to 300 nm, such as from 20 nm to 150 nm, although lesser and greater thicknesses can also be employed.

The source-level sacrificial layer 104 includes a sacrificial material that can be removed selective to the lower sacrificial liner 103 and the upper sacrificial liner 105. In one embodiment, the source-level sacrificial layer 104 can include a semiconductor material such as undoped amorphous silicon or a silicon-germanium alloy with an atomic concentration of germanium greater than 20%. The thickness of the source-level sacrificial layer 104 can be in a range from 30 nm to 400 nm, such as from 60 nm to 200 nm, although lesser and greater thicknesses can also be employed.

The lower sacrificial liner 103 and the upper sacrificial liner 105 include materials that can function as an etch stop material during removal of the source-level sacrificial layer 104. For example, the lower sacrificial liner 103 and the upper sacrificial liner 105 can include silicon oxide, silicon nitride, and/or a dielectric metal oxide. In one embodiment, each of the lower sacrificial liner 103 and the upper sacrificial liner 105 can include a silicon oxide layer having a thickness in a range from 2 nm to 30 nm, although lesser and greater thicknesses can also be employed.

The lower in-process lower source-level material layers 10" can be formed directly above a subset of the semiconductor devices on the semiconductor substrate 8 (e.g., silicon wafer). As used herein, a first element is located "directly above" a second element if the first element is located above a horizontal plane including a topmost surface of the second element and an area of the first element and an area of the second element has an areal overlap in a plan view (i.e., along a vertical plane or direction perpendicular to the top surface of the substrate 8.

Figure 2B:
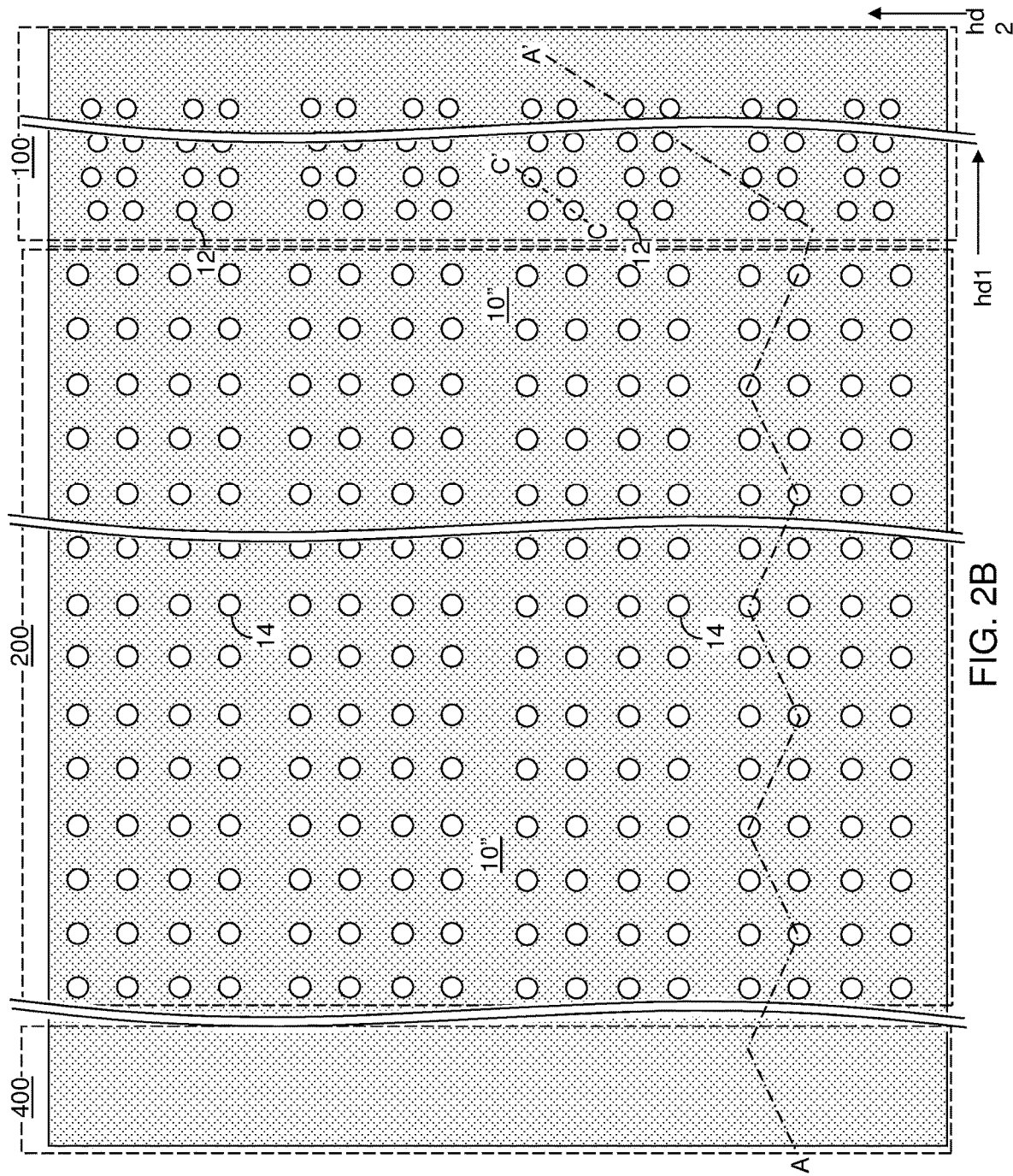
FIG. 2B is a top-down view of the exemplary structure of FIG. 2A. The zig-zag vertical plane A-A' is the plane of the vertical cross-sectional view of FIG. 2A.
Figure 2C:
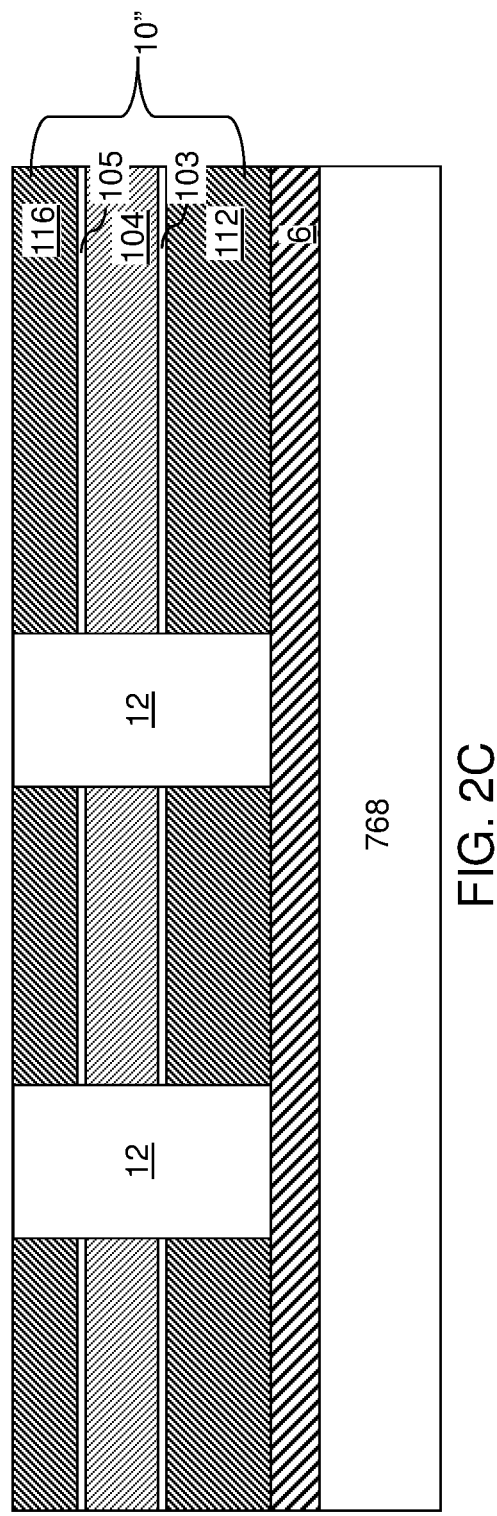
FIG. 2C is a magnified view of the in-process lower source-level material layers and the dielectric pillar structures along the vertical plane C-C' of FIG. 2B.

Referring to FIGS. 2A-2C, a photoresist layer can be applied over the in-process lower source-level material layers 10", and can be lithographically patterned to form openings therein. The openings in the photoresist layer includes a first pattern employed within the memory array region 100, and a second pattern employed within the staircase region 200. In one non-limiting embodiment, the first pattern of the openings in the memory array region 100 is selected such that the areas of openings within the photoresist layer in the memory array region 100 overlaps partially, but not fully, with areas of memory stack structures to be subsequently formed in the memory array region. In other words, each area for subsequently forming memory stack structures has a partial overlap with a respective opening within the pattern of the openings in the photoresist layer in the memory array region 100. The partial overlap provides the feature that dielectric pillar structures to be subsequently formed in the areas of the openings in the photoresist layer directly contacts sidewalls of the memory stack structures to be subsequently formed. The lack of full overlap provides the feature that bottom surfaces of the memory stack structures to be subsequently formed are not completely blocked by the dielectric pillar structures to be subsequently formed.

The second pattern of openings in the staircase region 200 may be the same as, or may be different from, the pattern of support pillar structures to be subsequently formed in the staircase region 200. In one embodiment, the second pattern of openings in the staircase region 200 may overlap fully or partially with the pattern of support pillar structures to be subsequently formed in the staircase region 200.

The pattern in the photoresist layer can be transferred through the in-process lower source-level material layers 10" by an anisotropic etch process. The anisotropic etch process sequentially etches each layer within the in-process lower source-level material layers 10" to form opening through the in-process lower source-level material layers 10". First openings are formed through the in-process lower source-level material layers 10" in the memory array region 100, and second openings are formed through the in-process lower source-level material layers 10" in the staircase region 200. The first openings and the second openings have generally cylindrical shapes, and can have horizontal cross-sectional shapes of circles, ellipses, polygonal shapes, and/or other generally curvilinear shapes. The maximum lateral dimensions of the first opening can be on the order of maximum lateral dimensions of memory stack structures to be subsequently formed in the memory array region 100. The maximum lateral dimensions of the second openings can be on the order of maximum lateral dimensions of support pillar structures to be subsequently formed in the staircase region 200. For example, the maximum lateral dimensions of the first openings and the second openings may be in a range from 30 nm to 300 nm, although lesser and greater maximum lateral dimensions can also be employed.

A dielectric material such as silicon oxide can be deposited in the first openings and the second openings. Excess portions of the dielectric material can be removed from above the top surface of the in-process lower source-level material layers 10" by a planarization process, which can include a recess etch process or a chemical mechanical planarization (CMP) process. Each remaining portion of the dielectric material in the first openings in the memory array region 100 constitutes dielectric pillar structures, which are herein referred to as memory-region dielectric pillar structures 12. Remaining portions of the dielectric material in the second openings in the staircase region 200 constitute additional dielectric pillar structures, which are herein referred to as staircase-region dielectric pillar structures 14. In one embodiment, each of the dielectric pillar structures (12, 14) can have a respective cylindrical shape. In one embodiment, each of the dielectric pillar structures (12, 14) is formed on a top surface of the conductive plate layer 6.

Figure 2D:
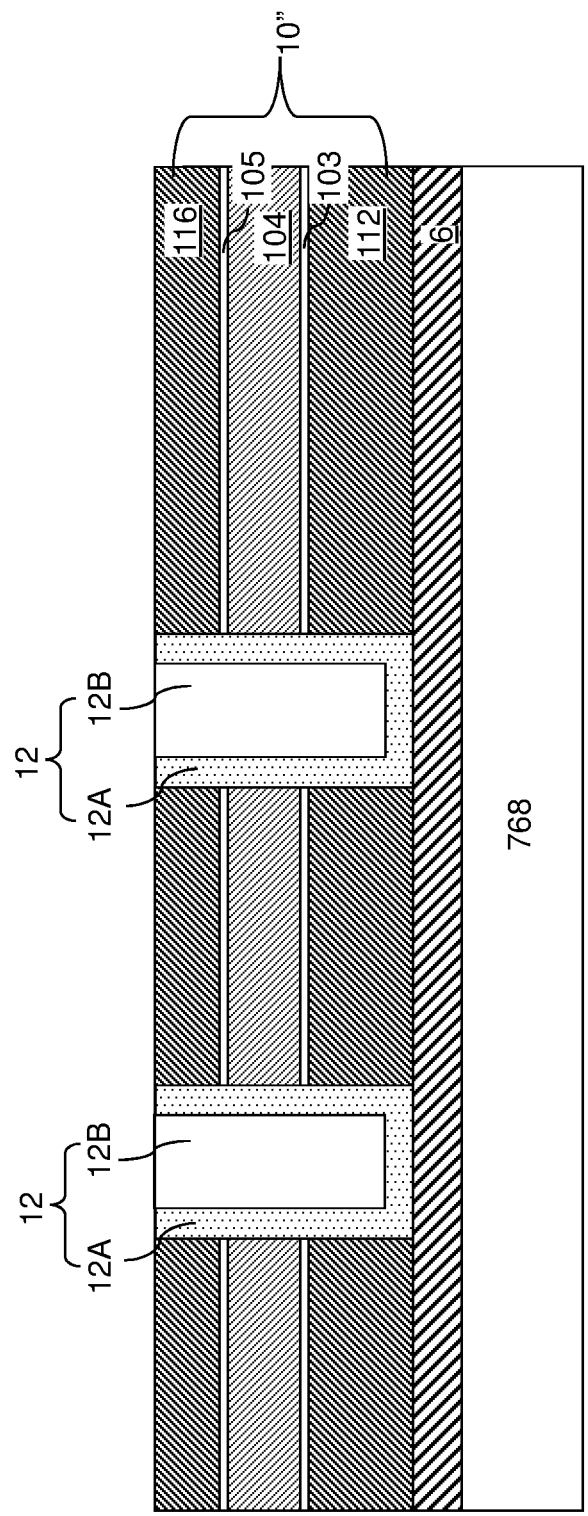
FIG. 2D is a magnified view of an alternative configuration of the in-process lower source-level material layers and the dielectric pillar structures along the vertical plane C-C' of FIG. 2B.

Referring to FIG. 2D, an alternative configuration of the in-process lower source-level material layers 10" and the dielectric pillar structures (12, 14) is illustrated. In this case, each of the dielectric pillar structures (12, 14) can be formed with a dielectric pillar liner 12A and a dielectric pillar core 12B including a different material that the dielectric pillar liner 12A. Each dielectric pillar liner 12A can include aluminum oxide and each dielectric pillar core 12B can include silicon oxide. In this case, the dielectric pillar structures (12, 14) can be formed by sequentially depositing a dielectric pillar liner layer and a dielectric pillar core material layer, and by removing portions of the dielectric pillar liner layer and the dielectric pillar core material layer from above a horizontal plane including the top surface of the in-process lower source-level material layers 10".

Figure 3A:
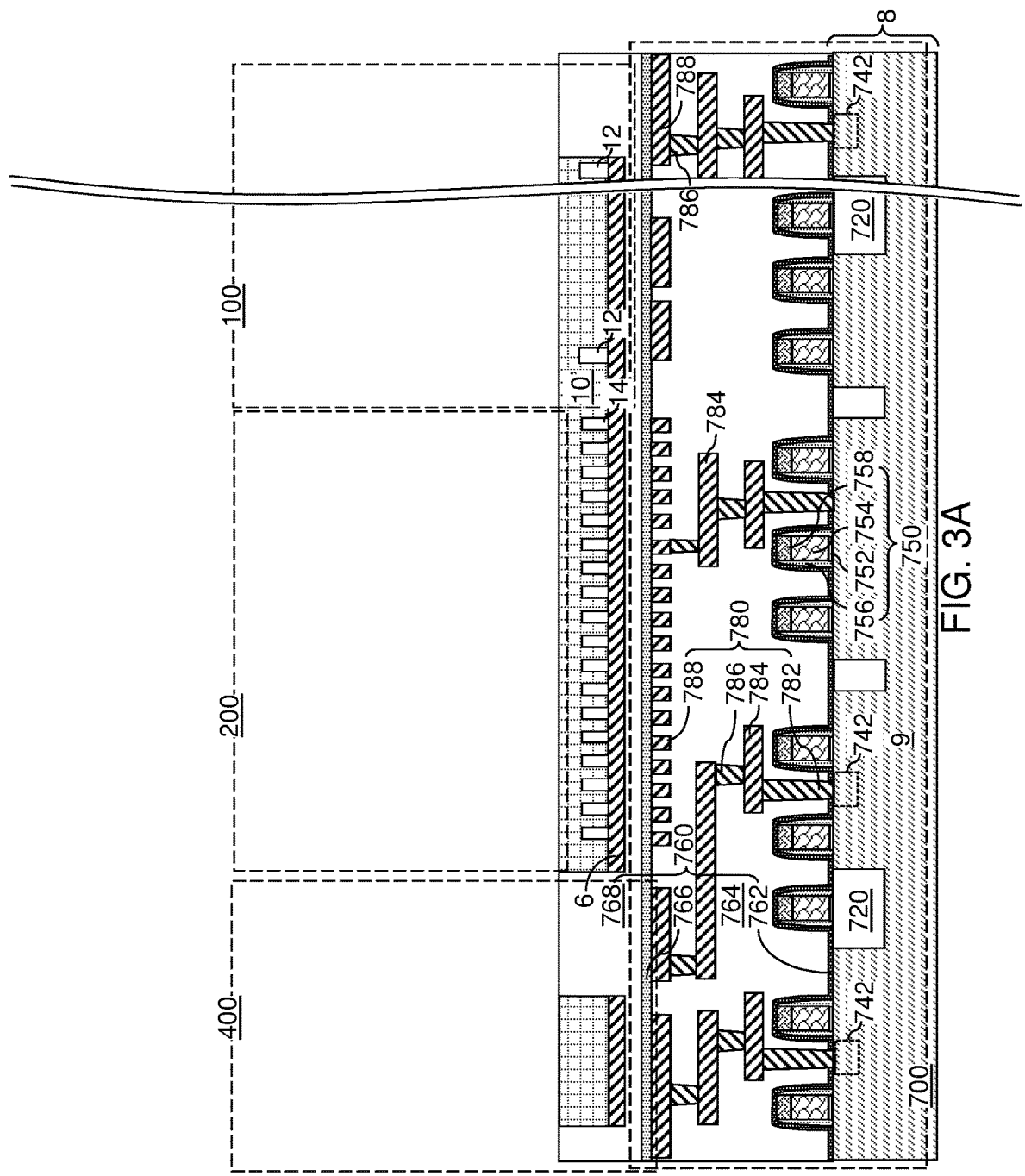
FIG. 3A is a vertical cross-sectional view of the exemplary structure after formation of in-process source-level material layers according to an embodiment of the present disclosure.
Figure 3B:
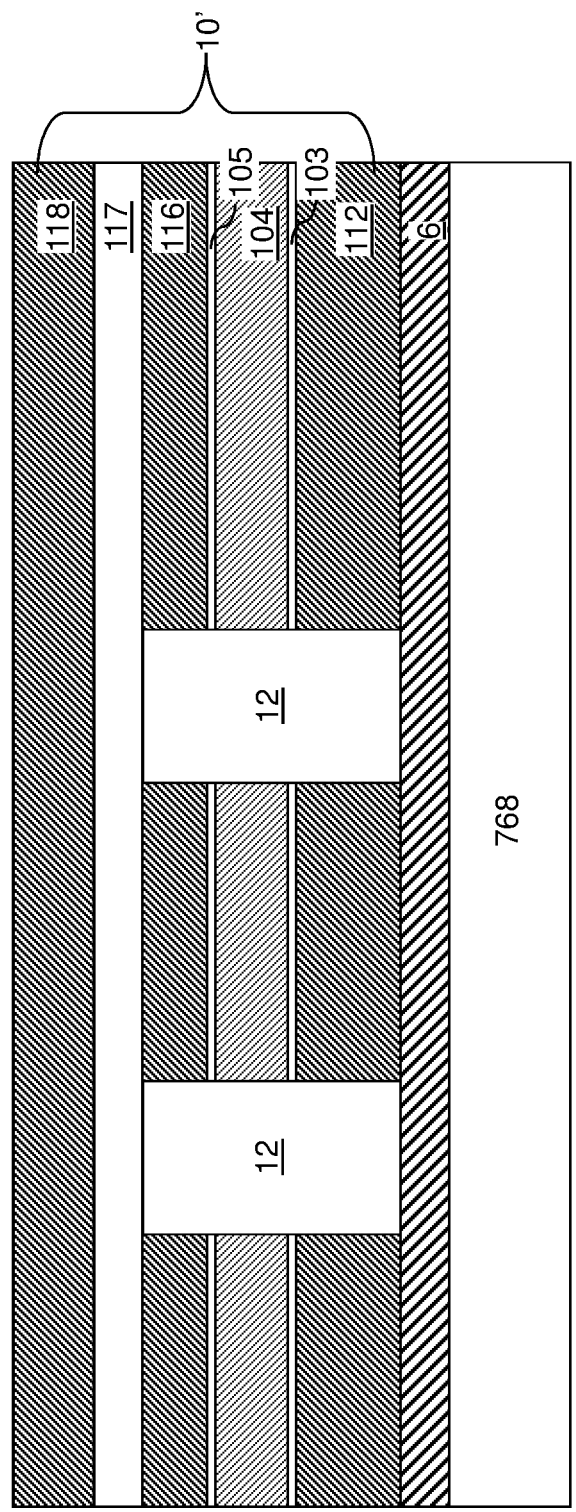
FIG. 3B is a magnified view of the in-process lower source-level material layers along a vertical plane.

Referring to FIGS. 3A and 3B, an in-process upper source-level material layers (117, 118) can be optionally formed. The in-process upper source-level material layers (117, 118) can include a source-level insulating layer 117 and an optional source-select-level conductive layer 118. The source-level insulating layer 117 includes a dielectric material such as silicon oxide. The thickness of the source-level insulating layer 117 can be in a range from 20 nm to 400 nm, such as from 40 nm to 200 nm, although lesser and greater thicknesses can also be employed. The optional source-select-level conductive layer 118 can include a conductive material that can be employed as a source-select-level gate electrode. For example, the optional source-select-level conductive layer 118 can include a doped semiconductor material such as doped polysilicon or doped amorphous silicon that can be subsequently converted into doped polysilicon by an anneal process. The thickness of the optional source-level conductive layer 118 can be in a range from 30 nm to 200 nm, such as from 60 nm to 100 nm, although lesser and greater thicknesses can also be employed.

The combination of the in-process lower source-level material layers 10" and the in-process upper source-level material layers form an in-process source-level material layer 10' which can include, from bottom to top, a lower source-level material layer 112, a lower sacrificial liner 103, a source-level sacrificial layer 104, an upper sacrificial liner 105, an upper source-level material layer 116, a source-level insulating layer 117, and an optional source-select-level conductive layer 118. The in-process source-level material layers 10' embed dielectric pillar structures (12, 14) therein. The in-process source-level material layers 10' include a source-level sacrificial layer 104. The source-level sacrificial layer 104 is formed above, and is vertically spaced from, the top surface of the conductive plate layer 6. Further, the in-process source-level material layers 10' comprise a lower source-level material layer 112 underlying the source-level sacrificial layer 104. Each of the dielectric pillar structures (12, 14) can comprise a first portion contacting a respective sidewall of the lower source-level material layer 112 and a second portion contacting a respective sidewall of the source-level sacrificial layer 104. In one embodiment, the source-level insulating layer 117 can be formed over the source-level sacrificial layer 104 and directly on the dielectric pillar structures (12, 14) as a component of the in-process source-level material layers 10'.

The conductive plate layer 6 and the lower in-process source-level material layers 10' can be patterned, for example, by application and patterning of a photoresist layer over the in-process source-level material layers 10' and by an anisotropic etch process that etches unmasked portions of the conductive plate layer 6 and the lower in-process source-level material layers 10'. Remaining portions of the conductive plate layer 6 and the lower in-process source-level material layers 10' can be present in the memory array region 100, the staircase region 200, and optionally within areas of the peripheral region 400. A dielectric material can be deposited between patterned portions of the conductive plate layer 6 and the lower in-process source-level material layers 10', and can be incorporated into the at least one second dielectric layer 768.

Figure 4:
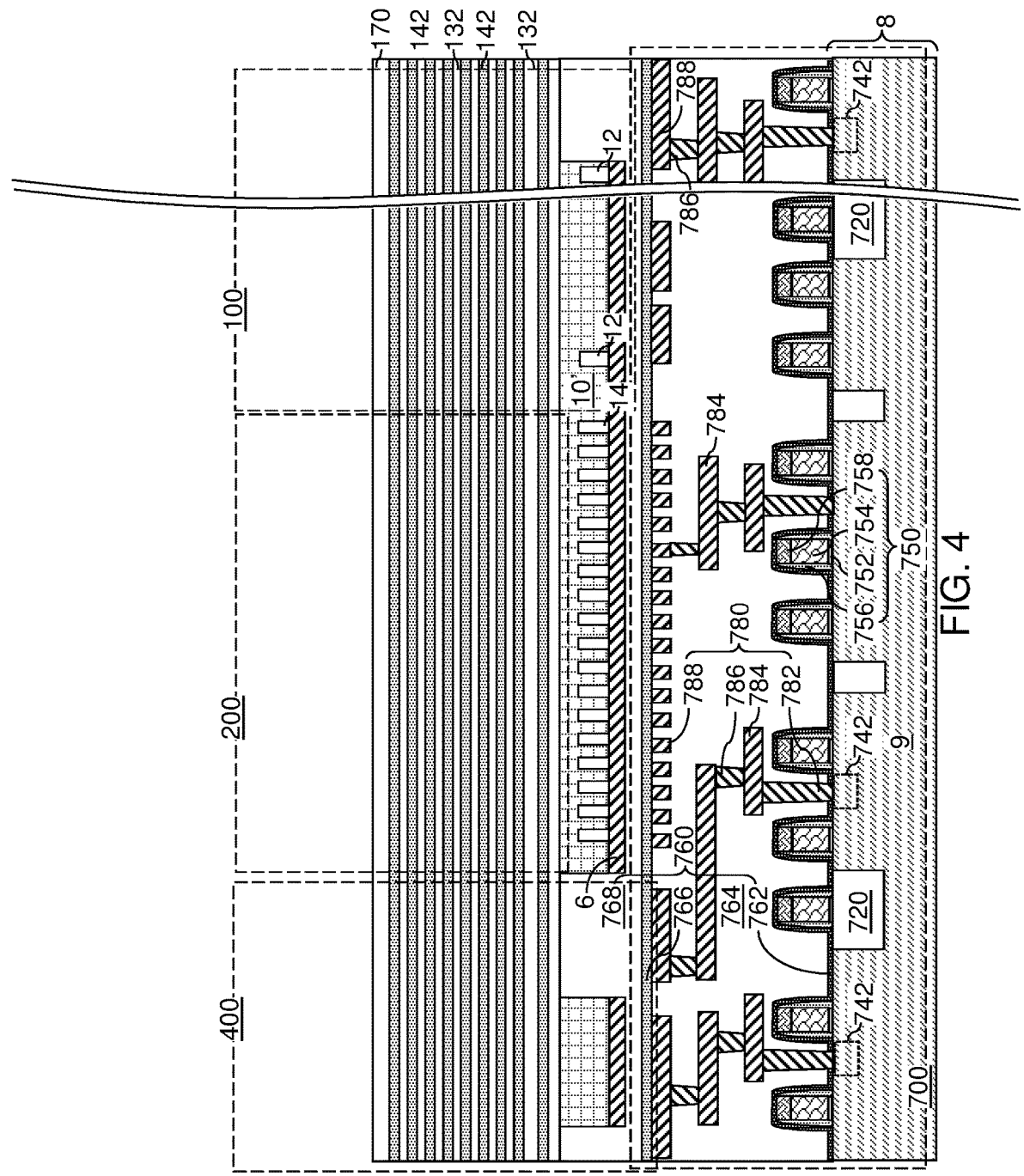
FIG. 4 is a vertical cross-sectional view of the exemplary structure after formation of a first-tier alternating stack of first insulating layers and first spacer material layers according to an embodiment of the present disclosure.

Referring to FIG. 4, an alternating stack of first material layers and second material layers is subsequently formed. Each first material layer can include a first material, and each second material layer can include a second material that is different from the first material. In case at least another alternating stack of material layers is subsequently formed over the alternating stack of the first material layers and the second material layers, the alternating stack is herein referred to as a first-tier alternating stack. The level of the first-tier alternating stack is herein referred to as a first-tier level, and the level of the alternating stack to be subsequently formed immediately above the first-tier level is herein referred to as a second-tier level, etc.

The first-tier alternating stack can include first insulating layers 132 as the first material layers, and first spacer material layers as the second material layers. In one embodiment, the first spacer material layers can be sacrificial material layers that are subsequently replaced with electrically conductive layers. In another embodiment, the first spacer material layers can be electrically conductive layers that are not subsequently replaced with other layers. While the present disclosure is described employing embodiments in which sacrificial material layers are replaced with electrically conductive layers, embodiments in which the spacer material layers are formed as electrically conductive layers (thereby obviating the need to perform replacement processes) are expressly contemplated herein.

In one embodiment, the first material layers and the second material layers can be first insulating layers 132 and first sacrificial material layers 142, respectively. In one embodiment, each first insulating layer 132 can include a first insulating material, and each first sacrificial material layer 142 can include a first sacrificial material. An alternating plurality of first insulating layers 132 and first sacrificial material layers 142 is formed over the in-process source-level material layers. As used herein, a "sacrificial material" refers to a material that is removed during a subsequent processing step.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

The first-tier alternating stack (132, 142) can include first insulating layers 132 composed of the first material, and first sacrificial material layers 142 composed of the second material, which is different from the first material. The first material of the first insulating layers 132 can be at least one insulating material. Insulating materials that can be employed for the first insulating layers 132 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first insulating layers 132 can be silicon oxide.

The second material of the first sacrificial material layers 142 is a sacrificial material that can be removed selective to the first material of the first insulating layers 132. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The first sacrificial material layers 142 may comprise an insulating material, a semiconductor material, or a conductive material. The second material of the first sacrificial material layers 142 can be subsequently replaced with electrically conductive electrodes which can function, for example, as control gate electrodes of a vertical NAND device. In one embodiment, the first sacrificial material layers 142 can be material layers that comprise silicon nitride.

In one embodiment, the first insulating layers 132 can include silicon oxide, and sacrificial material layers can include silicon nitride sacrificial material layers. The first material of the first insulating layers 132 can be deposited, for example, by chemical vapor deposition (CVD). For example, if silicon oxide is employed for the first insulating layers 132, tetraethylorthosilicate (TEOS) can be employed as the precursor material for the CVD process. The second material of the first sacrificial material layers 142 can be formed, for example, CVD or atomic layer deposition (ALD).

The thicknesses of the first insulating layers 132 and the first sacrificial material layers 142 can be in a range from 20 nm to 50 nm, although lesser and greater thicknesses can be employed for each first insulating layer 132 and for each first sacrificial material layer 142. The number of repetitions of the pairs of a first insulating layer 132 and a first sacrificial material layer 142 can be in a range from 2 to 1,024, and typically from 8 to 256, although a greater number of repetitions can also be employed. In one embodiment, each first sacrificial material layer 142 in the first-tier alternating stack (132, 142) can have a uniform thickness that is substantially invariant within each respective first sacrificial material layer 142.

A first insulating cap layer 170 is subsequently formed over the stack (132, 142). The first insulating cap layer 170 includes a dielectric material, which can be any dielectric material that can be employed for the first insulating layers 132. In one embodiment, the first insulating cap layer 170 includes the same dielectric material as the first insulating layers 132. The thickness of the insulating cap layer 170 can be in a range from 20 nm to 300 nm, although lesser and greater thicknesses can also be employed.

Figure 5:
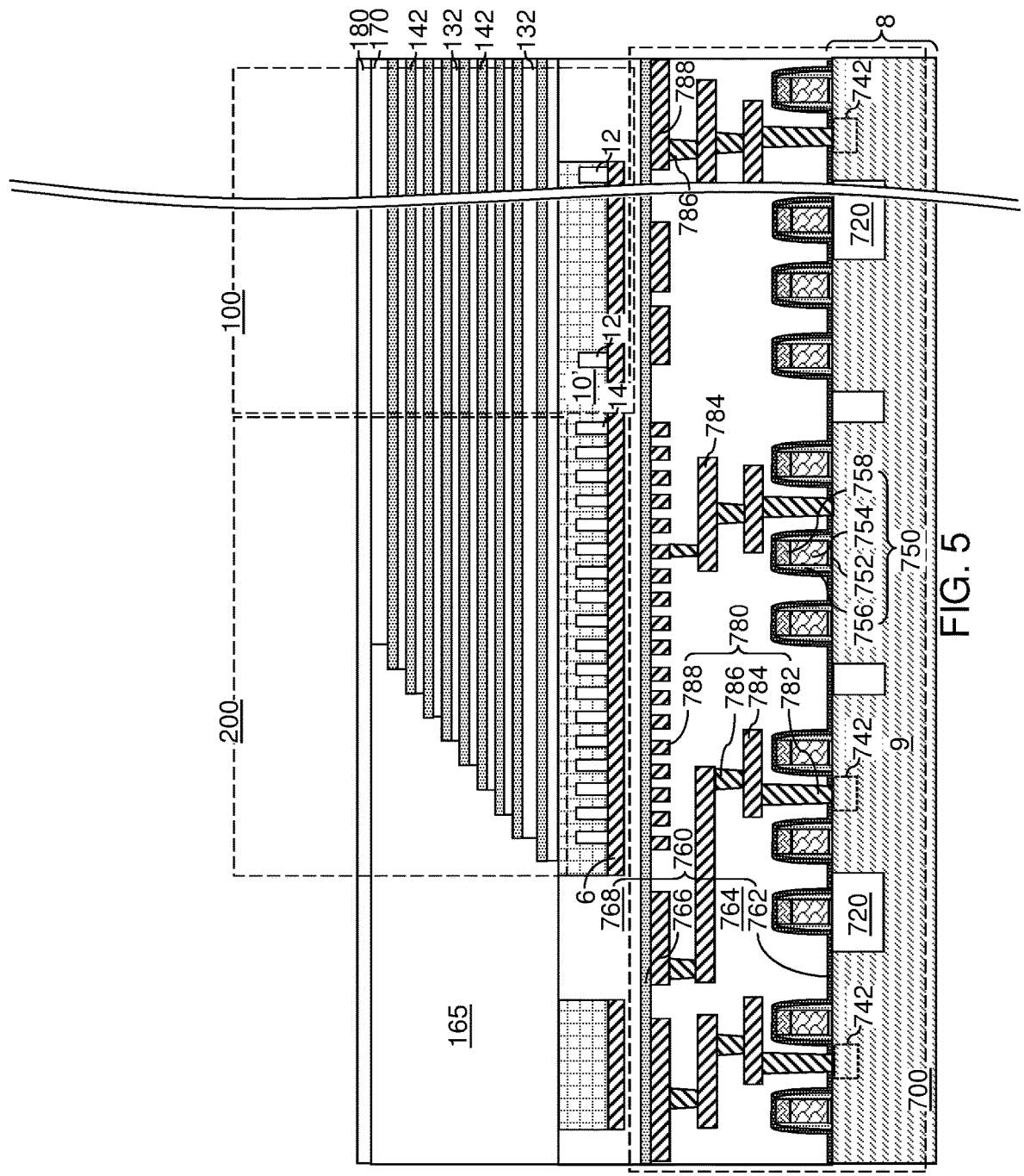
FIG. 5 is a vertical cross-sectional view of the exemplary structure after patterning a first-tier staircase region, a first retro-stepped dielectric material portion, and an inter-tier dielectric layer according to an embodiment of the present disclosure.

Referring to FIG. 5, the first insulating cap layer 170 and the first-tier alternating stack (132, 142) can be patterned to form first stepped surfaces in the staircase region 200. The staircase region 200 can include a respective first stepped area in which the first stepped surfaces are formed, and a second stepped area in which additional stepped surfaces are to be subsequently formed in a second-tier structure (to be subsequently formed over a first-tier structure) and/or additional tier structures. The first stepped surfaces can be formed, for example, by forming a mask layer with an opening therein, etching a cavity within the levels of the first insulating cap layer 170, and iteratively expanding the etched area and vertically recessing the cavity by etching each pair of a first insulating layer 132 and a first sacrificial material layer 142 located directly underneath the bottom surface of the etched cavity within the etched area. In one embodiment, top surfaces of the first sacrificial material layers 142 can be physically exposed at the first stepped surfaces. The cavity overlying the first stepped surfaces is herein referred to as a first stepped cavity.

A dielectric fill material (such as undoped silicate glass or doped silicate glass) can be deposited to fill the first stepped cavity. Excess portions of the dielectric fill material can be removed from above the horizontal plane including the top surface of the first insulating cap layer 170. A remaining portion of the dielectric fill material that fills the region overlying the first stepped surfaces constitute a first retro-stepped dielectric material portion 165. As used herein, a "retro-stepped" element refers to an element that has stepped surfaces and a horizontal cross-sectional area that increases monotonically as a function of a vertical distance from a top surface of a substrate on which the element is present. The first-tier alternating stack (132, 142) and the first retro-stepped dielectric material portion 165 collectively constitute a first-tier structure, which is an in-process structure that is subsequently modified.

An inter-tier dielectric layer 180 may be optionally deposited over the first-tier structure (132, 142, 170, 165). The inter-tier dielectric layer 180 includes a dielectric material such as silicon oxide. In one embodiment, the inter-tier dielectric layer 180 can include a doped silicate glass having a greater etch rate than the material of the first insulating layers 132 (which can include an undoped silicate glass). For example, the inter-tier dielectric layer 180 can include phosphosilicate glass. The thickness of the inter-tier dielectric layer 180 can be in a range from 30 nm to 300 nm, although lesser and greater thicknesses can also be employed.

Figure 6A:
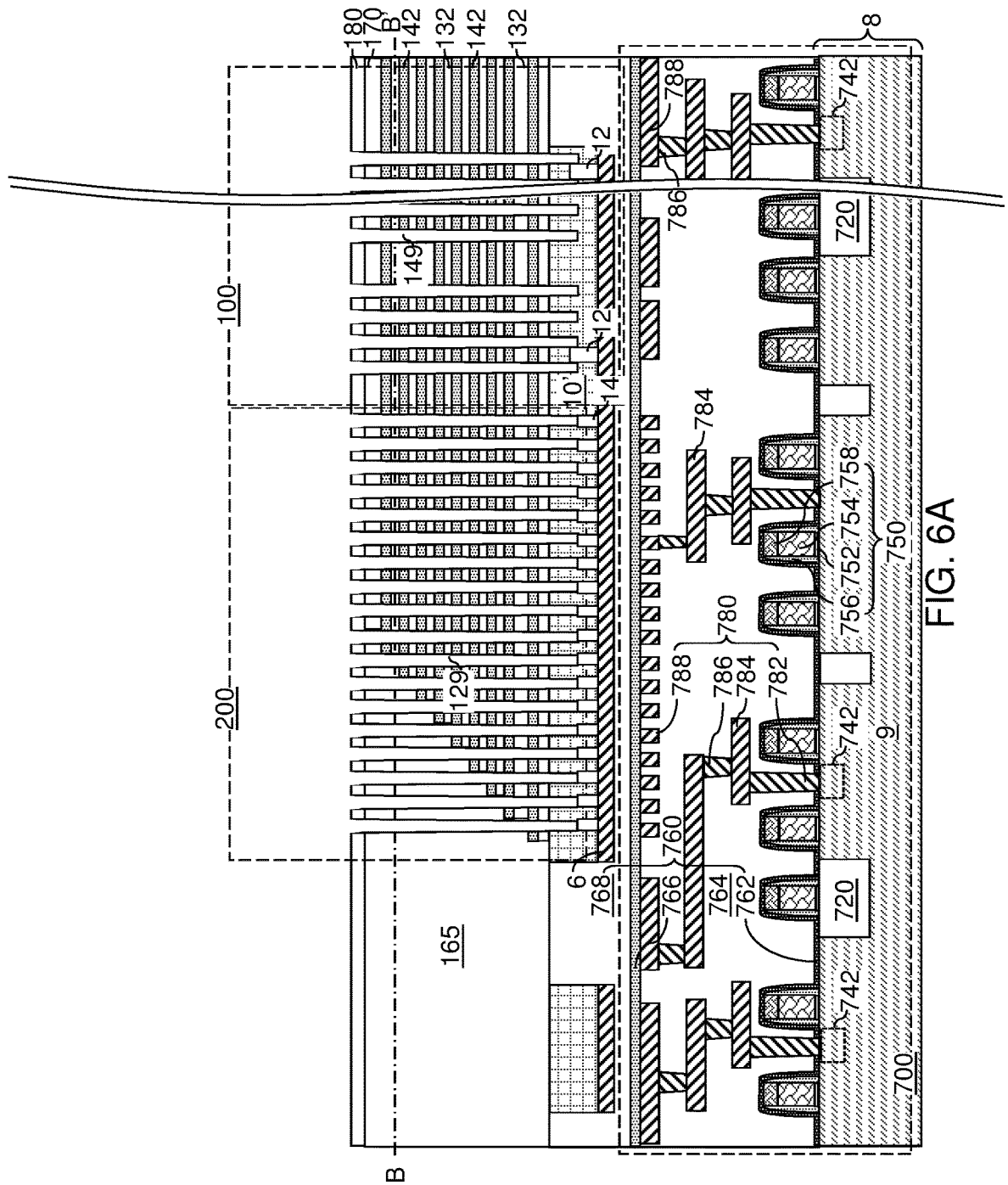
FIG. 6A is a vertical cross-sectional view of the exemplary structure after formation of first-tier memory openings and first-tier support openings according to an embodiment of the present disclosure.
Figure 7A:
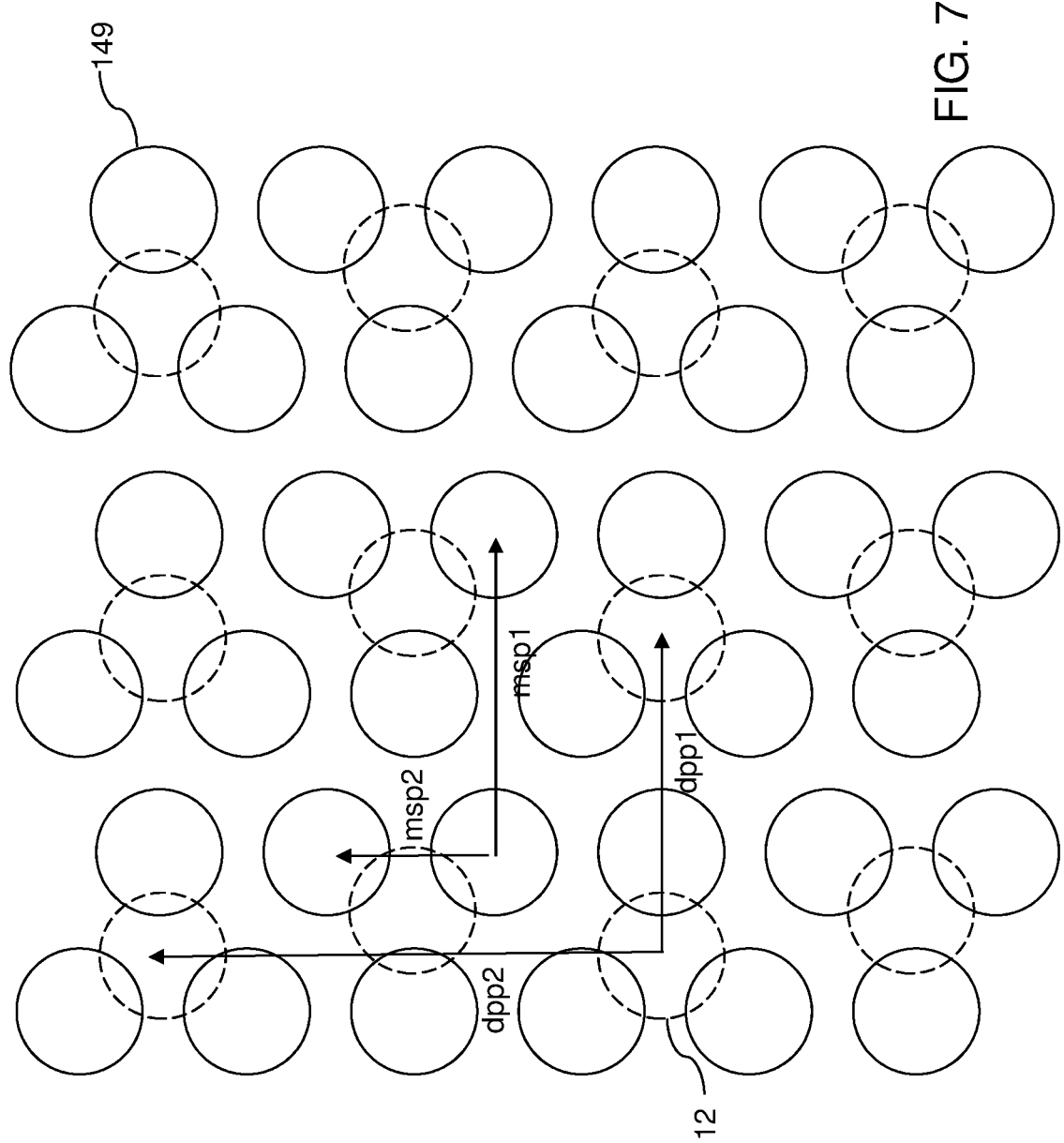
FIGS. 7A and 7B are plan views illustrating a respective exemplary arrangement of the dielectric pillar structures and memory openings according to embodiments of the present disclosure.
Figure 7B:
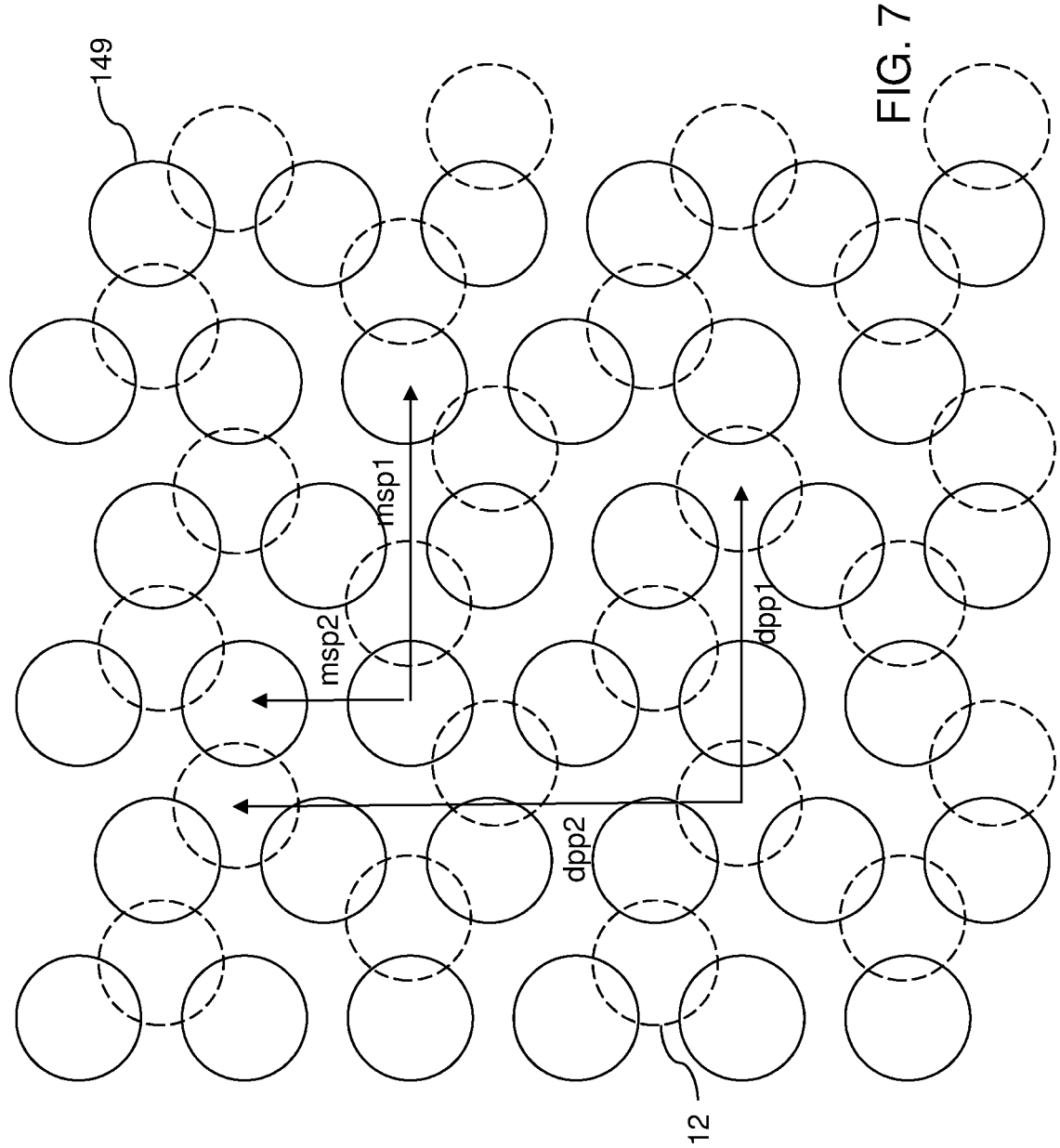

Referring to FIGS. 6A, 6B, 7A, and 7B, first-tier openings (149, 129) can be formed through the inter-tier dielectric layer 180 and the first-tier structure (132, 142, 170, 165) and into the in-process source-level material layers 10'. FIGS. 6A and 6B illustrate the exemplary structure, and FIGS. 7A and 7B are plan views illustrating a respective exemplary arrangement of the memory-region dielectric pillar structures 12 and first-tier memory openings 149.

For example, a photoresist layer (not shown) can be applied over the inter-tier dielectric layer 180, and can be lithographically patterned to form various openings therethrough. The pattern of openings in the photoresist layer can be transferred through the inter-tier dielectric layer 180 and the first-tier structure (132, 142, 170, 165) and into the in-process source-level material layers 10' by a first anisotropic etch process to form the first-tier openings (149, 129) concurrently, i.e., during the first anisotropic etch process.

The first-tier openings (149, 129) can include first-tier memory openings 149 and first-tier support openings 129. The first-tier memory openings 149 are openings that are formed in the memory array region 100 through each layer within the first alternating stack (132, 142) and are subsequently employed to form memory stack structures therein. The bottom surfaces of the first-tier openings (149, 129) can be a recessed surface of the source-level sacrificial layer 104. Thus, each first-tier opening (149, 129) can have a bottom surface between a horizontal plane including the bottom surface of the source-level sacrificial layer 104 and a horizontal plane including the top surface of the source-level sacrificial layer 104.

The first-tier support openings 129 are openings that are formed in the staircase region 200 and are subsequently employed to form support structures that are subsequently employed to provide structural support to the second exemplary structure during replacement of sacrificial material layers with electrically conductive layers. In case the first spacer materials are formed as first electrically conductive layers, the first-tier support openings 129 can be omitted. A subset of the first-tier support openings 129 can be formed through horizontal surfaces of the first stepped surfaces of the first alternating stack (132, 142).

In one embodiment, the first-tier memory openings 149 can be formed as clusters that are laterally spaced among one another along the second horizontal direction hd2. Each cluster of first-tier memory openings 149 can include a respective two-dimensional array of first-tier memory openings 149 having a first pitch along one horizontal direction and a second pitch along another horizontal direction. As shown in FIGS. 7A and 7B, the first pitch is herein referred to as a first memory structure pitch msp1, and the second pitch is herein referred to as a second memory structure pitch msp2. In one embodiment, the direction of the first memory structure pitch msp1 can be the first horizontal direction (e.g., word line direction) hd1 and the direction of the second memory structure pitch msp2 can be the second horizontal direction (e.g., bit line direction) hd2, or vice versa.

The memory-region dielectric pillar structures 12 can be formed as clusters that are spaced apart along the second horizontal direction hd2. The pattern of a cluster of memory-region dielectric pillar structures 12 can be commensurate with the pattern of a cluster of first-tier memory openings 149. The memory-region dielectric pillar structures 12 can be formed as clusters that are laterally spaced among one another along the second horizontal direction hd2. Each cluster of memory-region dielectric pillar structures 12 can include a respective two-dimensional array of memory-region dielectric pillar structures 12 having a first pitch along one horizontal direction and a second pitch along another horizontal direction. The first pitch of the memory-region dielectric pillar structures 12 is herein referred to as a first dielectric pillar pitch dpp1, and the second pitch of the memory-region dielectric pillar structures 12 is herein referred to as a second dielectric pillar pitch dpp2. In one embodiment, the direction of the first dielectric pillar pitch dpp1 can be the same as the direction of the first memory structure pitch msp1, and the direction of the second dielectric pillar pitch dpp2 can be the same as the direction of the second memory structure pitch msp2. In one embodiment, the first dielectric pillar pitch dpp1 can be the same as the first memory structure pitch msp1 or can be an integer multiple of the first memory structure pitch msp1, and the second dielectric pillar pitch dpp2 can be the same as the second memory structure pitch msp2 or can be an integer multiple of the second memory structure pitch msp2. In other words, the first dielectric pillar pitch dpp1 is commensurate with the first memory stack pitch msp1, and the second dielectric pillar pitch dpp2 is commensurate with the second memory stack pitch msp2.

In one embodiment shown in FIGS. 7A and 7B, each first-tier memory opening 149 has a partial overlap with one or more of the memory-region dielectric pillar structures 12. Each first-tier memory opening 149 includes a respective area that does not overlap with any of the memory-region dielectric pillar structures 12. A memory-region dielectric pillar structure 12 may overlap with one or more of the first-tier memory openings 149. In one embodiment, the memory-region dielectric pillar structure 12 can overlap with three of the first-tier memory openings 149. In another embodiment, the memory-region dielectric pillar structure 12 can overlap with one, two or more than three of the first-tier memory openings 149. In other embodiments, only some of the first-tier memory openings 149 or none of the first-tier memory openings 149 can have a partial overlap with the memory-region dielectric pillar structures 12.

Each first-tier memory opening 149 can be formed by etching through a sidewall portion of at least one memory-region dielectric pillar structure 12. Thus, a sidewall of at least one of the memory-region dielectric pillar structures 12 is physically exposed at a bottom of each of the first-tier memory openings 149. In one embodiment, the physically exposed sidewalls of the memory-region dielectric pillar structures 12 can be concave vertical surfaces, i.e., surface that extend along a vertical direction and having concavity within horizontal planes. Thus, as shown in FIGS. 7A and 7B, each of the first-tier memory openings 149 has a partial areal overlap with one or more of the memory-region dielectric pillar structures 12, but does not have a complete areal overlap with any of the memory-region dielectric pillar structures 12.

The first-tier support openings 129 can be formed on a respective one of the staircase-region dielectric pillar structures 14. In one embodiment, the areas of the first-tier support openings 129 can be the same as the areas of the staircase-region dielectric pillar structures 14. In one embodiment, each cluster of first-tier memory openings 149 can be a hexagonal array or a rectangular array. In one embodiment, each cluster of first-tier support openings 129 can be a hexagonal array or a rectangular array.

FIGS. 8A and 8B illustrate a processing sequence for laterally expanding portions of the first-tier memory openings 149 at the level of the inter-tier dielectric layer 180. FIG. 8A illustrates a first-tier memory opening 149 immediately after the anisotropic etch that forms the first-tier memory openings 149. The inter-tier dielectric layer 180 can comprise a dielectric material (such as borosilicate glass) having a greater etch rate than the first insulating layers 132 (that can include undoped silicate glass). In one embodiment, the bottom surface of each first-tier memory opening 149 can be formed between the top surface and the bottom surface of the source-level sacrificial layer 104. In this case, surfaces of the source-level sacrificial layer 104 can be exposed at a bottom portion of each first-tier memory opening 149.

Referring to FIG. 8B, an isotropic etch (such as a wet etch employing HF) can be employed to expand the lateral dimensions of the first-tier memory openings 149 at the level of the inter-tier dielectric layer 180. The portions of the first-tier memory openings 149 located at the level of the inter-tier dielectric layer 180 may be optionally widened to provide a larger landing pad for second-tier memory openings to be subsequently formed through a second-tier alternating stack (to be subsequently formed prior to formation of the second-tier memory openings).

Figure 9:
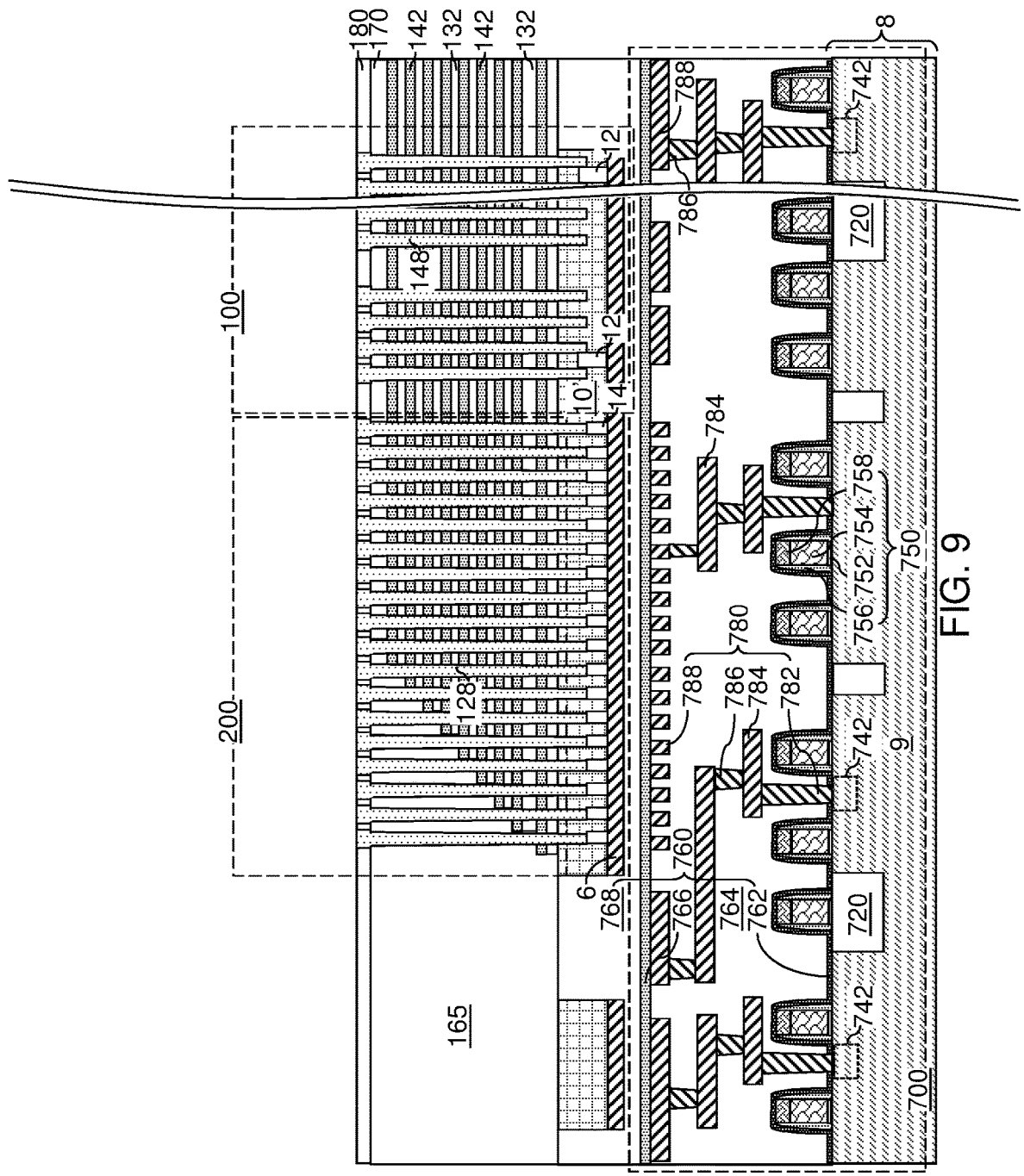
FIG. 9 is a vertical cross-sectional view of the exemplary structure after formation of sacrificial memory opening fill portions and first-tier support opening fill portions according to an embodiment of the present disclosure.

Referring to FIG. 9, sacrificial first-tier opening fill portions (148, 128) can be formed in the first-tier openings (149, 129). For example, a sacrificial fill material is deposited concurrently deposited in each of the first-tier openings (149, 129). The sacrificial fill material includes a material that can be subsequently removed selective to the materials of the first insulating layers 132 and the first sacrificial material layers 142.

In one embodiment, the sacrificial fill material can include a semiconductor material such as silicon (e.g., a-Si or polysilicon), a silicon-germanium alloy, germanium, a III-V compound semiconductor material, or a combination thereof. Optionally, a thin etch stop layer (such as a silicon oxide layer or a silicon nitride layer having a thickness in a range from 1 nm to 3 nm) may be employed prior to depositing the sacrificial first-tier fill material. The sacrificial fill material may be formed by a non-conformal deposition or a conformal deposition method.

In another embodiment, the sacrificial fill material can include a silicon oxide material having a higher etch rate than the materials of the first insulating layers 132, the first insulating cap layer 170, and the inter-tier insulating layer 180. For example, the sacrificial fill material may include borosilicate glass or porous or non-porous organosilicate glass having an etch rate that is at least 100 times higher than the etch rate of densified TEOS oxide (i.e., a silicon oxide material formed by decomposition of tetraethylorthosilicate glass in a chemical vapor deposition process and subsequently densified in an anneal process) in a 100:1 dilute hydrofluoric acid. In this case, a thin etch stop layer (such as a silicon nitride layer having a thickness in a range from 1 nm to 3 nm) may be employed prior to depositing the sacrificial first-tier fill material. The sacrificial fill material may be formed by a non-conformal deposition or a conformal deposition method.

In yet another embodiment, the sacrificial fill material can include a carbon-containing material (such as amorphous carbon or diamond-like carbon) that can be subsequently removed by ashing, or a silicon-based polymer that can be subsequently removed selective to the materials of the first alternating stack (132, 142).

Portions of the deposited sacrificial fill material can be removed from above the topmost layer of the first-tier alternating stack (132, 142), such as from above the inter-tier dielectric layer 180. For example, the sacrificial fill material can be recessed to a top surface of the inter-tier dielectric layer 180 employing a planarization process. The planarization process can include a recess etch, chemical mechanical planarization (CMP), or a combination thereof. The top surface of the inter-tier dielectric layer 180 can be employed as an etch stop layer or a planarization stop layer.

Remaining portions of the sacrificial fill material comprise sacrificial first-tier opening fill portions (148, 128).

Specifically, each remaining portion of the sacrificial material in a first-tier memory opening 149 constitutes a sacrificial first-tier memory opening fill portion 148. Each remaining portion of the sacrificial material in a first-tier support opening 129 constitutes a sacrificial first-tier support opening fill portion 128. The top surfaces of the sacrificial first-tier opening fill portions (148, 128) can be coplanar with the top surface of the inter-tier dielectric layer 180. Each of the sacrificial first-tier opening fill portions (148, 128) may, or may not, include cavities therein.

Figure 10:
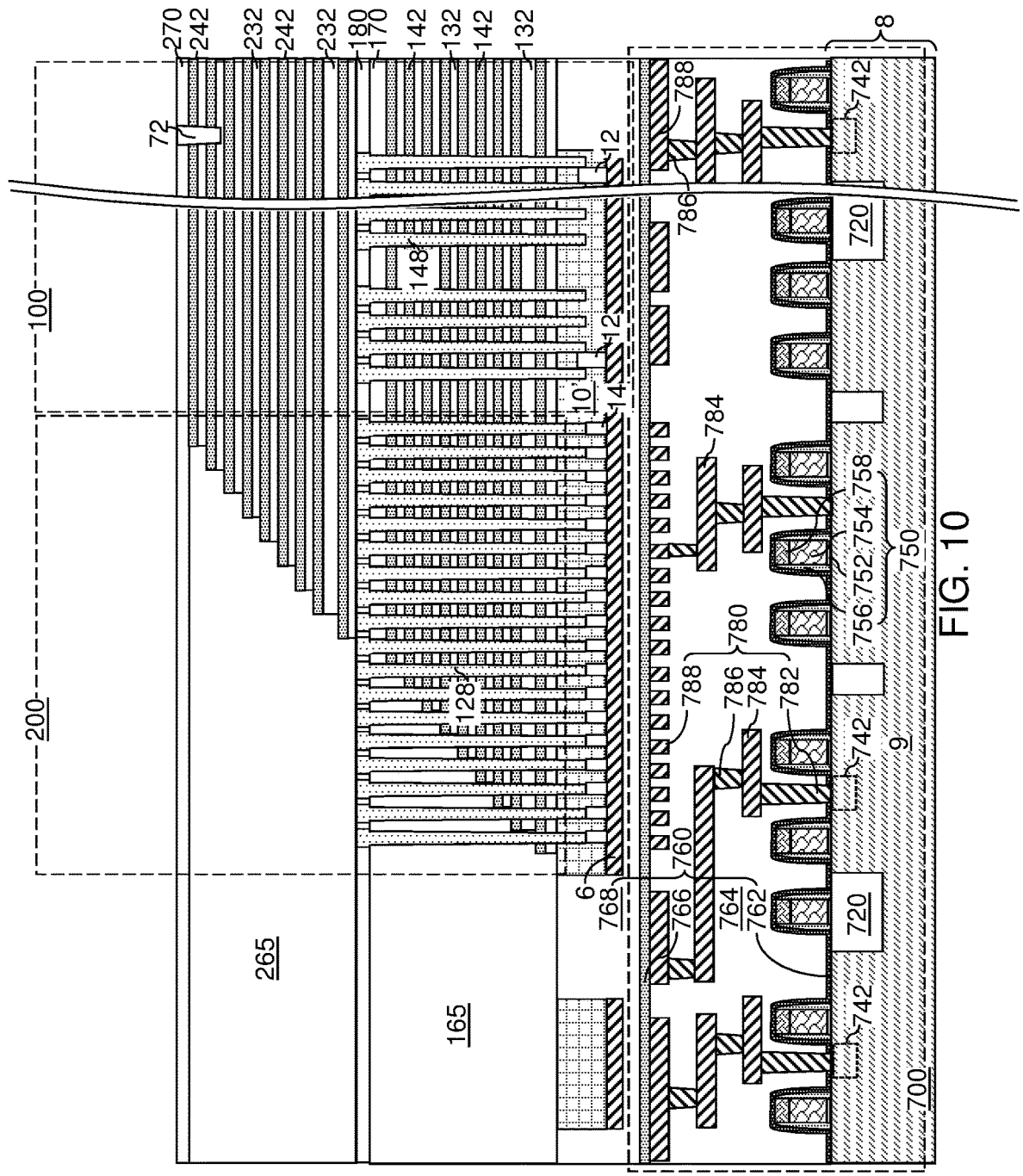
FIG. 10 is a vertical cross-sectional view of the exemplary structure after formation of a second-tier alternating stack of second insulating layers and second spacer material layers, second stepped surfaces, a second retro-stepped dielectric material portion, and drain-select-level isolation structures according to an embodiment of the present disclosure.

Referring to FIG. 10, a second-tier structure can be formed over the first-tier structure (132, 142, 170, 165, 148, 128). The second-tier structure can include an additional alternating stack of insulating layers and spacer material layers, which can be sacrificial material layers. For example, a second alternating stack (232, 242) of material layers can be subsequently formed on the top surface of the first alternating stack (132, 142). The second stack (232, 242) includes an alternating plurality of third material layers and fourth material layers. Each third material layer can include a third material, and each fourth material layer can include a fourth material that is different from the third material. In one embodiment, the third material can be the same as the first material of the first insulating layer 132, and the fourth material can be the same as the second material of the first sacrificial material layers 142.

In one embodiment, the third material layers can be second insulating layers 232 and the fourth material layers can be second spacer material layers that provide vertical spacing between each vertically neighboring pair of the second insulating layers 232. In one embodiment, the third material layers and the fourth material layers can be second insulating layers 232 and second sacrificial material layers 242, respectively. The third material of the second insulating layers 232 may be at least one insulating material. The fourth material of the second sacrificial material layers 242 may be a sacrificial material that can be removed selective to the third material of the second insulating layers 232. The second sacrificial material layers 242 may comprise an insulating material, a semiconductor material, or a conductive material. The fourth material of the second sacrificial material layers 242 can be subsequently replaced with electrically conductive electrodes which can function, for example, as control gate electrodes of a vertical NAND device.

In one embodiment, each second insulating layer 232 can include a second insulating material, and each second sacrificial material layer 242 can include a second sacrificial material. In this case, the second stack (232, 242) can include an alternating plurality of second insulating layers 232 and second sacrificial material layers 242. The third material of the second insulating layers 232 can be deposited, for example, by chemical vapor deposition (CVD). The fourth material of the second sacrificial material layers 242 can be formed, for example, CVD or atomic layer deposition (ALD).

The third material of the second insulating layers 232 can be at least one insulating material. Insulating materials that can be employed for the second insulating layers 232 can be any material that can be employed for the first insulating layers 132. The fourth material of the second sacrificial material layers 242 is a sacrificial material that can be removed selective to the third material of the second insulating layers 232. Sacrificial materials that can be employed for the second sacrificial material layers 242 can be any material that can be employed for the first sacrificial material layers 142. In one embodiment, the second insulating material can be the same as the first insulating material, and the second sacrificial material can be the same as the first sacrificial material.

The thicknesses of the second insulating layers 232 and the second sacrificial material layers 242 can be in a range from 20 nm to 50 nm, although lesser and greater thicknesses can be employed for each second insulating layer 232 and for each second sacrificial material layer 242. The number of repetitions of the pairs of a second insulating layer 232 and a second sacrificial material layer 242 can be in a range from 2 to 1,024, and typically from 8 to 256, although a greater number of repetitions can also be employed. In one embodiment, each second sacrificial material layer 242 in the second stack (232, 242) can have a uniform thickness that is substantially invariant within each respective second sacrificial material layer 242.

Second stepped surfaces can be formed in the second stepped area of the staircase region 200 employing a same set of processing steps as the processing steps employed to form the first stepped surfaces in the first stepped area with suitable adjustment to the pattern of at least one masking layer. A second retro-stepped dielectric material portion 265 can be formed over the second stepped surfaces in the staircase region 200.

A second insulating cap layer 270 can be subsequently formed over the second alternating stack (232, 242) and the second retro-stepped dielectric material portion 265. The second insulating cap layer 270 includes a dielectric material that is different from the material of the second sacrificial material layers 242. In one embodiment, the second insulating cap layer 270 can include silicon oxide. In one embodiment, the first and second sacrificial material layers (142, 242) can comprise silicon nitride.

Optionally, drain-select-level isolation structures 72 can be formed through the second insulating cap layer 270 and through a subset of layers in an upper portion of the second-tier alternating stack (232, 242). The second sacrificial material layers 242 that are cut by the select-drain-level shallow trench isolation structures 72 correspond to the levels in which drain-select-level electrically conductive layers are subsequently formed. The drain-select-level isolation structures 72 include a dielectric material such as silicon oxide. The drain-select-level isolation structures 72 can laterally extend along a first horizontal direction hd1, and can be laterally spaced apart along a second horizontal direction hd2 that is perpendicular to the first horizontal direction hd1.

Generally speaking, at least one alternating stack of insulating layers (132, 232) and spacer material layers (such as sacrificial material layers (142, 242)) can be formed over the in-process source-level material layers 10', and at least one retro-stepped dielectric material portion (165, 265) can be formed over the staircase regions on the at least one alternating stack (132, 142, 232, 242).

Figure 11A:
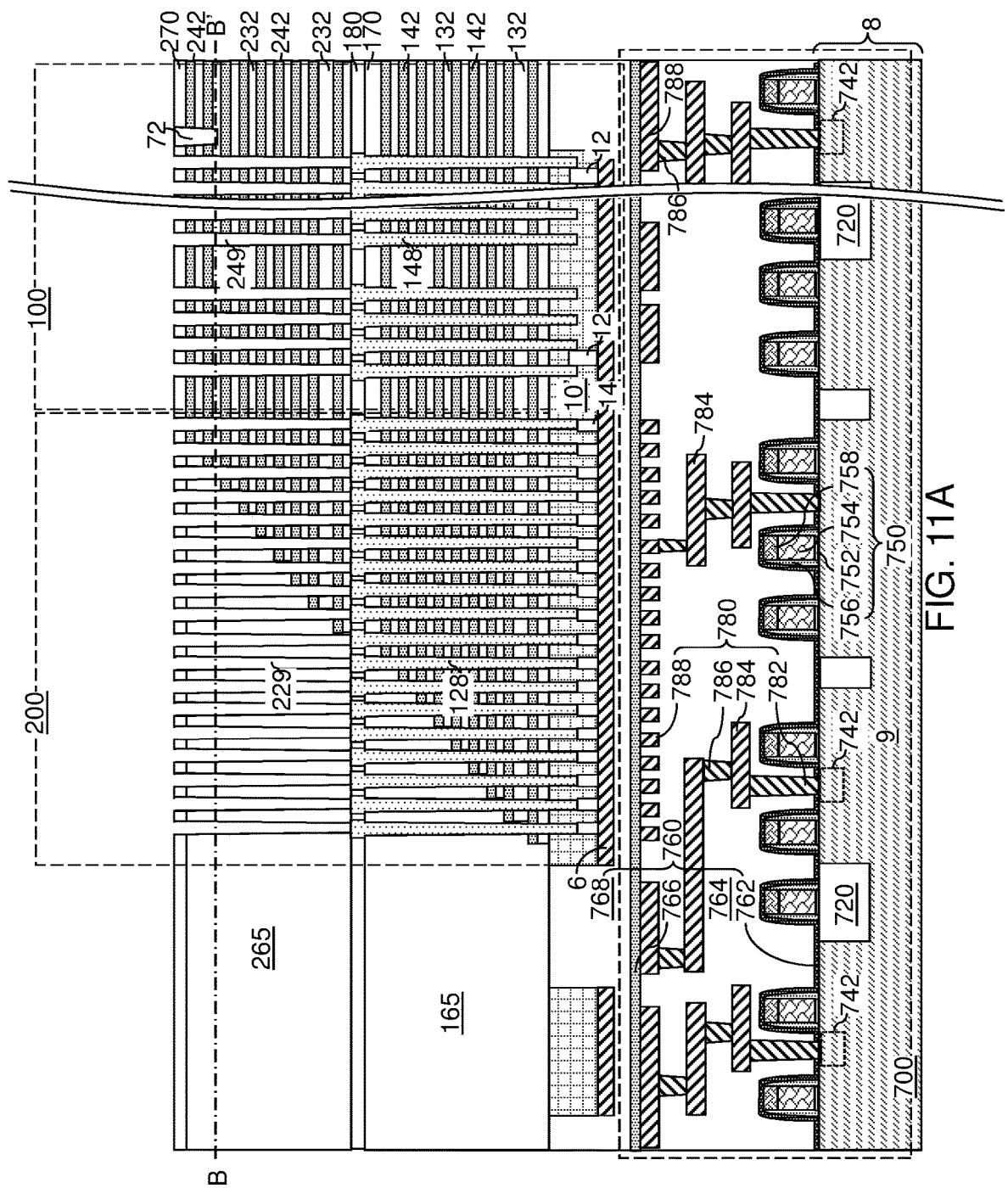
FIG. 11A is a vertical cross-sectional view of the exemplary structure after formation of second-tier memory openings and second-tier support openings according to an embodiment of the present disclosure.
Figure 11B:
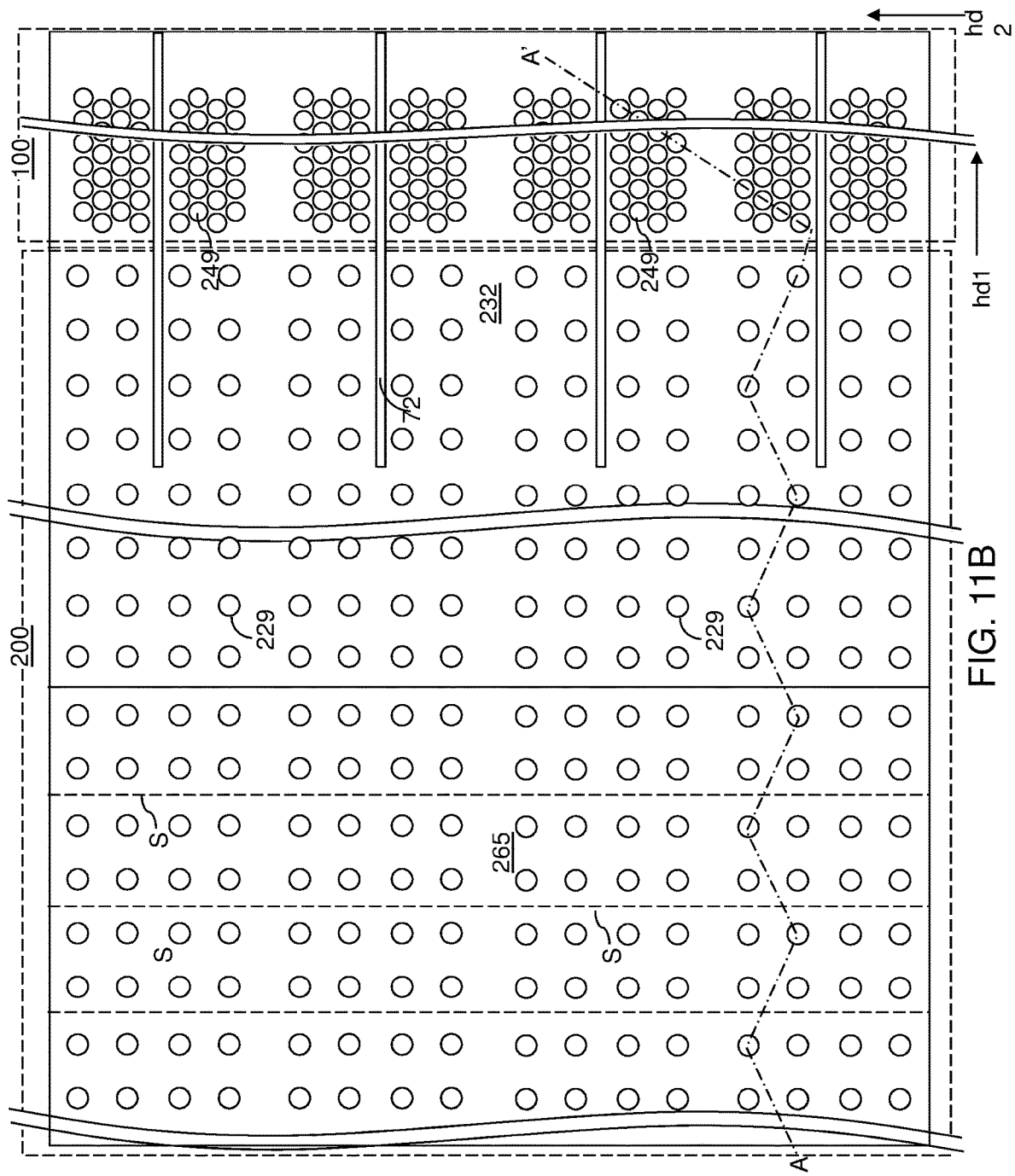
FIG. 11B is a horizontal cross-sectional of the exemplary structure along the horizontal plane B-B' of FIG. 11A. The zig-zag vertical plane A-A' corresponds to the plane of the vertical cross-sectional view of FIG. 11A.

Referring to FIGS. 11A and 11B, second-tier openings (249, 229) can be formed through the second-tier structure (232, 242, 265, 270, 72). A photoresist layer (not shown) can be applied over the second insulating cap layer 270, and can be lithographically patterned to form various openings therethrough. The pattern of the openings can be the same as the pattern of the various first-tier openings (149, 129), which is the same as the sacrificial first-tier opening fill portions (148, 128). Thus, the lithographic mask employed to pattern the first-tier openings (149, 129) can be employed to pattern the photoresist layer.

The pattern of openings in the photoresist layer can be transferred through the second-tier structure (232, 242, 265, 270, 72) by a second anisotropic etch process to form second-tier openings (249, 229) concurrently, i.e., during the second anisotropic etch process. The second-tier openings (249, 229) can include second-tier memory openings 249 and second-tier support openings.

The second-tier memory openings 249 are formed directly on a top surface of a respective one of the sacrificial first-tier memory opening fill portions 148. The second-tier support openings 229 are formed directly on a top surface of a respective one of the sacrificial first-tier support opening fill portions 128. Locations of steps S in the first-tier alternating stack (132, 142) and the second-tier alternating stack (232, 242) are illustrated as dotted lines in FIG. 11B.

Figure 12:
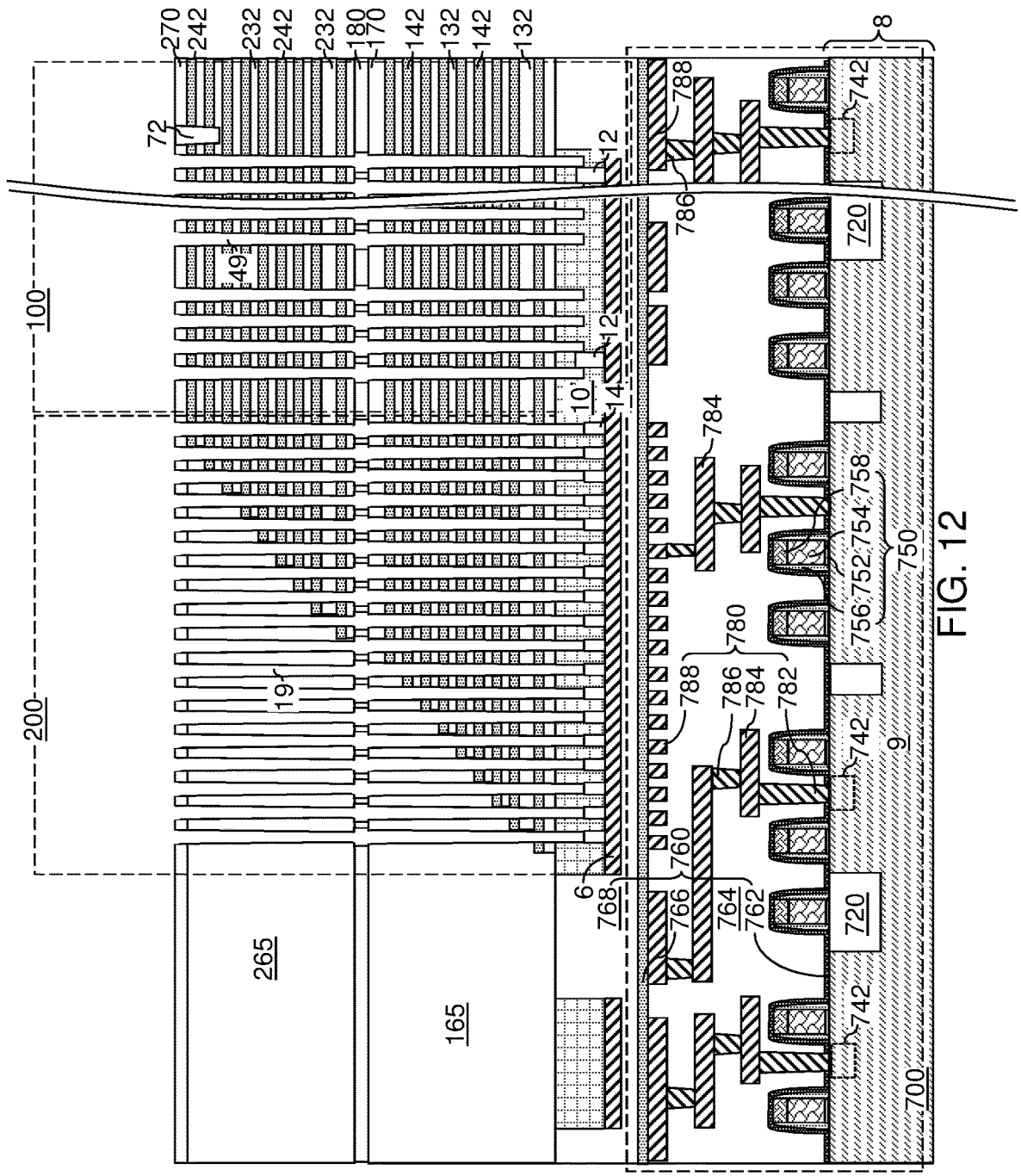
FIG. 12 is a vertical cross-sectional view of the exemplary structure after formation of inter-tier memory openings and inter-tier support openings according to an embodiment of the present disclosure.

Referring to FIG. 12, the sacrificial fill material can be removed from underneath the second-tier memory openings 249 and the second-tier support openings 229 employing an etch process that etches the sacrificial fill material selective to the materials of the first and second insulating layers (132, 232), the first and second sacrificial material layers (142, 242), the first and second insulating cap layers (170, 270), and the inter-tier dielectric layer 180. A memory opening 49, which is also referred to as an inter-tier memory opening 49, is formed in each volume from which a sacrificial first-tier memory opening fill portion 148 is removed. A support opening 19, which is also referred to as an inter-tier support opening 19, is formed in each volume from which a sacrificial first-tier support opening fill portion 128 is removed.

FIGS. 13A-13D provide sequential cross-sectional views of a memory opening 49 during formation of a memory opening fill structure 58 or a support pillar structure 20. The same structural change occurs in each memory openings 49.

Referring to FIG. 13A, a memory opening 49 in the first exemplary device structure of FIG. 12 is illustrated. The memory opening 49 extends through the first-tier structure and the second-tier structure. In one embodiment, at least one memory-region dielectric pillar structure 12 is physically exposed at a bottom portion of each memory opening 49. For example, a sidewall and a horizontal ledge of one, two, or three memory-region dielectric pillar structures 12 can be physically exposed at a bottom portion of each memory opening 49.

Referring to FIG. 13B, a stack of layers including a blocking dielectric layer 52, a charge storage layer 54, a tunneling dielectric layer 56, and a semiconductor channel material layer 60L can be sequentially deposited in the memory openings 49. The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52 includes aluminum oxide. Alternatively or additionally, the blocking dielectric layer 52 can include a dielectric semiconductor compound such as silicon oxide, silicon oxynitride, silicon nitride, or a combination thereof.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers (142, 242). In one embodiment, the charge storage layer 54 includes a silicon nitride layer. In one embodiment, the sacrificial material layers (142, 242) and the insulating layers (132, 232) can have vertically coincident sidewalls, and the charge storage layer 54 can be formed as a single continuous layer. Alternatively, the sacrificial material layers (142, 242) can be laterally recessed with respect to the sidewalls of the insulating layers (132, 232), and a combination of a deposition process and an anisotropic etch process can be employed to form the charge storage layer 54 as a plurality of memory material portions that are vertically spaced apart. The thickness of the charge storage layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed. The stack of the blocking dielectric layer 52, the charge storage layer 54, and the tunneling dielectric layer 56 constitutes a memory film 50 that stores memory bits.

The semiconductor channel material layer 60L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel material layer 60L includes amorphous silicon or polysilicon. The semiconductor channel material layer 60L can be formed by a conformal deposition method such as low pressure chemical vapor deposition (LPCVD). The thickness of the semiconductor channel material layer 60L can be in a range from 2 nm to 10 nm, although lesser and greater thicknesses can also be employed. A cavity 49' is formed in the volume of each memory opening 49 that is not filled with the deposited material layers (52, 54, 56, 60L).

Referring to FIG. 13C, in case the cavity 49' in each memory opening is not completely filled by the semiconductor channel material layer 60L, a dielectric core layer can be deposited in the cavity 49' to fill any remaining portion of the cavity 49' within each memory opening. The dielectric core layer includes a dielectric material such as silicon oxide or organosilicate glass. The dielectric core layer can be deposited by a conformal deposition method such as low pressure chemical vapor deposition (LPCVD), or by a self-planarizing deposition process such as spin coating. The horizontal portion of the dielectric core layer overlying the second insulating cap layer 270 can be removed, for example, by a recess etch. The recess etch continues until top surfaces of the remaining portions of the dielectric core layer are recessed to a height between the top surface of the second insulating cap layer 270 and the bottom surface of the second insulating cap layer 270. Each remaining portion of the dielectric core layer constitutes a dielectric core 62.

Referring to FIG. 13D, a doped semiconductor material can be deposited in cavities overlying the dielectric cores 62. The doped semiconductor material has a doping of the opposite conductivity type of the doping of the semiconductor channel material layer 60L. Thus, the doped semiconductor material has a doping of the second conductivity type. Portions of the deposited doped semiconductor material, the semiconductor channel material layer 60L, the tunneling dielectric layer 56, the charge storage layer 54, and the blocking dielectric layer 52 that overlie the horizontal plane including the top surface of the second insulating cap layer 270 can be removed by a planarization process such as a chemical mechanical planarization (CMP) process.

Each remaining portion of the doped semiconductor material having a doping of the second conductivity type constitutes a drain region 63. The drain regions 63 can have a doping of a second conductivity type that is the opposite of the first conductivity type. For example, if the first conductivity type is p-type, the second conductivity type is n-type, and vice versa. The dopant concentration in the drain regions 63 can be in a range from $5.0 \times 10^{19}/cm^3$ to $2.0 \times 10^{21}/cm^3$, although lesser and greater dopant concentrations can also be employed. The doped semiconductor material can be, for example, doped polysilicon.

Each remaining portion of the semiconductor channel material layer 60L constitutes a vertical semiconductor channel 60 through which electrical current can flow when a vertical NAND device including the vertical semiconductor channel 60 is turned on. A tunneling dielectric layer 56 is surrounded by a charge storage layer 54, and laterally surrounds a vertical semiconductor channel 60. Each adjoining set of a blocking dielectric layer 52, a charge storage layer 54, and a tunneling dielectric layer 56 collectively constitute a memory film 50, which can store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Each combination of a memory film 50 and a vertical semiconductor channel 60 within a memory opening 49 constitutes a memory stack structure 55. The memory stack structure 55 is a combination of a vertical semiconductor channel 60, a tunneling dielectric layer 56, a plurality of memory elements comprise portions of the charge storage layer 54, and an optional blocking dielectric layer 52. Each combination of a memory stack structure 55, a dielectric core 62, and a drain region 63 within a memory opening 49 constitutes a memory opening fill structure 58. The in-process source-level material layers 10', the first-tier structure (132, 142, 170, 165), the second-tier structure (232, 242, 270, 265, 72), the inter-tier dielectric layer 180, and the memory opening fill structures 58 collectively constitute a memory-level assembly.

Figure 13E:
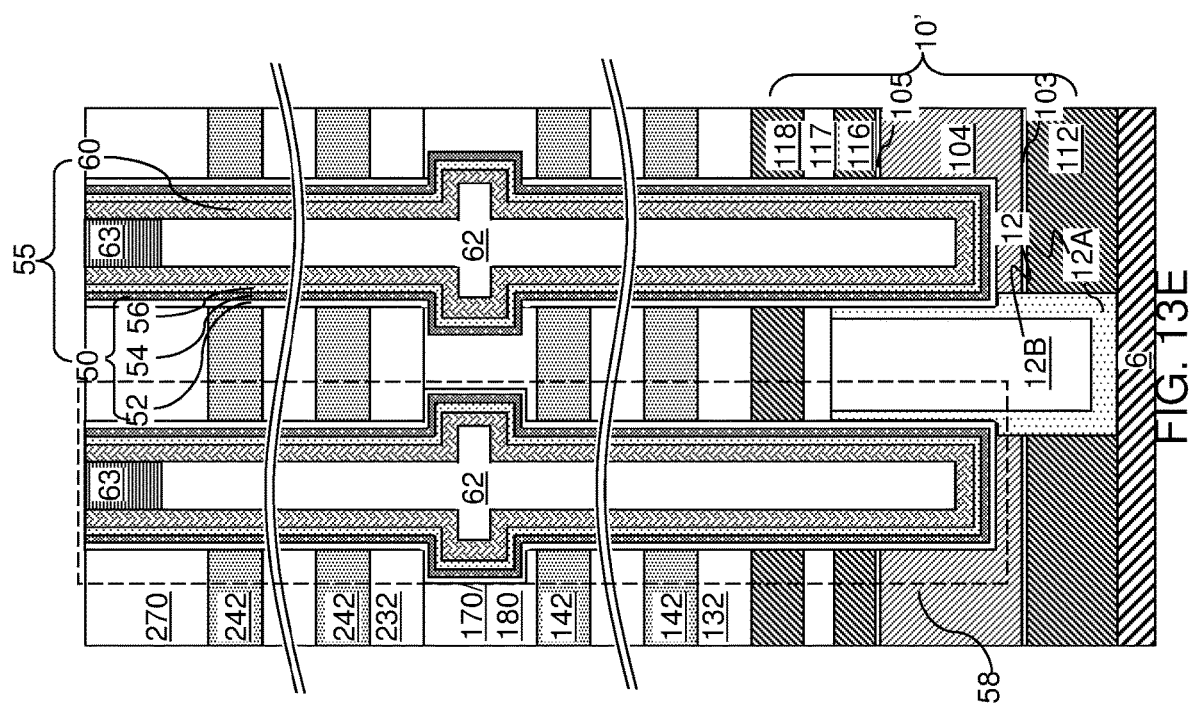
FIG. 13E is a vertical cross-sectional view of an alternative configuration for a pair of memory opening fill structures and a dielectric pillar structure according to an embodiment of the present disclosure.

Referring to FIG. 13E, an alternative configuration for a pair of memory opening fill structures 58 and a memory-region dielectric pillar structure 12 is illustrated for an embodiment in which each memory-region dielectric pillar structure 12 includes a dielectric pillar liner 12A and a dielectric pillar core 12B.

Figure 14:
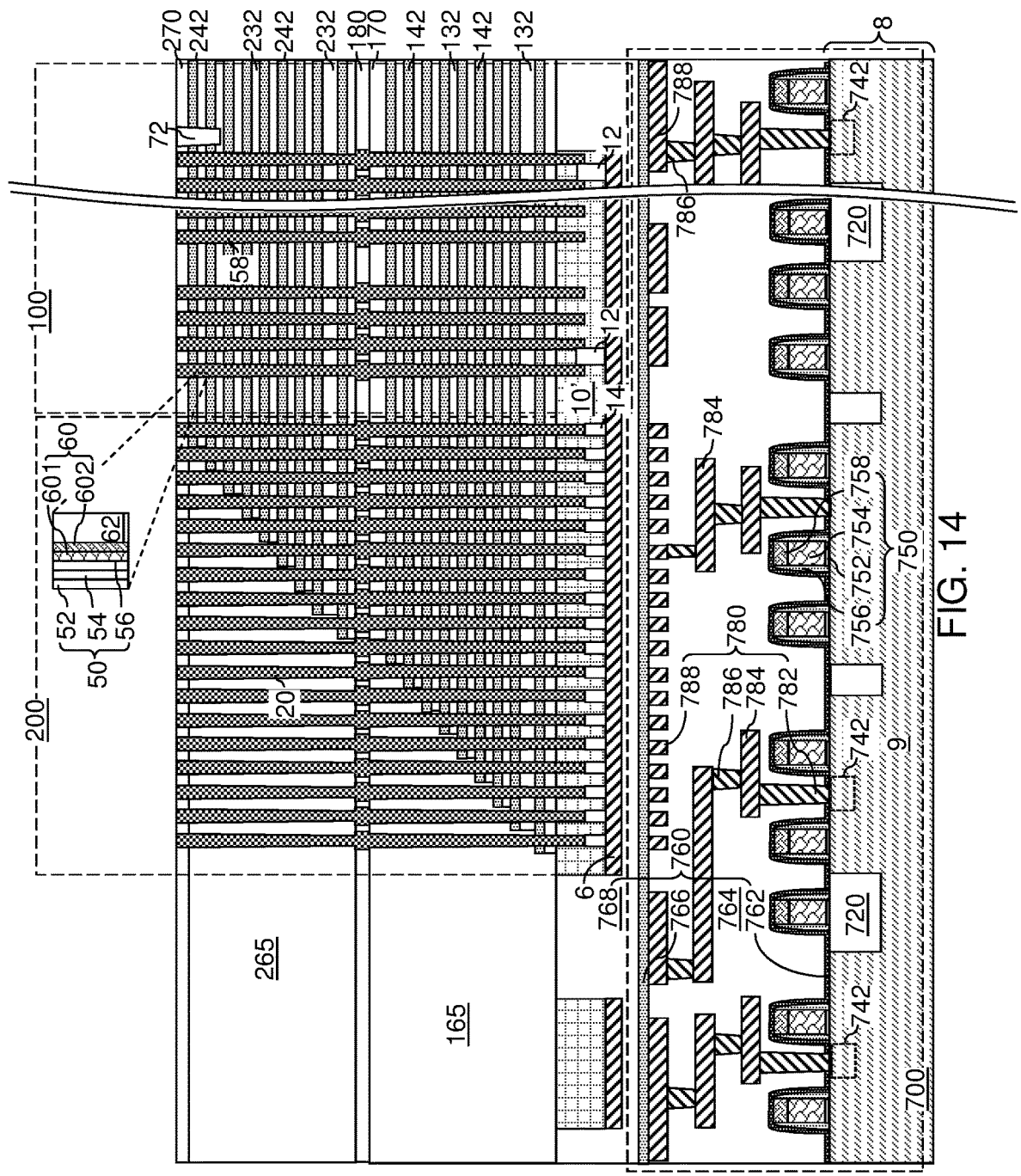
FIG. 14 is a vertical cross-sectional view of the exemplary structure after formation of memory opening fill structures and support pillar structures according to an embodiment of the present disclosure.

Referring to FIG. 14, the exemplary structure is shown after formation of memory opening fill structures 58 in the memory openings 49 and support pillar structures 20 in the support openings 19. Each of the support openings 19 is filled with a respective support pillar structure 20 concurrently with formation of the memory opening fill structures 58. Each support pillar structure 20 can have the same structural elements as a memory opening fill structure 58. Each support pillar structure 20 is a dummy structure, i.e., an electrically inactive structure, and as such, is not subsequently contacted by any contact via structure.

In one embodiment, the array-region dielectric pillar structures 12 are formed as a two-dimensional array of dielectric pillar structures having a first dielectric pillar pitch dpp1 along a first direction and a second dielectric pillar pitch dpp2 along a second direction. The memory stack structures 58 are formed as a two-dimensional array of memory stack structures 58 having a first memory stack pitch msp1 along the first direction and a second memory stack pitch msp2 along the second direction. The first dielectric pillar pitch dpp1 is commensurate with the first memory stack pitch msp1, and the second dielectric pillar pitch dpp2 is commensurate with the second memory stack pitch msp2.

Figure 15A:
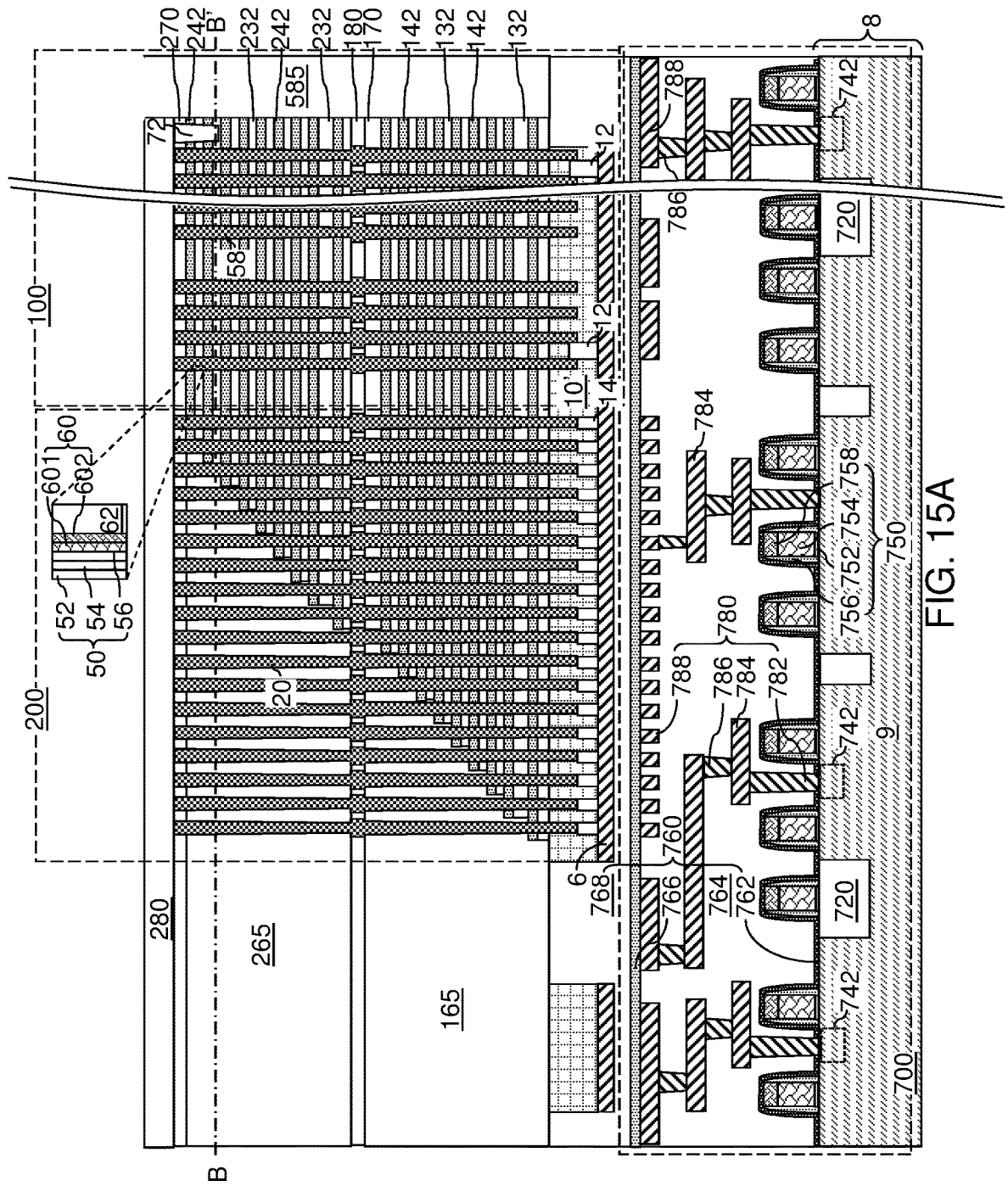
FIG. 15A is a vertical cross-sectional view of the exemplary structure after formation of a contact level dielectric layer and a memory region pillar cavity according to an embodiment of the present disclosure.
Figure 15B:
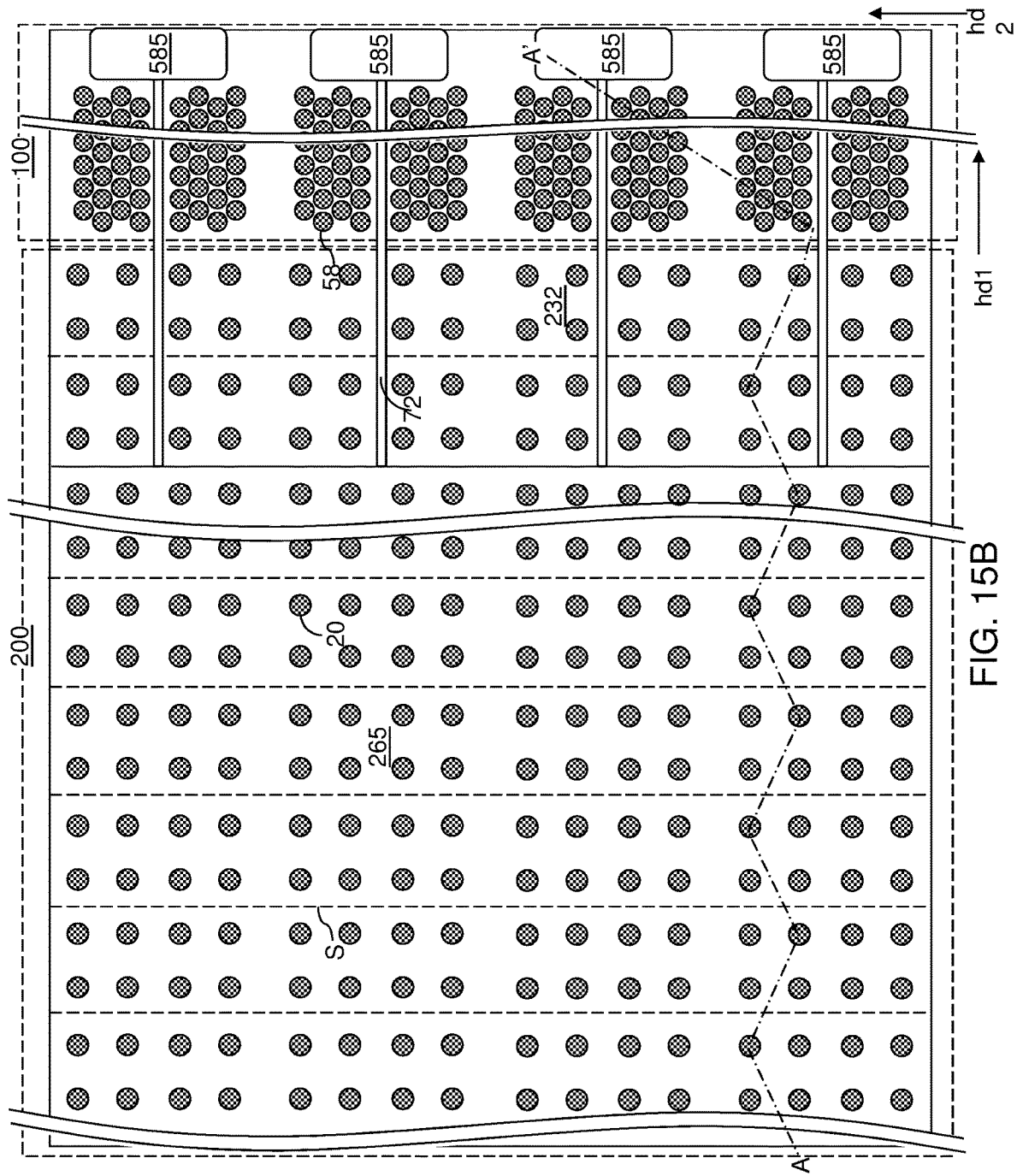
FIG. 15B is a top-down view of the exemplary structure of FIG. 15A. The zig-zag vertical plane A-A' corresponds to the plane of the vertical cross-sectional view of FIG. 15A.

Referring to FIGS. 15A and 15B, a first contact level dielectric layer 280 can be formed over the second-tier structure (232, 242, 270, 265, 72). The first contact level dielectric layer 280 includes a dielectric material such as silicon oxide, and can be formed by a conformal or non-conformal deposition process. For example, the first contact level dielectric layer 280 can include undoped silicate glass and can have a thickness in a range from 100 nm to 600 nm, although lesser and greater thicknesses can also be employed.

A photoresist layer can be applied over the first contact level dielectric layer 280 and can be lithographically patterned to form openings within areas of the memory array region 100. The pattern in the photoresist layer can be transferred through the first-tier structure (132, 142, 170, 165) by an anisotropic etch process to form pillar cavities 585 that extend through the first contact level dielectric layer 280, the second-tier structure (232, 242, 270, 265, 72), and the first-tier structure (132, 142, 170, 165).

Figure 16:
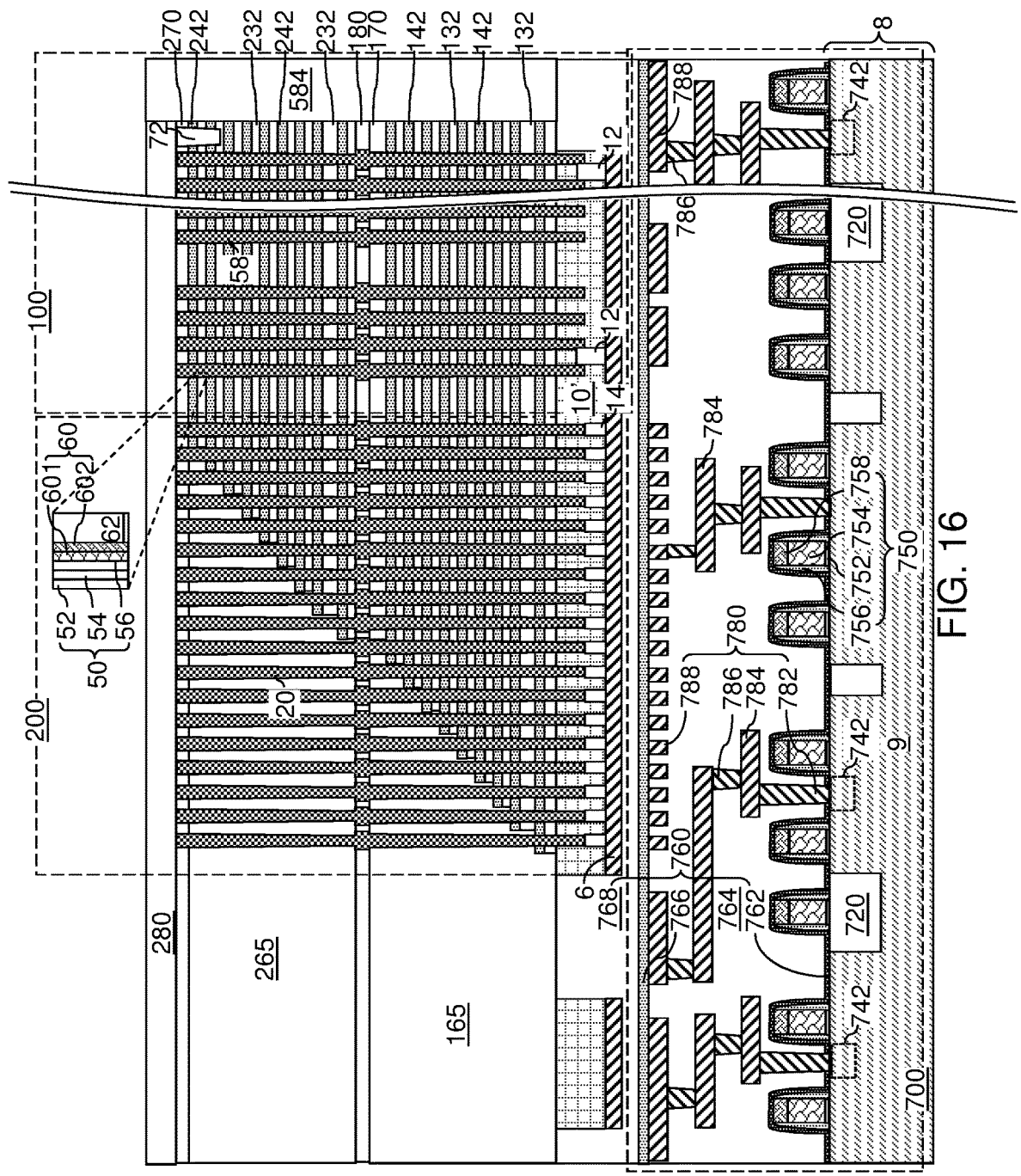
FIG. 16 is a vertical cross-sectional view of the exemplary structure after formation of memory-level dielectric fill structures according to an embodiment of the present disclosure.

Referring to FIG. 16, a dielectric fill material such as silicon oxide can be deposited into the pillar cavities 585 to form dielectric fill structures 584. In one embodiment, the dielectric fill structures 584 can have straight sidewalls that extend through the first contact level dielectric layer 280, the second-tier structure (232, 242, 270, 265, 72), and the first-tier structure (132, 142, 170, 165). A bottom surface of each dielectric fill structure 584 can contact a top surface of the at least one second dielectric layer 768. A top surface of each dielectric fill structure 584 can be coplanar with the top surface of the first contact level dielectric layer 280.

Figure 17A:
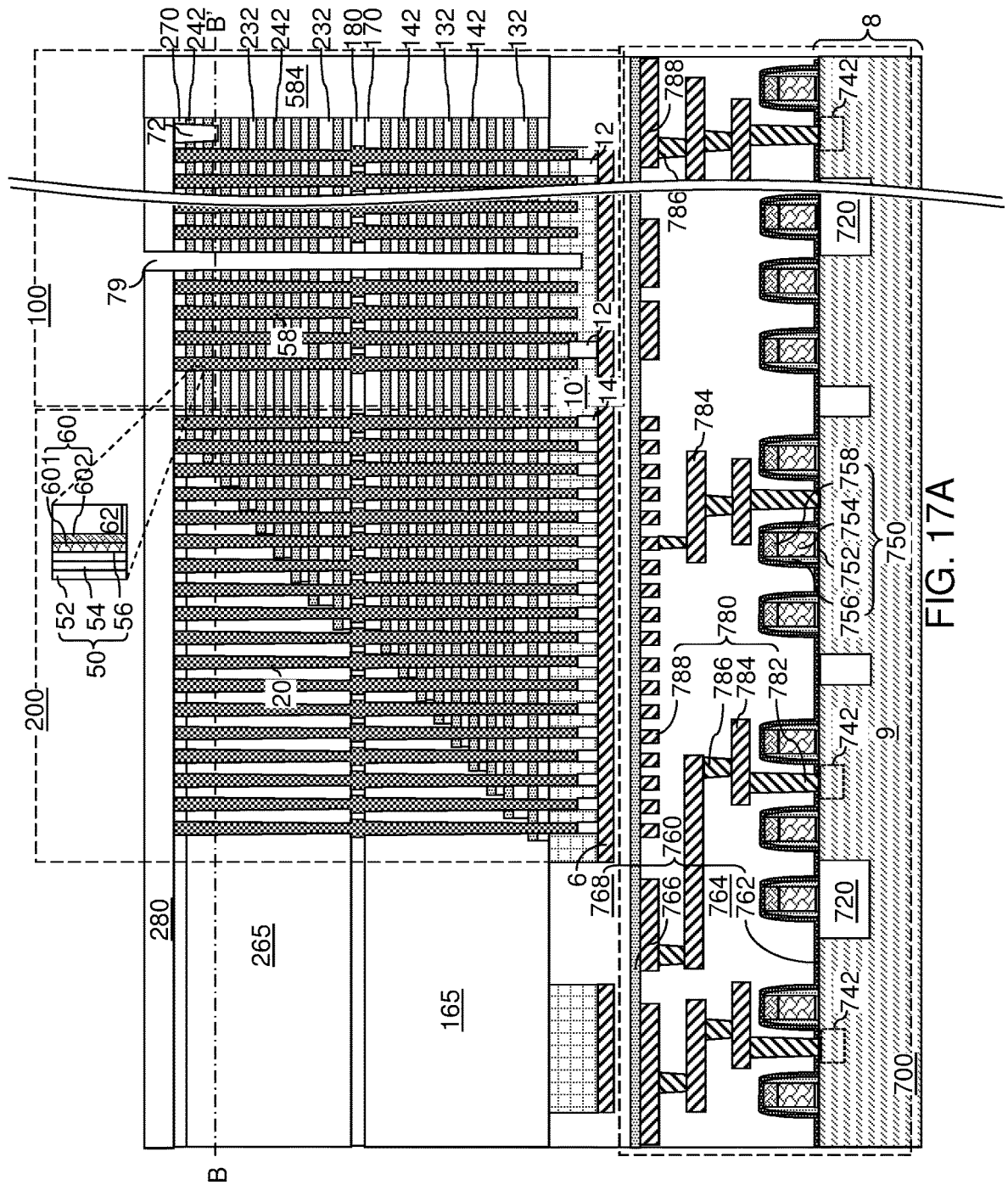
FIG. 17A is a vertical cross-sectional view of the exemplary structure after formation of backside trenches according to an embodiment of the present disclosure.
Figure 17B:
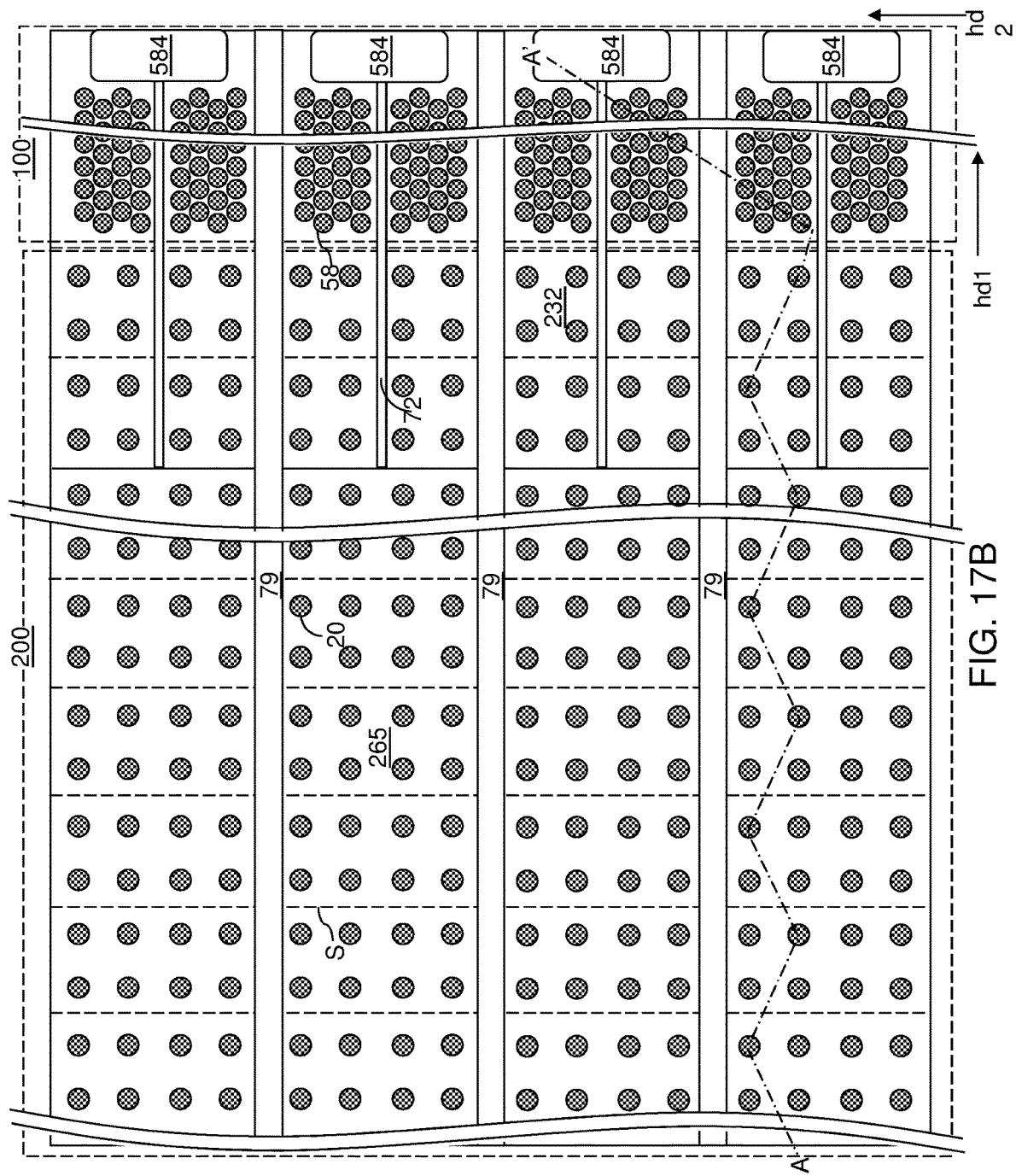
FIG. 17B is a top-down view of the exemplary structure of FIG. 17A. The zig-zag vertical plane A-A' corresponds to the plane of the vertical cross-sectional view of FIG. 17A.

Referring to FIGS. 17A and 17B, backside trenches 79 can be formed by transferring the pattern in the photoresist layer through the first contact level dielectric layer 280, the second alternating stack (232, 242, 270, 265, 72), the first alternating stack (132, 142, 170, 165), and the in-process source-level material layers 10'. Portions of the first contact level dielectric layer 280, the second alternating stack (232, 242, 270, 265, 72), the first alternating stack (132, 142, 170, 165), and the in-process source-level material layers 10' that underlie the openings in the photoresist layer can be removed to form backside trenches 79. In one embodiment, the backside trenches 79 can be formed between clusters of memory stack structures 55. The clusters of the memory stack structures 58 can be laterally spaced apart along the second horizontal direction hd2 by the backside trenches 79.

Figure 18:
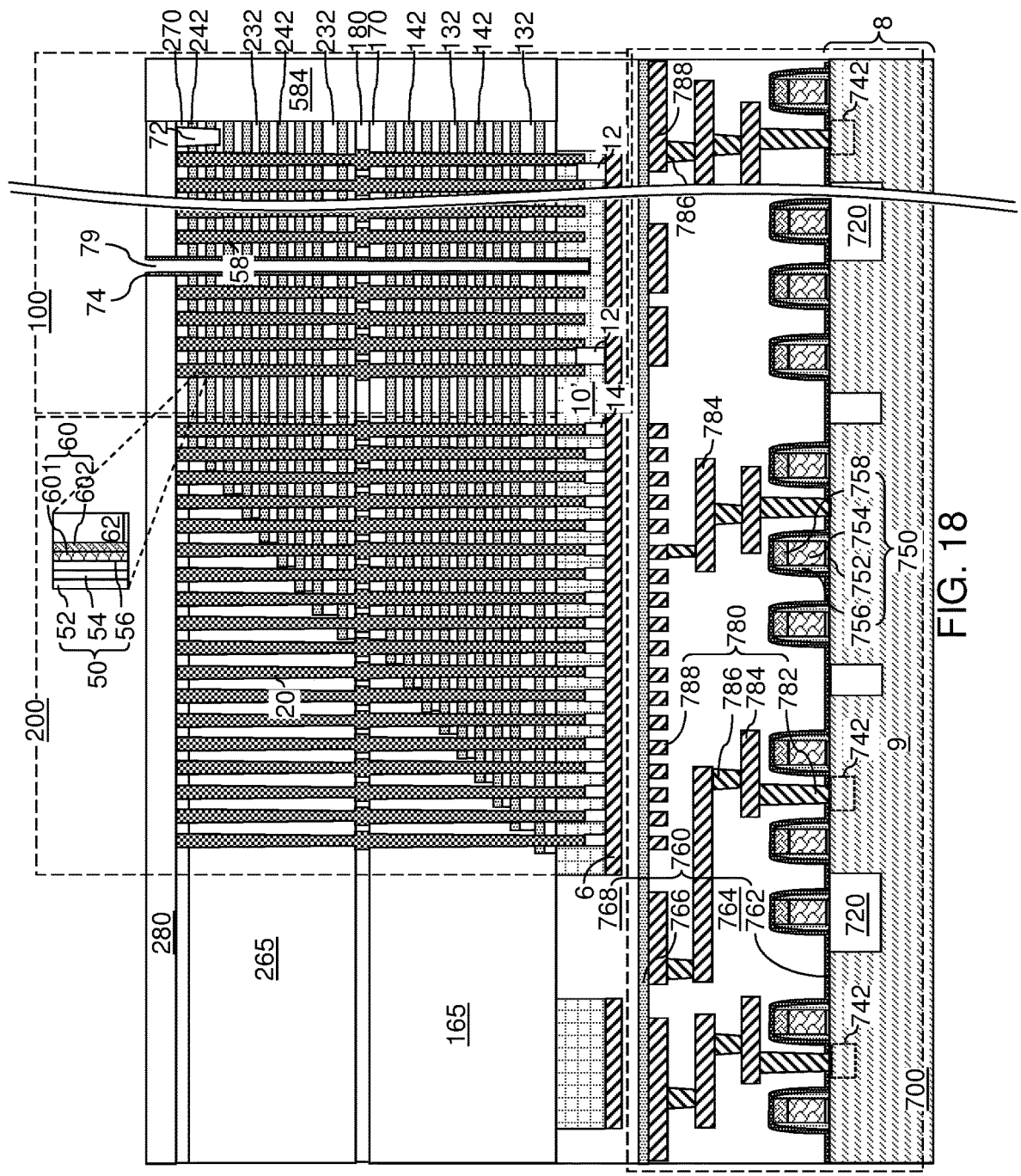
FIG. 18 is a vertical cross-sectional view of the exemplary structure after formation of silicon nitride spacers in the backside trenches according to an embodiment of the present disclosure.
Figure 19A:
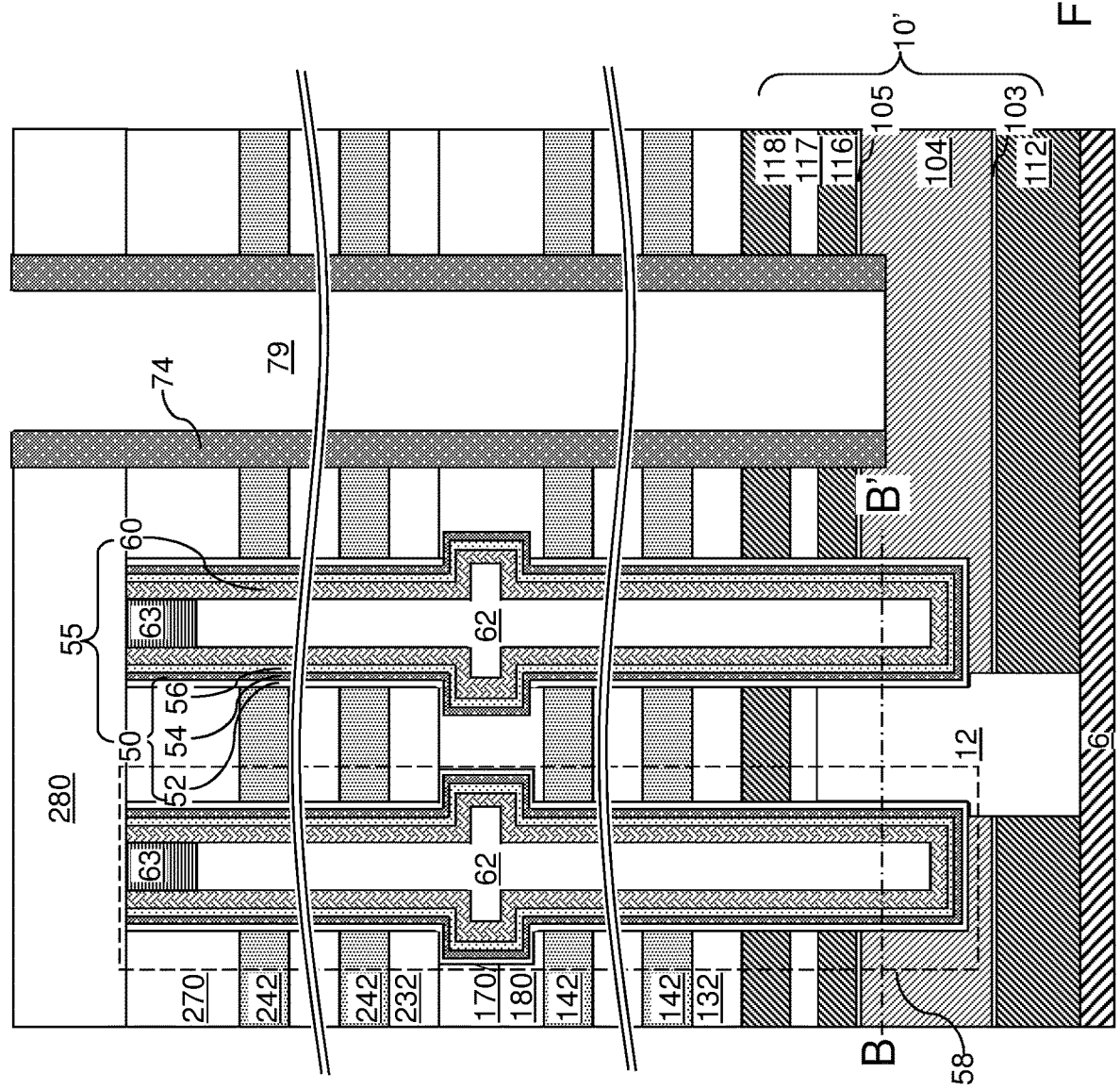
FIG. 19A is a vertical cross-sectional view of a region of FIG. 18 that includes a backside trench and a pair of memory opening fill structures.
Figure 19B:
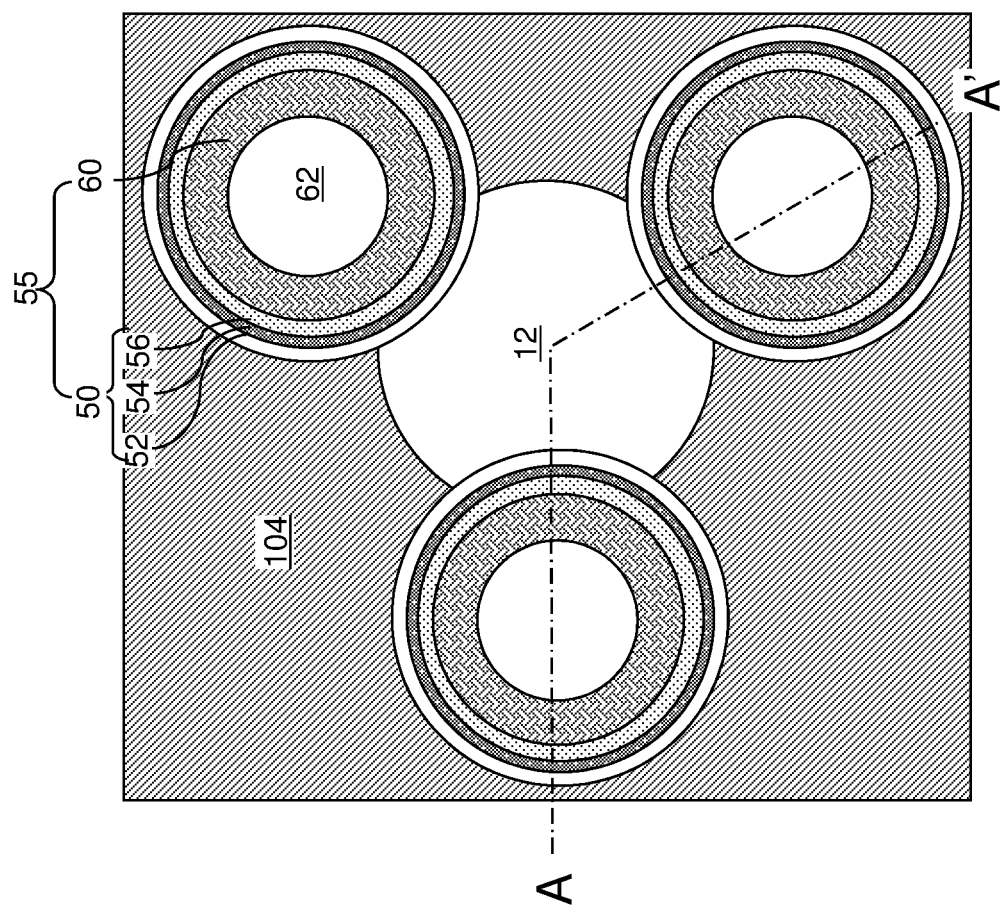
FIG. 19B is a horizontal cross-sectional view along the horizontal plane B-B' of FIG. 19A.

Referring to FIGS. 18, 19A, and 19B, a backside trench spacer 74 can be formed on sidewalls of each backside trench 79. For example, a conformal spacer material layer can be deposited in the backside trenches 79 and over the first contact level dielectric layer 280, and can be anisotropically etched to form the backside trench spacers 74. The backside trench spacers 74 include a material that is different from the material of the source-level sacrificial layer 104. For example, the backside trench spacers 74 can include silicon nitride.

Figure 20A:
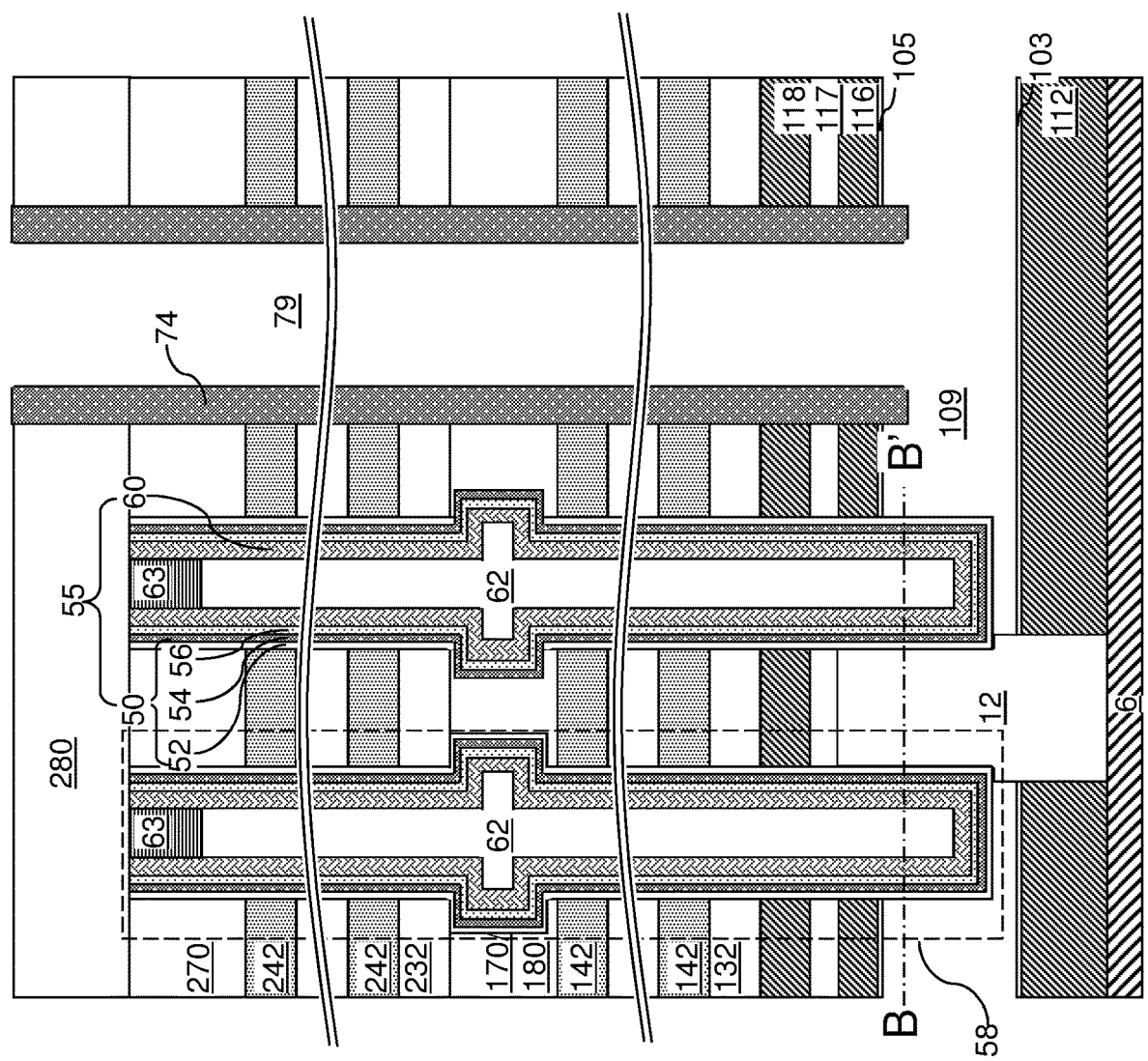
FIG. 20A is a vertical cross-sectional view of the region of FIG. 19A after formation of a source cavity according to an embodiment of the present disclosure.
Figure 20B:
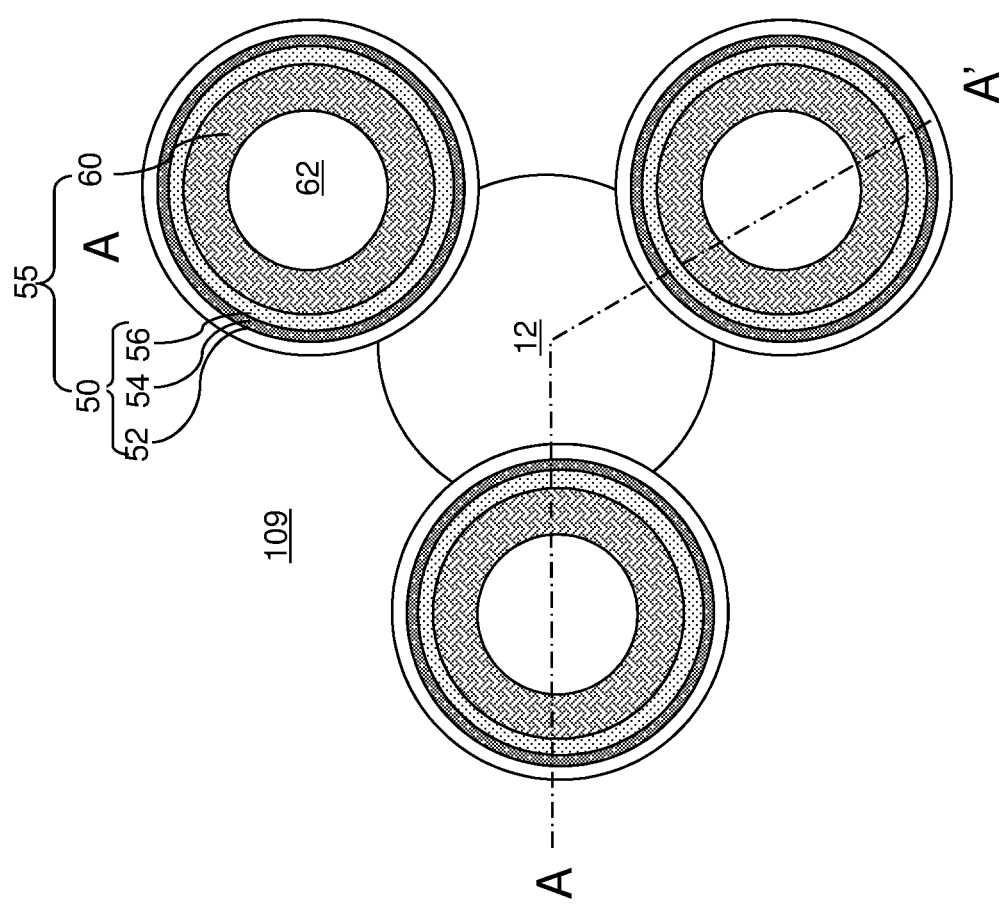
FIG. 20B is a horizontal cross-sectional view along the horizontal plane B-B' of FIG. 20A.

Referring to FIGS. 20A and 20B, an etchant that etches the material of the source-level sacrificial layer 104 selective to the materials of the first alternating stack (132, 142), the second alternating stack (232, 242), the first and second insulating cap layers (170, 270), the upper sacrificial liner 105, and the lower sacrificial liner 103 can be introduced into the backside trenches in an isotropic etch process. For example, if the source-level sacrificial layer 104 includes undoped amorphous silicon or an undoped amorphous silicon-germanium alloy, the backside trench spacers 74 include silicon nitride, and the upper and lower sacrificial liners (105, 103) include silicon oxide, a wet etch process employing hot trimethyl-2 hydroxyethyl ammonium hydroxide ("hot TMY") or tetramethyl ammonium hydroxide (TMAH) can be employed to remove the source-level sacrificial layer 104 selective to the backside trench spacers 74 and the upper and lower sacrificial liners (105, 103). A source cavity 109 is formed in the volume from which the source-level sacrificial layer 104 is removed.

Each of the memory opening fill structures 58 is physically exposed to the source cavity 109. Specifically, each of the memory opening fill structures 58 includes a sidewall and a bottom surface that are physically exposed to the source cavity 109. In one embodiment, each memory opening fill structure 58 laterally contacts at least one memory-region dielectric pillar structure 12, and is vertically spaced from the bottom surface of the source cavity 109, which can be, for example, a top surface of the lower sacrificial liner 103. Upon formation of the source cavity 109 through removal of the source-level sacrificial layer 104, the memory-region dielectric pillar structures 12 provide structural support to material portions overlying the source cavity 109. Particularly, the memory-region dielectric pillar structures 12 provide support to the source-level insulating layer 117 and overlying structures while the source cavity 109 is present. In other words, the memory opening fill structures 58 and the alternating stacks (132, 142, 232, 242) are structurally supported by the memory-region dielectric pillar structures 12 in the memory array region 100. The support pillar structures 20 can overlie a top surface of a respective staircase-region dielectric pillar structure 14, and thus, the support pillar structures 20 and the alternating stacks (132, 142, 232, 242) are structurally supported by the staircase-region dielectric pillar structures 14 in the staircase region 200.

Figure 21A:
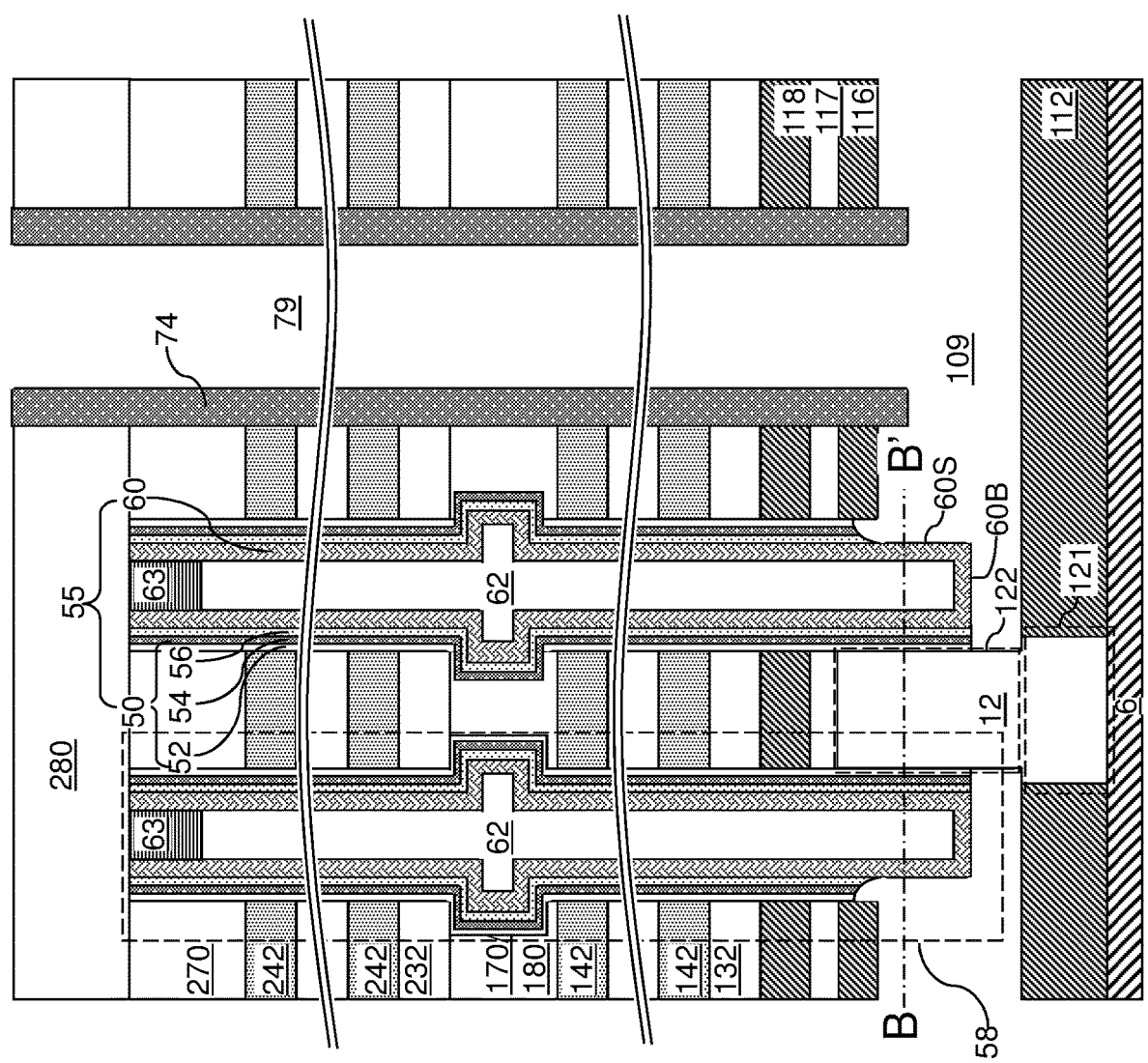
FIG. 21A is a vertical cross-sectional view of the region of FIG. 20A after removal of physically exposed portions of the memory films according to an embodiment of the present disclosure.

Referring to FIGS. 21A and 21B, a sequence of isotropic etchants, such as wet etchants, can be applied through the backside trenches 79 and the source cavity 109 to the physically exposed portions of the memory films 50 to sequentially etch the various component layers of the memory films 50 from outside to inside, and to physically expose bottom surfaces and cylindrical side surfaces of the vertical semiconductor channels 60 at the level of the source cavity 109. The upper and lower sacrificial liners (105, 103) can be collaterally etched during removal of the portions of the memory films 50 located at the level of the source cavity 109. The source cavity 109 can be expanded in volume by removal of the portions of the memory films 50 at the level of the source cavity 109 and the upper and lower sacrificial liners (105, 103). A top surface of the lower source-level material layer 112 and a bottom surface of the upper source-level material layer 116 can be physically exposed to the source cavity 109.

In one embodiment, an entire bottom surface of each of the vertical semiconductor channels 60 of the memory stack structures 55 can be physically exposed to the source cavity 109. In one embodiment, each of the memory-region dielectric pillar structures 12 comprises a first portion 121 contacting a respective sidewall of the lower source-level material layer 112 and a second portion 122 contacting one or more of the unetched portions of the memory opening fill structures 58. In one embodiment, the isotropic etch process laterally etches sidewalls of the second portions 122 of the memory-region dielectric pillar structures 12 and does not etch a bottom of the vertical semiconductor channel 60. A lateral contact region of an outer sidewall 60S of each vertical semiconductor channel 60 is physically exposed to the source cavity 109 after removing the physically exposed portions of the memory films 50. Further, the entirety of the bottom surface 60B of each vertical semiconductor channel 60 is physically exposed to the source cavity 109 after removing the physically exposed portions of the memory films 50. In one embodiment, a portion of a memory film 50 may contact a neighboring pair of a vertical semiconductor channel 60 and a memory-region dielectric pillar structure 12.

Figure 22A:
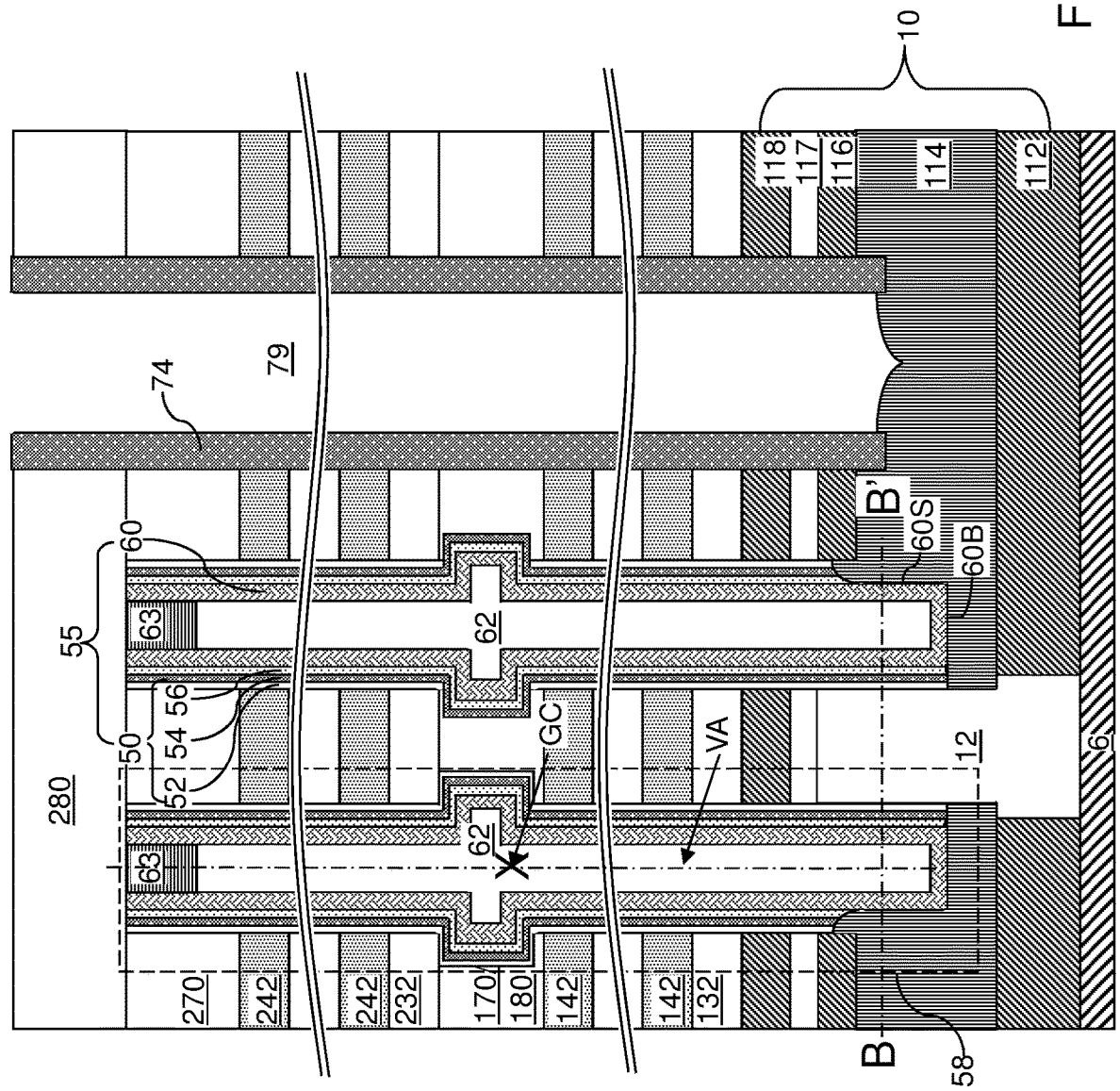
FIG. 22A is a vertical cross-sectional view of the region of FIG. 21A after formation of a source contact layer according to an embodiment of the present disclosure.
Figure 22B:
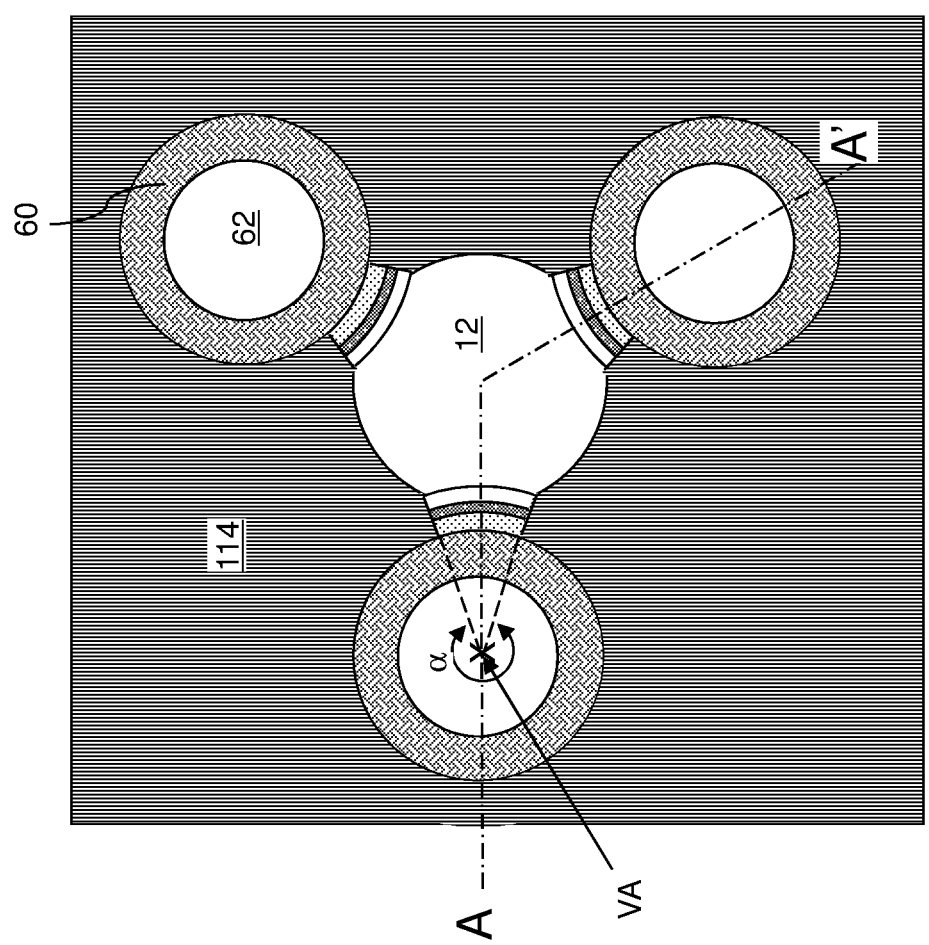
FIG. 22B is a horizontal cross-sectional view along the horizontal plane B-B' of FIG. 22A.

Referring to FIGS. 22A and 22B, a doped semiconductor material having a doping of the second conductivity type can be deposited by a selective semiconductor deposition process. A semiconductor precursor gas, an etchant, and a dopant precursor gas can be flowed concurrently into a process chamber including the exemplary structure during the selective semiconductor deposition process. For example, if the second conductivity type is n-type, a semiconductor precursor gas such as silane, disilane, or dichlorosilane, an etchant gas such as hydrogen chloride, and a dopant precursor gas such as phosphine, arsine, or stibine. The deposited doped semiconductor material forms a source contact layer 114, which can contact sidewalls of the vertical semiconductor channels 60. The duration of the selective semiconductor deposition process can be selected such that the source cavity is filled with the source contact layer 114, and the source contact layer 114 contacts bottom end portions of inner sidewalls of the backside trench spacers 74. Thus, the source contact layer 114 can be formed by selectively depositing a doped semiconductor material from semiconductor surfaces around the source cavity 109. In one embodiment, the doped semiconductor material can include doped polysilicon.

The source contact layer 114 grows from, and is formed directly on, the entire bottom surface 60B of each of the vertical semiconductor channels 60. Further, the source contact layer 114 is formed directly on the lateral contact region of the outer sidewalls 60S of the vertical semiconductor channels 60. In one embodiment shown in FIG. 22B, the lateral contact region has an azimuthal angle α around a vertical axis VA passing through a geometrical center GC of a respective vertical semiconductor channel 60 containing the lateral contact region. The azimuthal angle α can be less than 360 degrees, and may be in a range from 240 degrees to 350 degrees, such as from 270 degrees to 330 degrees. The geometrical center GC refers to the point having a coordinate value that is the average value of all coordinate values of the points of any given vertical semiconductor channel 60 in any Euclidian three-dimensional coordinate system.

The layer stack including the lower source-level material layer 112, the source contact layer 114, and the upper source-level material layer 116 constitutes a buried source layer (112, 114, 116), which function as a common source region that is connected each of the vertical semiconductor channels 60 and has a doping of the second conductivity type. The average dopant concentration in the buried source layer (112, 114, 116) can be in a range from $5.0 \times 10^{19}/cm^3$ to $2.0 \times 10^{21}/cm^3$, although lesser and greater dopant concentrations can also be employed. The set of layers including the buried source layer (112, 114, 116), the source-level insulating layer 117, and the optional source-select-level conductive layer 118 constitutes source-level material layers 10, which replaces the in-process source-level material layers 10'.

Figure 23:
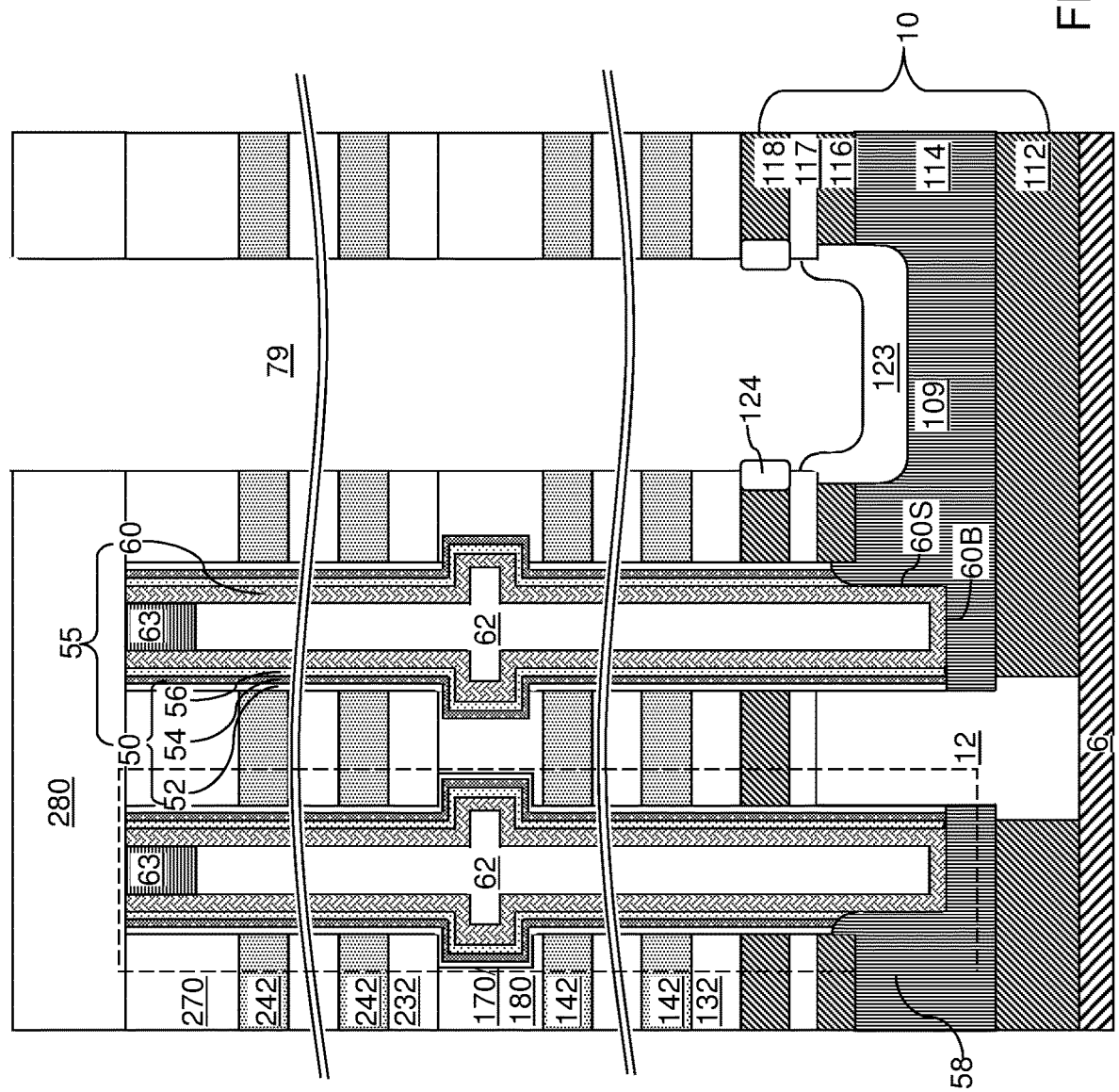
FIG. 23 is a vertical cross-sectional view of the region of FIG. 21A after formation of semiconductor oxide portions according to an embodiment of the present disclosure.

Referring to FIG. 23, an oxidation process can be performed to convert surface portions of the source contact layer 114 and the source-select-level conductive layer 118 into semiconductor oxide portions. For example, a trench bottom semiconductor oxide portion 123 can be formed at the bottom of each backside trench 79 by oxidation of a respective surface portion of the source contact layer 114. A source-select-level semiconductor oxide portion 124 can be formed by oxidation of a respective surface portion of the source-select-level conductive layer 118. The backside trench spacers 74 are subsequently removed by an isotropic etch process selective to the semiconductor oxide portions (123, 124). For example, if the backside trench spacers 74 include silicon nitride, the backside trench spacers 74 can be removed by a wet etch employing hot phosphoric acid.

Figure 24A:
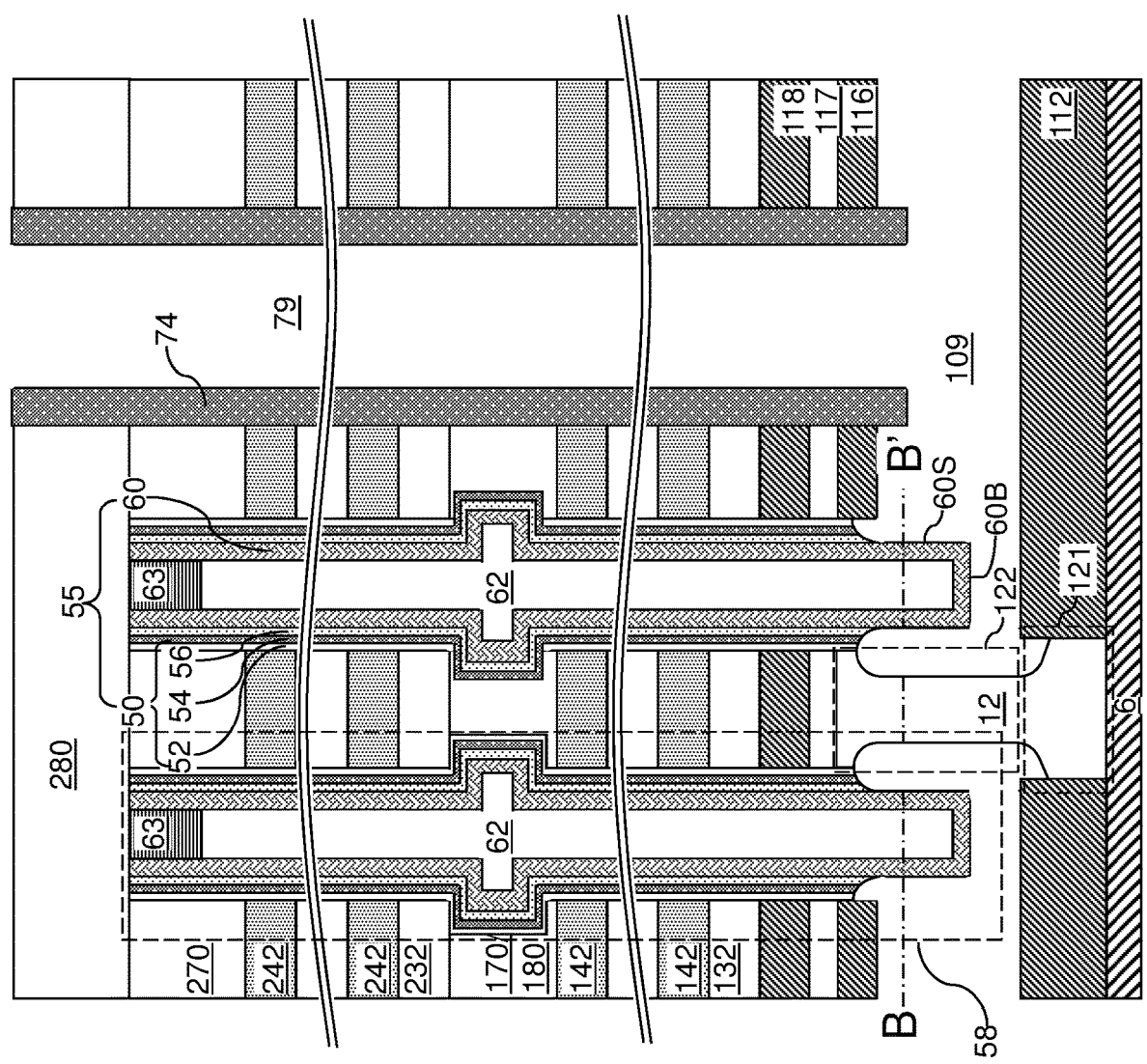
FIG. 24A is a vertical cross-sectional view of an alternative configuration of the region of FIGS. 21A and 21B after removal of physically exposed portions of the memory films according to an embodiment of the present disclosure.
Figure 24B:
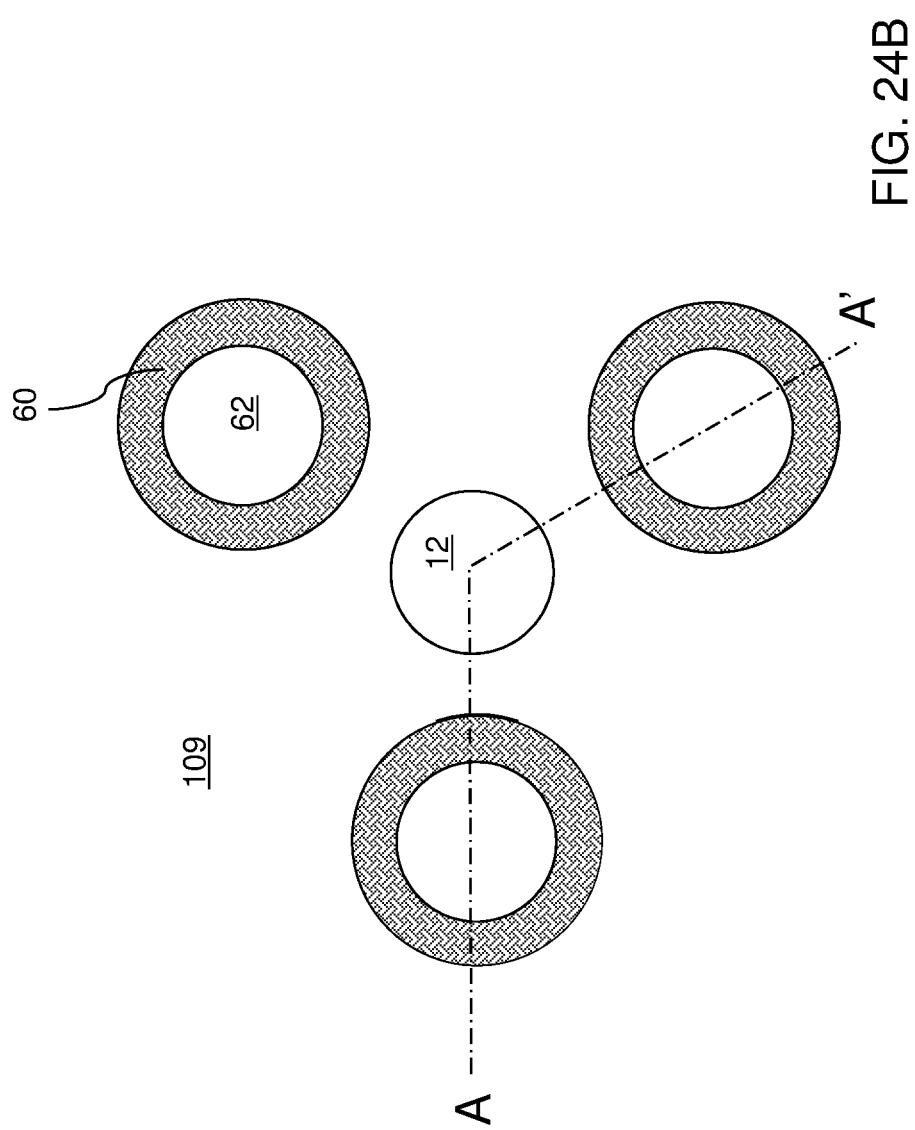
FIG. 24B is a horizontal cross-sectional view along the horizontal plane B-B' of FIG. 24A.

FIGS. 24A and 24B illustrate an alternative configuration of the region of FIG. 20A after removal of physically exposed portions of the memory films 50. In the alternate configuration, the duration of the isotropic etch process that removes the physically exposed portions of the memory films 50 can be prolonged until all portions of the memory films 50 underlying the horizontal plane including the bottom surface of the upper source-level material layer 116 are removed. In this case, the lateral etch distance of the second portion 122 of each memory-region dielectric pillar structure 12 in the alternative configuration can be greater than the lateral etch distance of each memory-region dielectric pillar structure 12 in the configuration of FIGS. 21A and 21B. The entire bottom surface 60B of the vertical semiconductor channel 60 is exposed in the source cavity 109.

Figure 25A:
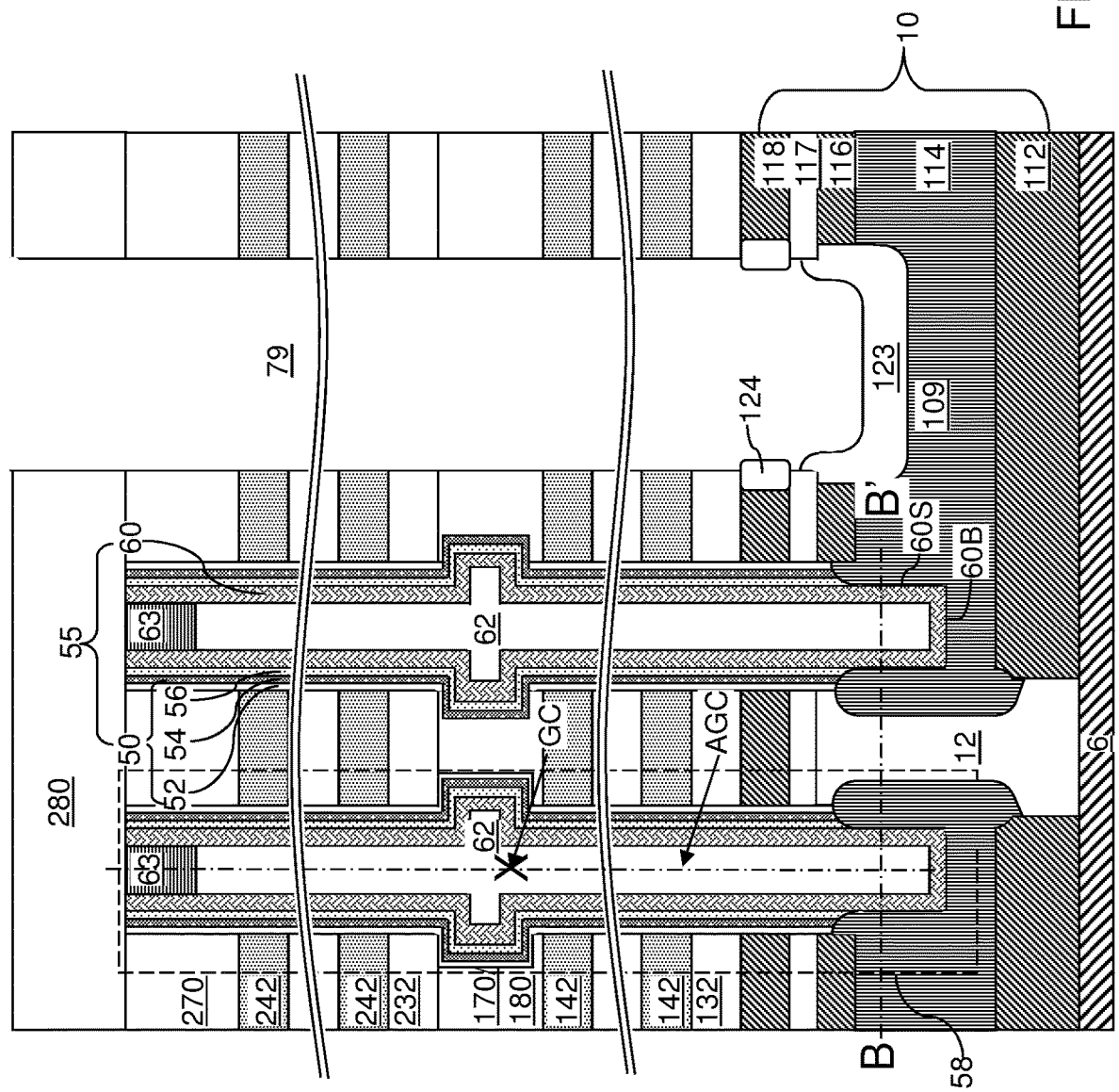
FIG. 25A is a vertical cross-sectional view of the region of FIG. 24A after formation of a source contact layer and semiconductor oxide portions according to an embodiment of the present disclosure.
Figure 25B:
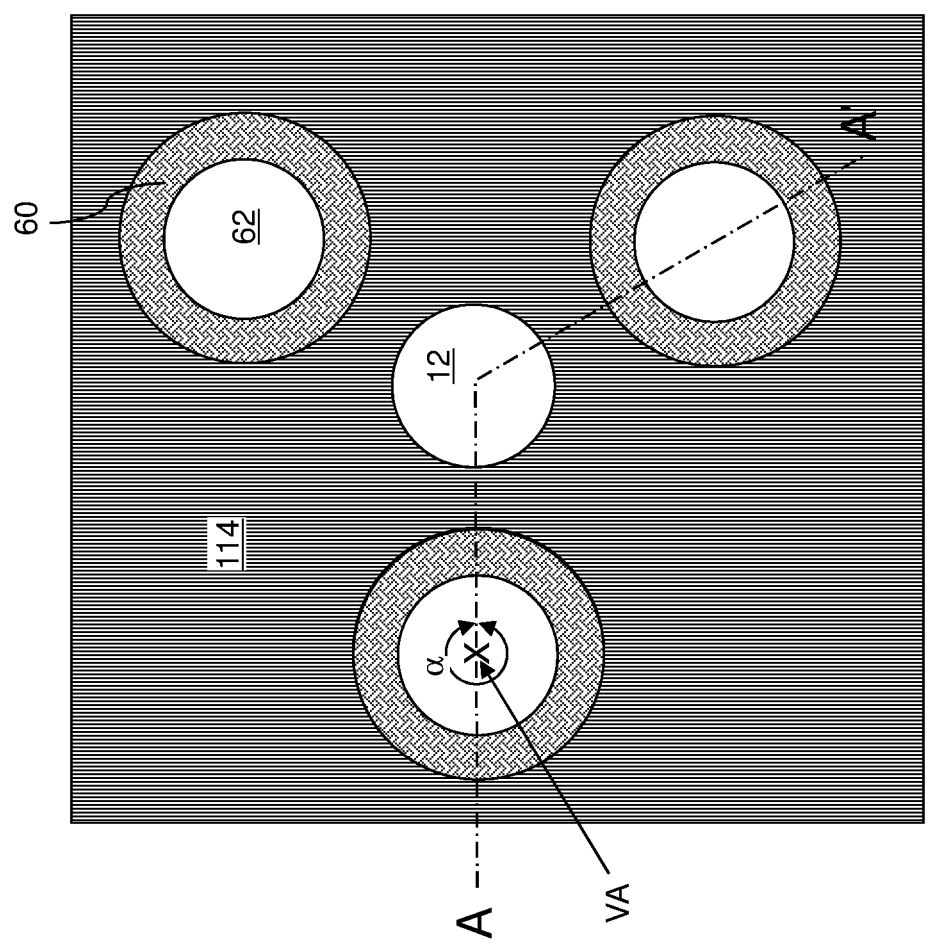
FIG. 25B is a horizontal cross-sectional view along the horizontal plane B-B' of FIG. 25A.

Referring to FIGS. 25A and 25B, the processing steps of FIGS. 22A and 22B and the processing steps of FIGS. 23A and 23B can be subsequently performed. The source contact layer 114 is formed directly on the lateral contact region of each vertical semiconductor channel 60. In this case, the lateral contact region includes the entire cylindrical surface of the outer sidewall 60S and the entire bottom surface 60B of a respective vertical semiconductor channel 60. In other words, the lateral contact region has an azimuthal angle α of 360 degrees around a vertical axis VA passing through a geometrical center GC of a respective vertical semiconductor channel 60 containing the lateral contact region. The backside trench spacers 74 are subsequently removed by an isotropic etch process selective to the semiconductor oxide portions (123, 124). For example, if the backside trench spacers 74 include silicon nitride, the backside trench spacers 74 can be removed by a wet etch employing hot phosphoric acid.

Figure 26:
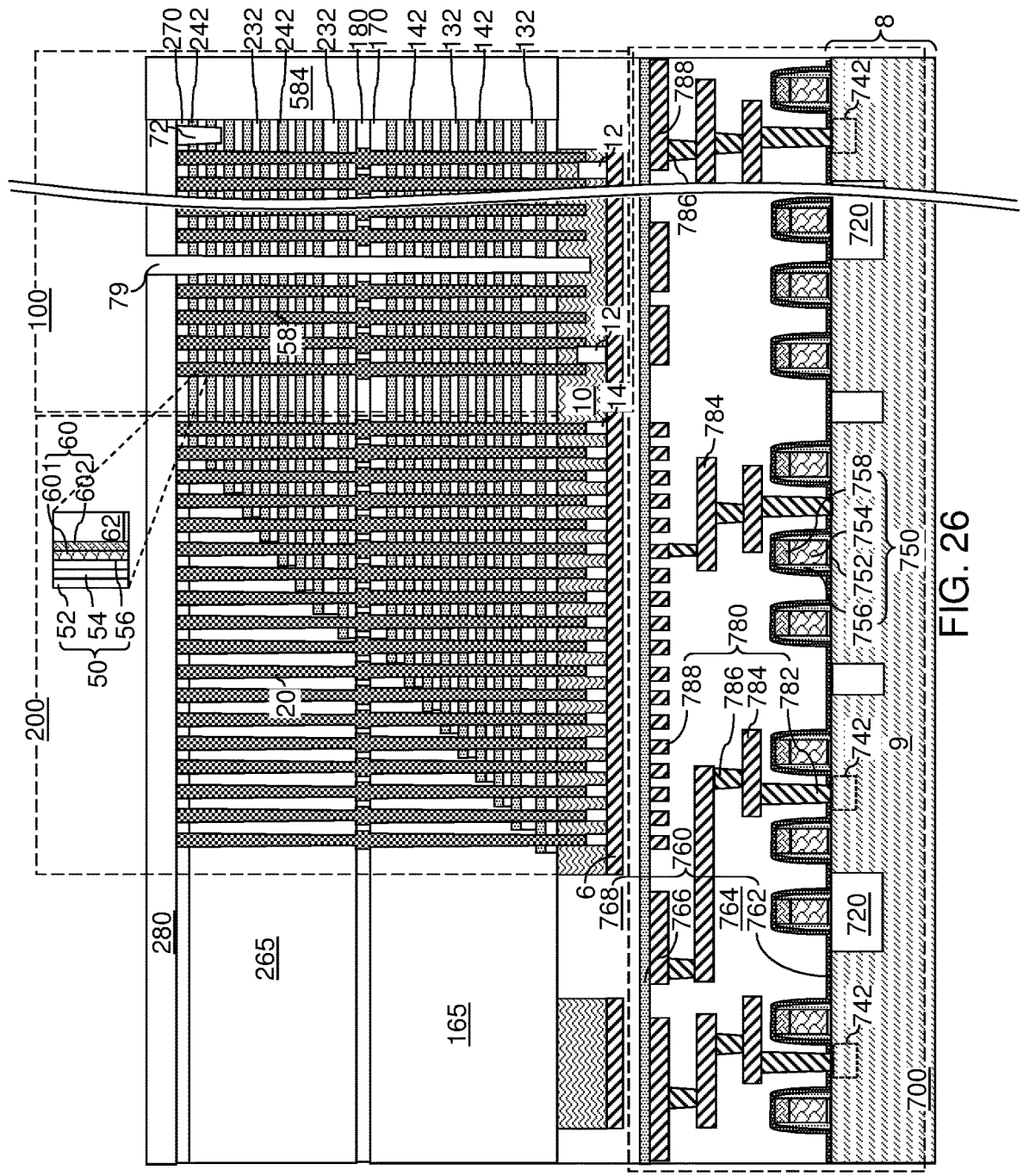
FIG. 26 is a vertical cross-sectional view of the exemplary structure after formation of source-level material layers according to an embodiment of the present disclosure.

Referring to FIG. 26, the exemplary structure is illustrated after the processing steps of FIGS. 23A and 23B or after the processing steps of FIGS. 25A and 25B. The in-process source-level material layers 10' illustrated in FIG. 18 is replaced with source-level material layer 10.

Figure 27:
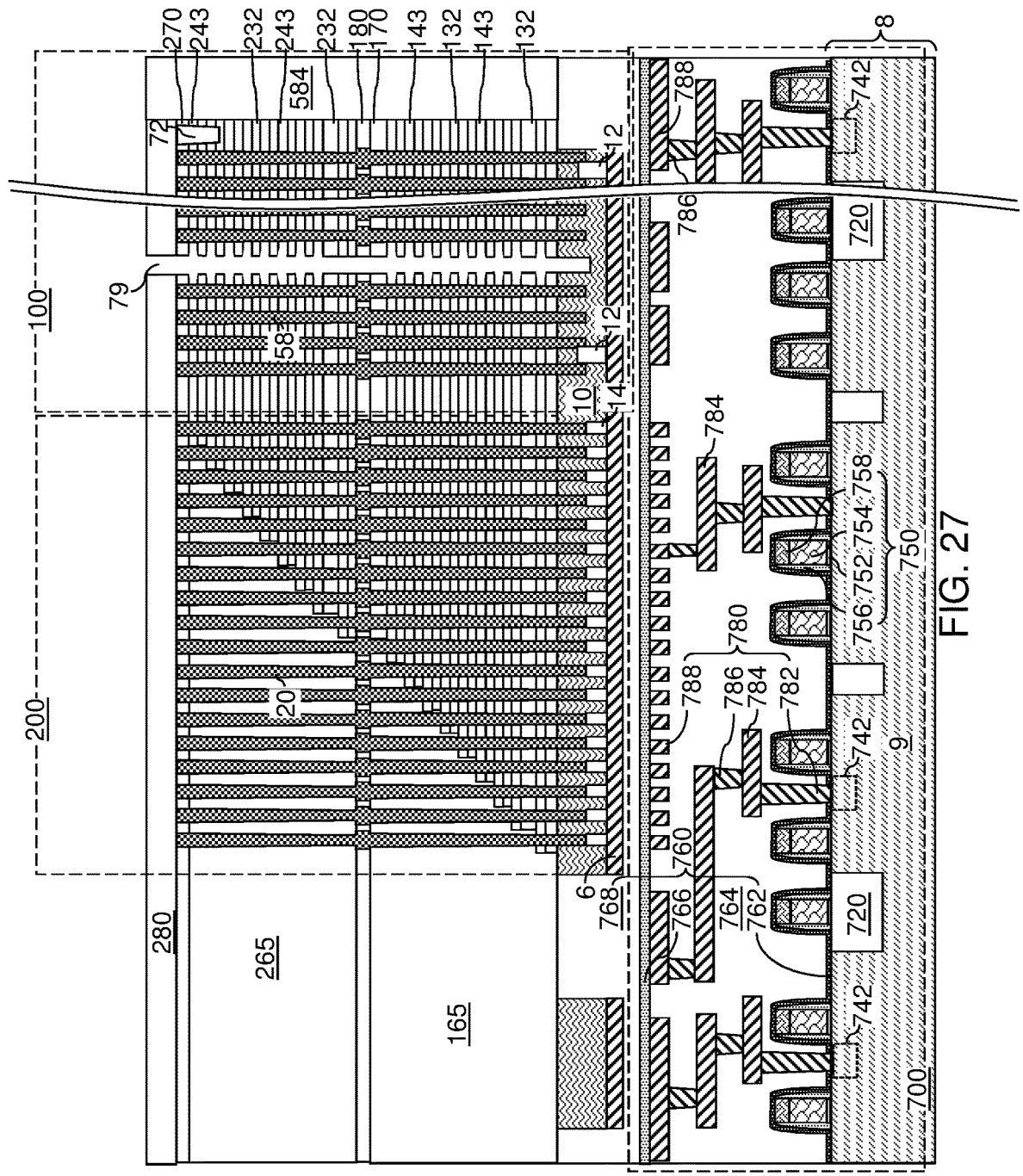
FIG. 27 is a vertical cross-sectional view of the exemplary structure after formation of backside recesses according to an embodiment of the present disclosure.

Referring to FIG. 27, an etchant that selectively etches the materials of the first and second sacrificial material layers (142, 242) with respect to the materials of the first and second insulating layers (132, 232), the first and second retro-stepped dielectric material portions (165, 265), and the material of the outermost layer of the memory films 50 can be introduced into the backside trenches 79, for example, employing an isotropic etch process. For example, the first and second sacrificial material layers (142, 242) can include silicon nitride, the materials of the first and second insulating layers (132, 232), the first and second insulating cap layers (170, 270), the first and second retro-stepped dielectric material portions (165, 265), and the material of the outermost layer of the memory films 50 can include silicon oxide materials. First backside recesses 143 are formed in volumes from which the first sacrificial material layers 142 are removed. Second backside recesses 243 are formed in volumes from which the second sacrificial material layers 242 are removed.

The isotropic etch process can be a wet etch process employing a wet etch solution, or can be a gas phase (dry) etch process in which the etchant is introduced in a vapor phase into the backside trenches 79. For example, if the first and second sacrificial material layers (142, 242) include silicon nitride, the etch process can be a wet etch process in which the first exemplary structure is immersed within a wet etch tank including phosphoric acid, which etches silicon nitride selective to silicon oxide, silicon, and various other materials employed in the art. In case the sacrificial material layers (142, 242) comprise a semiconductor material, a wet etch process (which may employ a wet etchant such as a KOH solution) or a dry etch process (which may include gas phase HCl) may be employed.

Each of the first and second backside recesses (143, 243) can be a laterally extending cavity having a lateral dimension that is greater than the vertical extent of the cavity. In other words, the lateral dimension of each of the first and second backside recesses (143, 243) can be greater than the height of the respective backside recess (143, 243). A plurality of first backside recesses 143 can be formed in the volumes from which the material of the first sacrificial material layers 142 is removed. A plurality of second backside recesses 243 can be formed in the volumes from which the material of the second sacrificial material layers 242 is removed. Each of the first and second backside recesses (143, 243) can extend substantially parallel to the top surface of the substrate 8. A backside recess (143, 243) can be vertically bounded by a top surface of an underlying insulating layer (132 or 232) and a bottom surface of an overlying insulating layer (132 or 232). In one embodiment, each of the first and second backside recesses (243, 243) can have a uniform height throughout.

Figure 28:
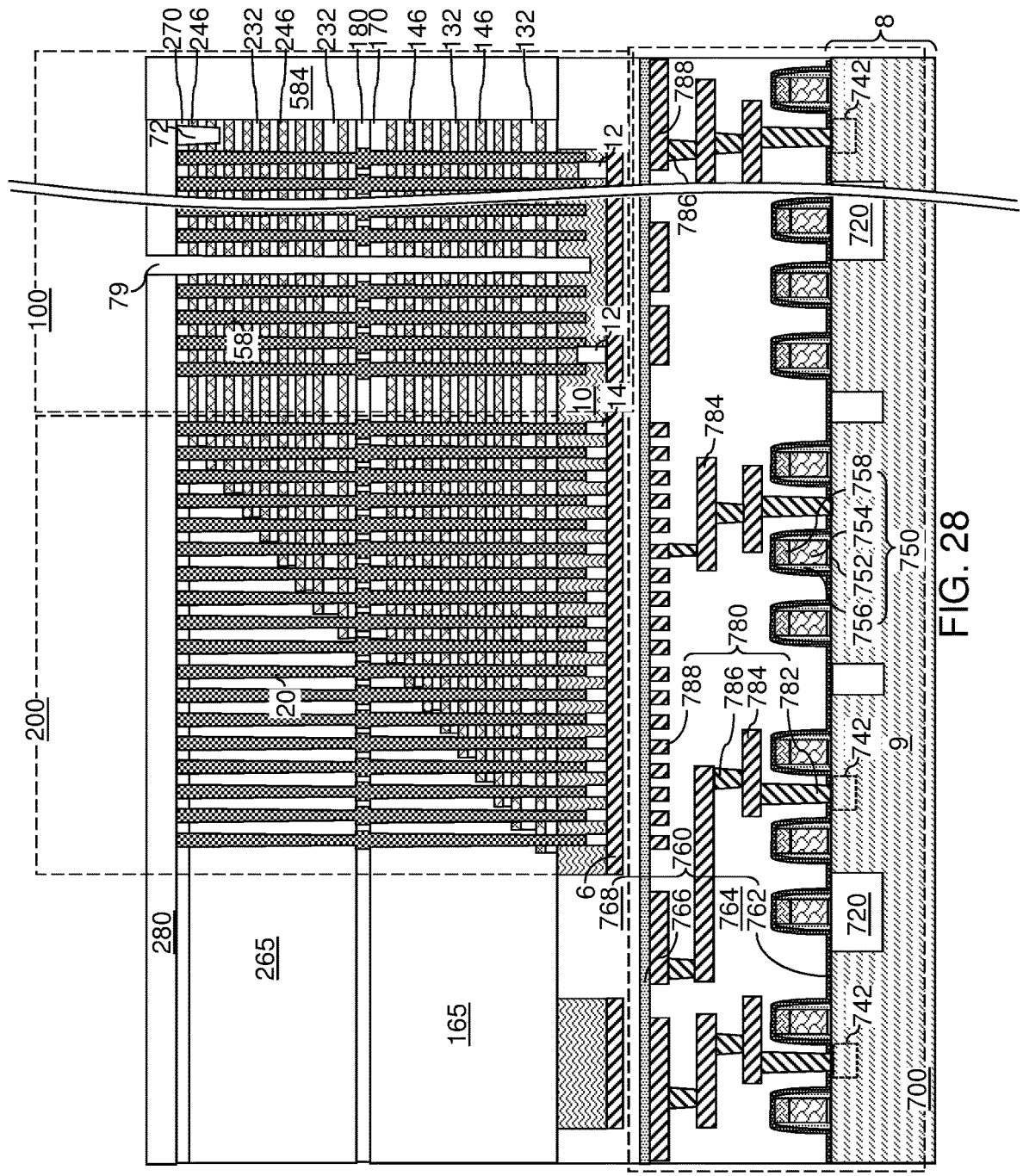
FIG. 28 is a vertical cross-sectional view of the exemplary structure after formation of electrically conductive layers in the backside recesses according to an embodiment of the present disclosure.
Figure 29A:
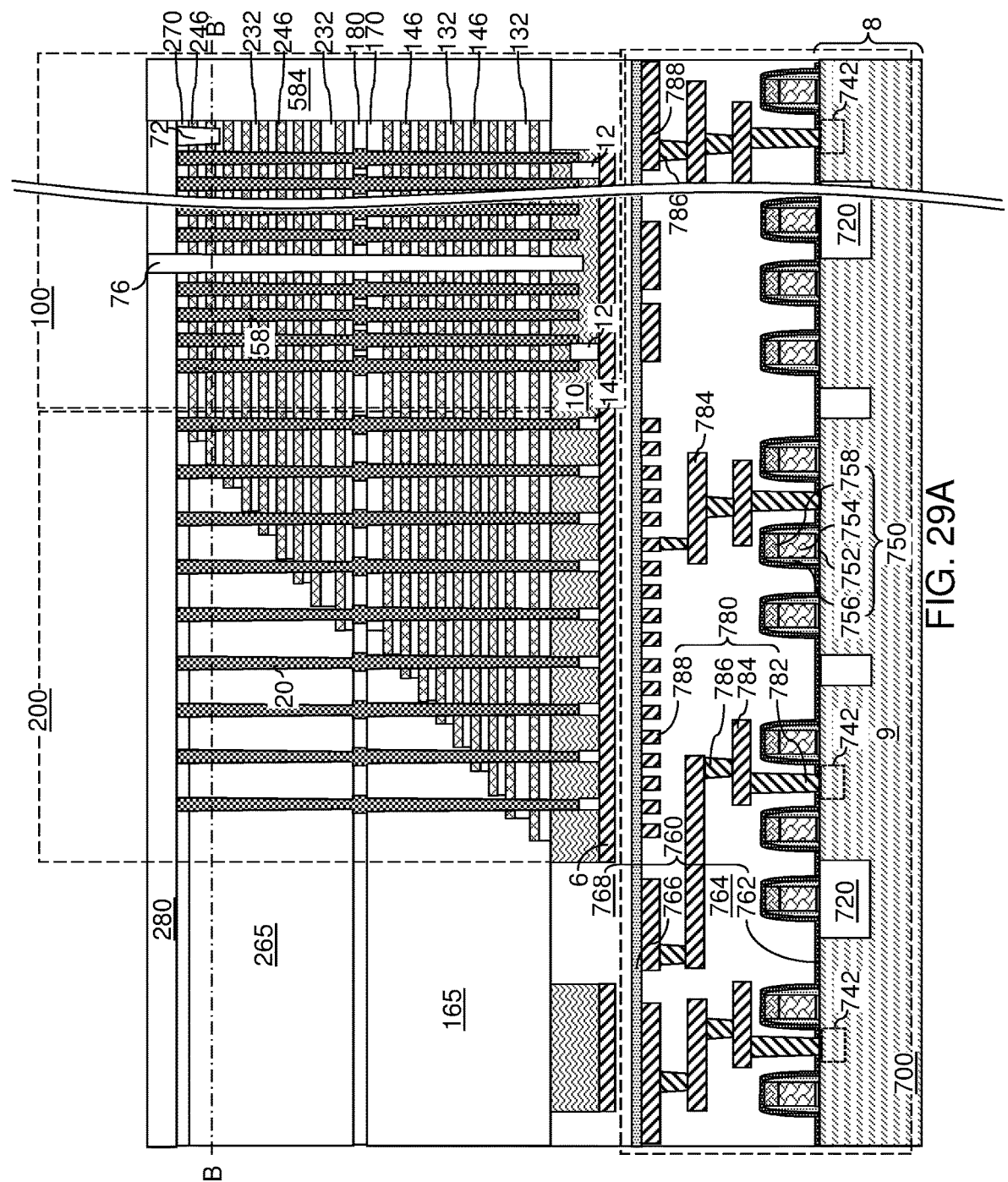
FIG. 29A is a vertical cross-sectional view of the exemplary structure after formation of dielectric wall structures in the backside trenches according to an embodiment of the present disclosure.
Figure 29B:
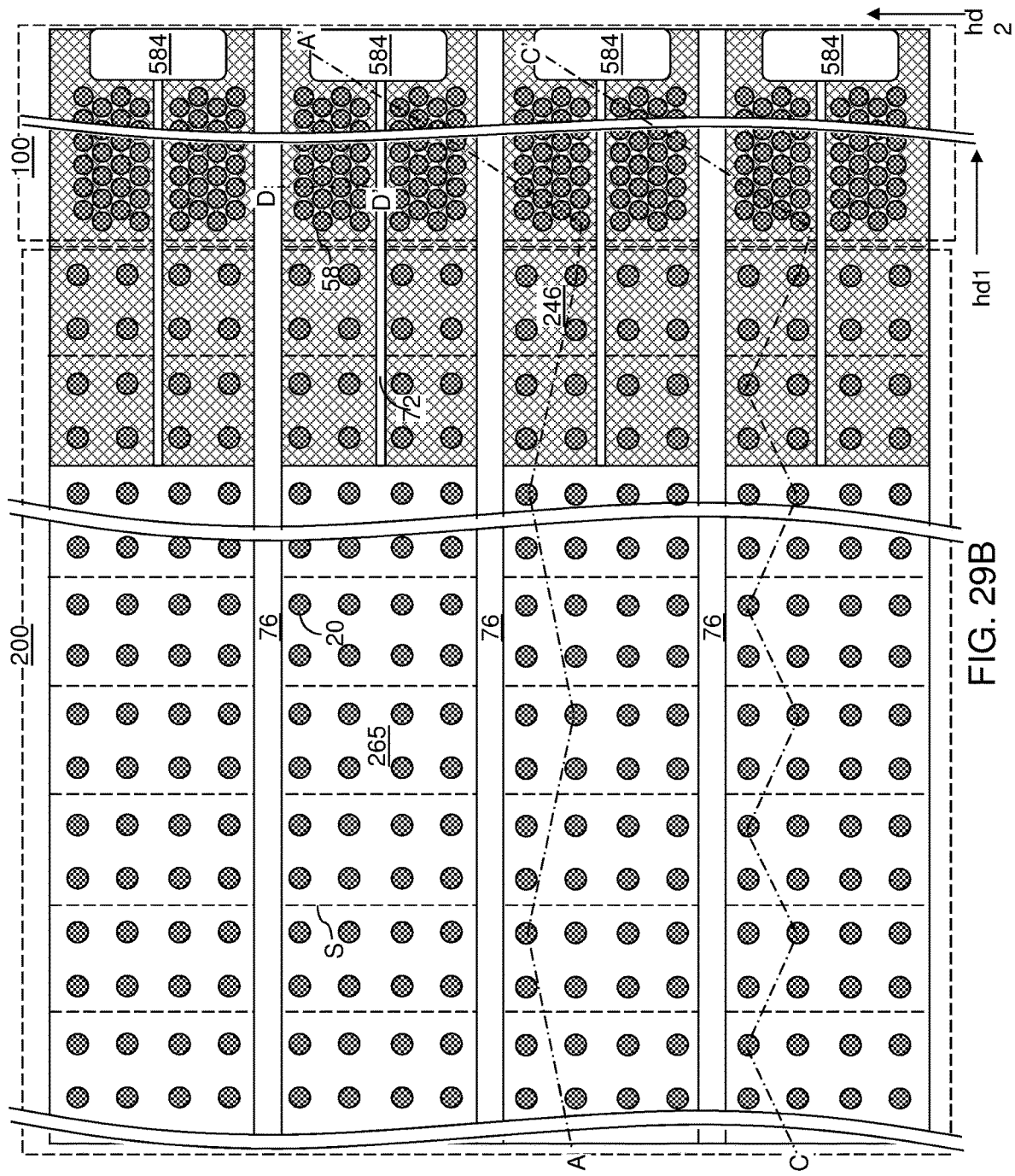
FIG. 29B is a horizontal cross-sectional of the exemplary structure along the vertical plane B-B' of FIG. 29A. The zig-zag vertical plane A-A' corresponds to the plane of the vertical cross-sectional view of FIG. 29A.
Figure 29C:
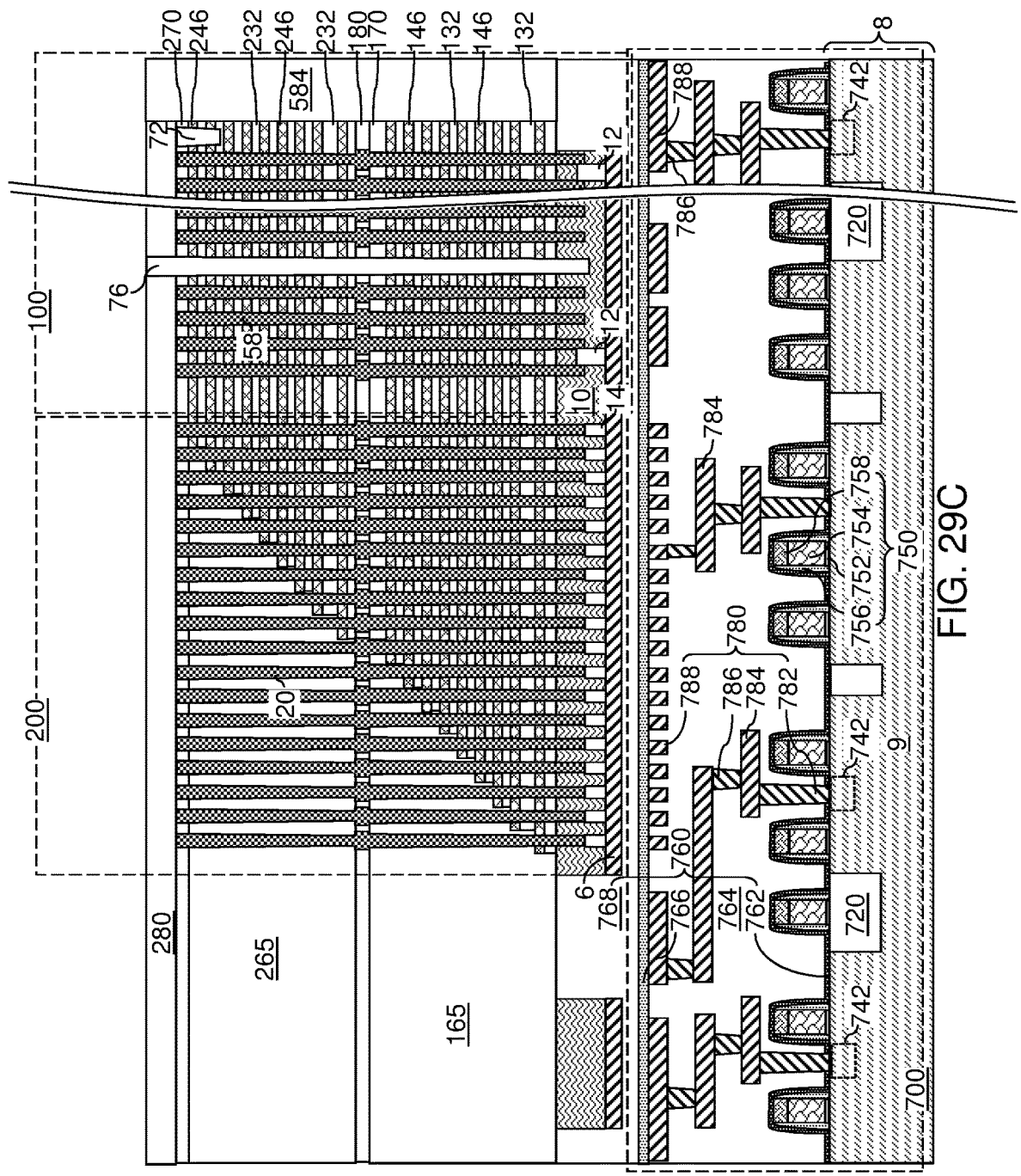
FIG. 29C is a vertical cross-sectional view of the exemplary structure along the zig-zag vertical plane C-C' of FIG. 29B.
Figure 29D:
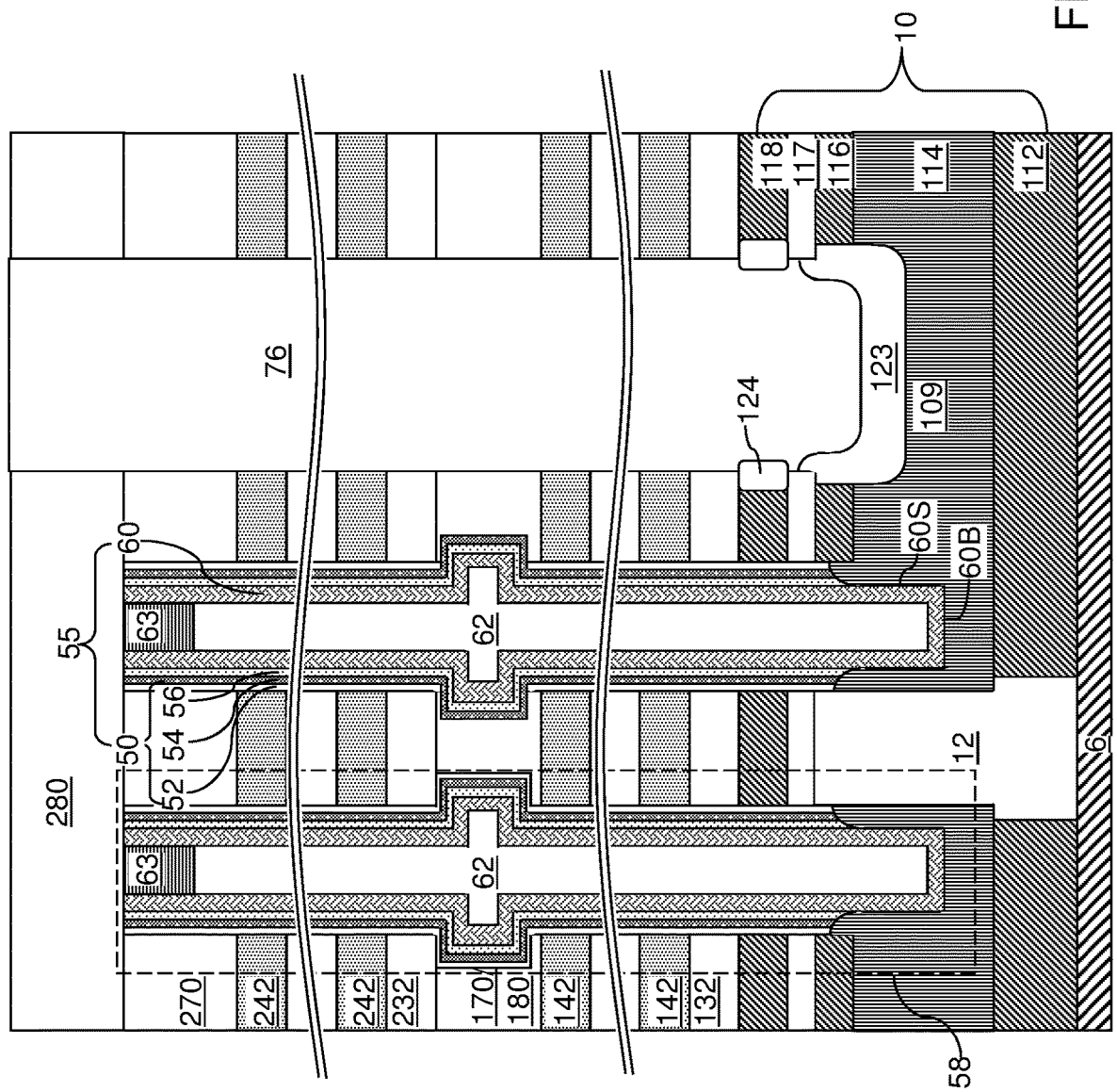
FIG. 29D is a vertical cross-sectional view of a region of the exemplary structure along the vertical plane D-D' of FIG. 29B.

Referring to FIG. 28, a backside blocking dielectric layer (not shown) can be optionally deposited in the backside recesses and the backside trenches 79 and over the first contact level dielectric layer 280. The backside blocking dielectric layer can be deposited on the physically exposed portions of the outer surfaces of the memory stack structures 55, which are portions of the memory opening fill structures 58. The backside blocking dielectric layer includes a dielectric material such as a dielectric metal oxide, silicon oxide, or a combination thereof. If employed, the backside blocking dielectric layer can be formed by a conformal deposition process such as atomic layer deposition or chemical vapor deposition. The thickness of the backside blocking dielectric layer can be in a range from 1 nm to 60 nm, although lesser and greater thicknesses can also be employed.

At least one conductive material can be deposited in the plurality of backside recesses (243, 243), on the sidewalls of the backside trench 79, and over the first contact level dielectric layer 280. The at least one conductive material can include at least one metallic material, i.e., an electrically conductive material that includes at least one metallic element.

A plurality of first electrically conductive layers 146 can be formed in the plurality of first backside recesses 143, a plurality of second electrically conductive layers 246 can be formed in the plurality of second backside recesses 243, and a continuous metallic material layer (not shown) can be formed on the sidewalls of each backside trench 79 and over the first contact level dielectric layer 280. Thus, the first and second sacrificial material layers (142, 242) can be replaced with the first and second conductive material layers (146, 246), respectively. Specifically, each first sacrificial material layer 142 can be replaced with an optional portion of the backside blocking dielectric layer and a first electrically conductive layer 146, and each second sacrificial material layer 242 can be replaced with an optional portion of the backside blocking dielectric layer and a second electrically conductive layer 246. A backside cavity is present in the portion of each backside trench 79 that is not filled with the continuous metallic material layer.

The metallic material can be deposited by a conformal deposition method, which can be, for example, chemical vapor deposition (CVD), atomic layer deposition (ALD), electroless plating, electroplating, or a combination thereof. The metallic material can be an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof. Non-limiting exemplary metallic materials that can be deposited in the backside recesses include tungsten, tungsten nitride, titanium, titanium nitride, tantalum, tantalum nitride, cobalt, and ruthenium. In one embodiment, the metallic material can comprise a metal such as tungsten and/or metal nitride. In one embodiment, the metallic material for filling the backside recesses can be a combination of titanium nitride layer and a tungsten fill material. In one embodiment, the metallic material can be deposited by chemical vapor deposition or atomic layer deposition.

Residual conductive material can be removed from inside the backside trenches 79. Specifically, the deposited metallic material of the continuous metallic material layer can be etched back from the sidewalls of each backside trench 79 and from above the first contact level dielectric layer 280, for example, by an anisotropic or isotropic etch. Each remaining portion of the deposited metallic material in the first backside recesses constitutes a first electrically conductive layer 146. Each remaining portion of the deposited metallic material in the second backside recesses constitutes a second electrically conductive layer 246. Each electrically conductive layer (146, 246) can be a conductive line structure.

A subset of the second electrically conductive layers 246 located at the levels of the drain-select-level isolation structures 72 constitutes drain select gate electrodes. A subset of the electrically conductive layer (146, 246) located underneath the drain select gate electrodes can function as combinations of a control gate and a word line located at the same level. The control gate electrodes within each electrically conductive layer (146, 246) are the control gate electrodes for a vertical memory device including the memory stack structure 55.

Each of the memory stack structures 55 comprises a vertical stack of memory elements located at each level of the electrically conductive layers (146, 246). A subset of the electrically conductive layers (146, 246) can comprise word lines for the memory elements. The semiconductor devices in the underlying peripheral device region 700 can comprise word line switch devices configured to control a bias voltage to respective word lines. The memory-level assembly includes all structures located above the topmost surface of the lower-level metal interconnect structures 780, and is located over, and is vertically spaced from, the substrate semiconductor layer 9. The memory-level assembly includes at least one alternating stack (132, 146, 232, 246) and memory stack structures 55 vertically extending through the at least one alternating stack (132, 146, 232, 246). Each of the at least one an alternating stack (132, 146, 232, 246) includes alternating layers of respective insulating layers (132 or 232) and respective electrically conductive layers (146 or 246). The at least one alternating stack (132, 146, 232, 246) comprises staircase regions that include terraces in which each underlying electrically conductive layer (146, 246) extends farther along the first horizontal direction hd1 than any overlying electrically conductive layer (146, 246) in the memory-level assembly.

Referring to FIGS. 29A-29D, an insulating material can be deposited in the backside trenches 79 by a conformal deposition process. Excess portions of the insulating material deposited over the top surface of the first contact level dielectric layer 280 can be removed by a planarization process such as a recess etch or a chemical mechanical planarization (CMP) process. Each remaining portion of the insulating material in the backside trenches 79 constitutes a dielectric wall structure 76. The dielectric wall structures 76 include an insulating material such as silicon oxide, silicon nitride, and/or a dielectric metal oxide. Each dielectric wall structure 76 can vertically extend through first alternating stacks (132, 146) of first insulating layers 132 and first electrically conductive layers 146 and second alternating stacks (232, 246) of second insulating layers 232 and second electrically conductive layers 246, and laterally extends along the first horizontal direction hd1 and are laterally spaced apart among one another along the second horizontal direction hd2.

Figure 30A:
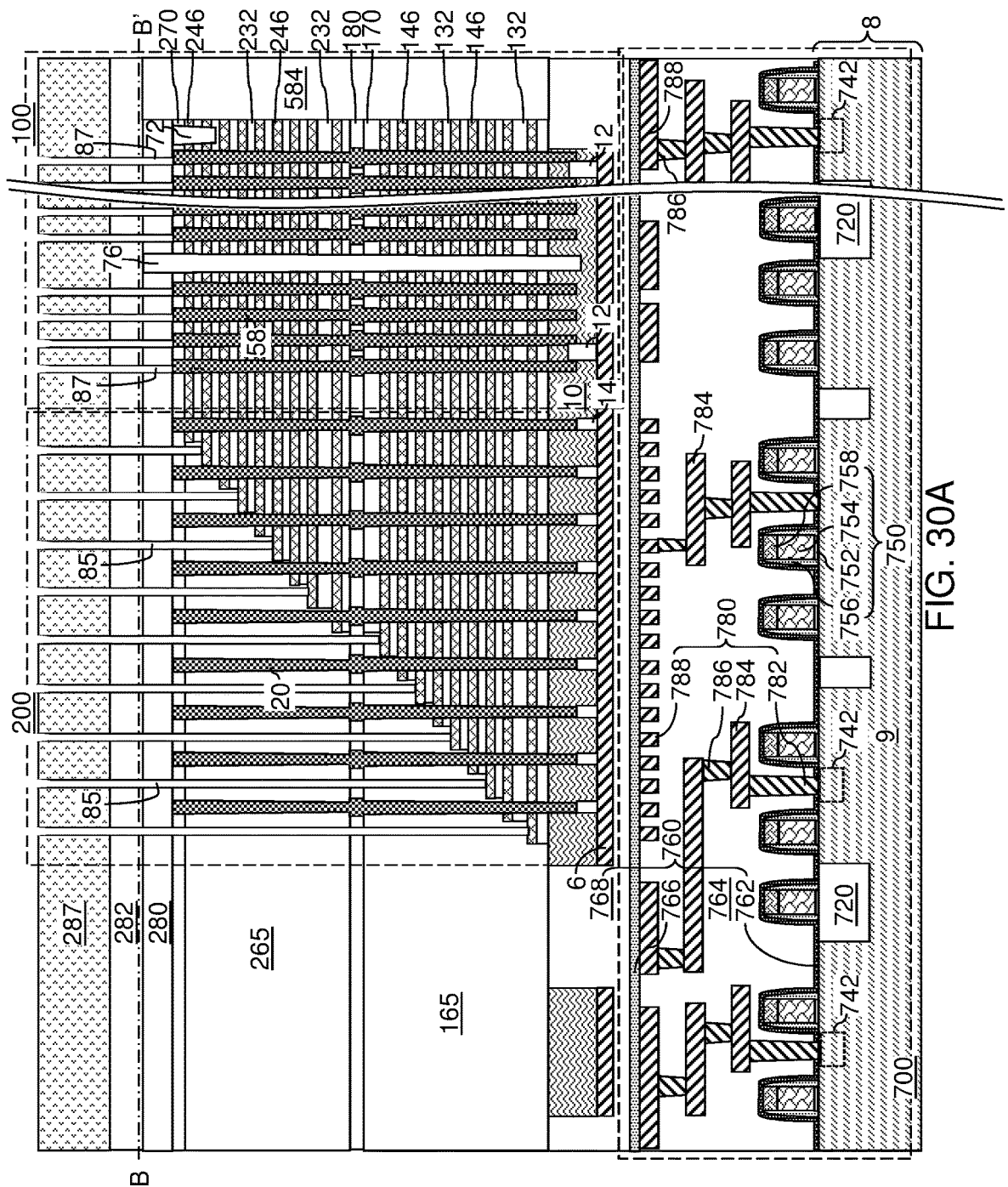
FIG. 30A is a vertical cross-sectional view of the exemplary structure after formation of drain contact via cavities and staircase-region contact via cavities according to an embodiment of the present disclosure.
Figure 30B:
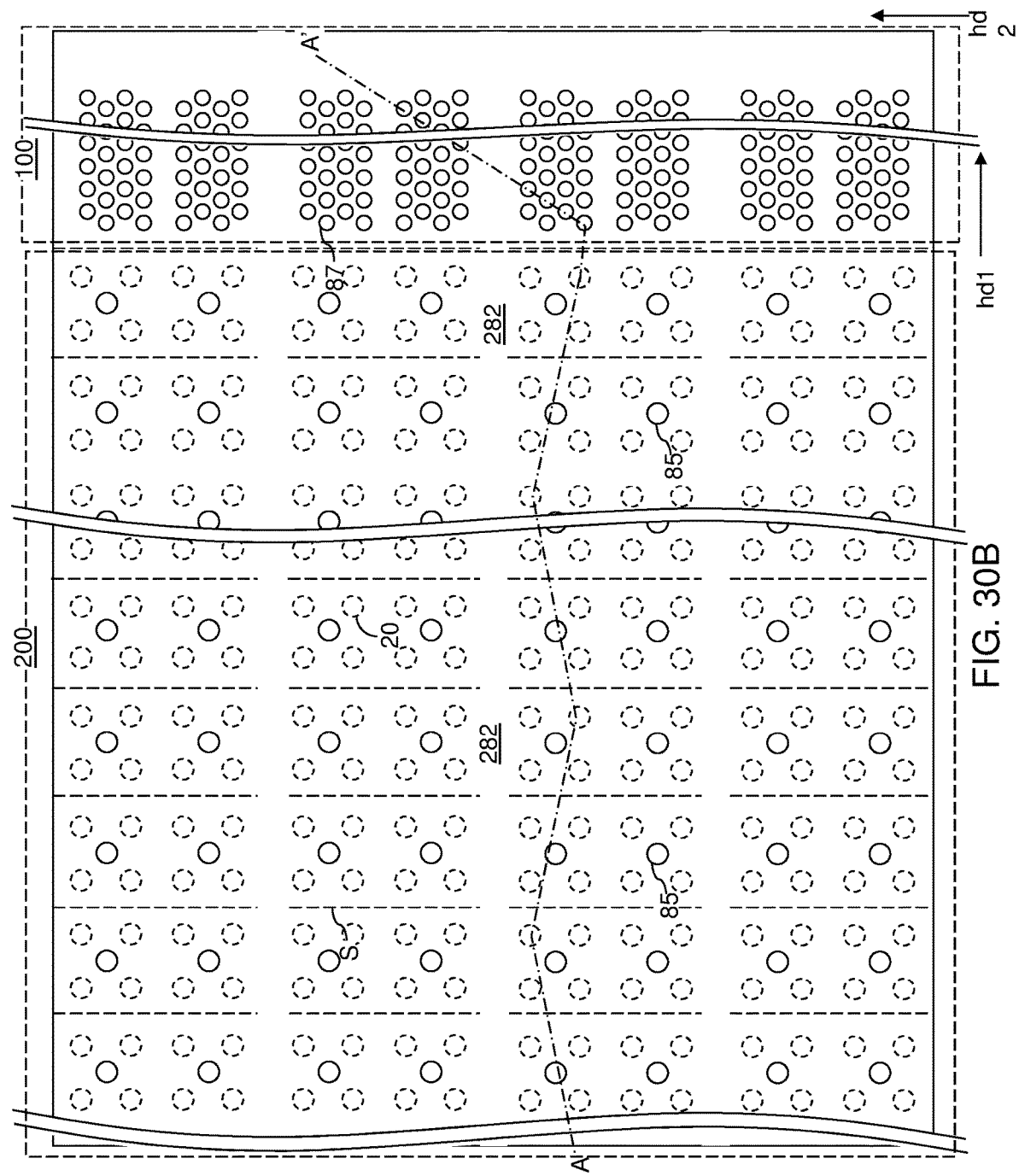
FIG. 30B is a horizontal cross-sectional view of the exemplary structure of FIG. 30A. The zig-zag vertical plane A-A' corresponds to the plane of the vertical cross-sectional view of FIG. 30A.

Referring to FIGS. 30A and 30B, a second contact level dielectric layer 282 may be formed over the first contact level dielectric layer 280. The second contact level dielectric layer 282 includes a dielectric material such as silicon oxide, and can have a thickness in a range from 100 nm to 600 nm, although lesser and greater thicknesses can also be employed.

A photoresist layer 287 can be applied over the second contact level dielectric layer 282, and can be lithographically patterned to form various contact via openings. For example, openings for forming drain contact via structures can be formed in the memory array region 100, and openings for forming staircase region contact via structures can be formed in the staircase region 200. An anisotropic etch process is performed to transfer the pattern in the photoresist layer through the second and first contact level dielectric layers (282, 280) and underlying dielectric material portions. The drain regions 63 and the electrically conductive layers (146, 246) can be employed as etch stop structures. Drain contact via cavities 87 can be formed over each drain region 63, and staircase-region contact via cavities 85 can be formed over each electrically conductive layer (146. 246) at the stepped surfaces underlying the first and second retro-stepped dielectric material portions (165, 265). The photoresist layer 287 can be subsequently removed, for example, by ashing.

Figure 31A:
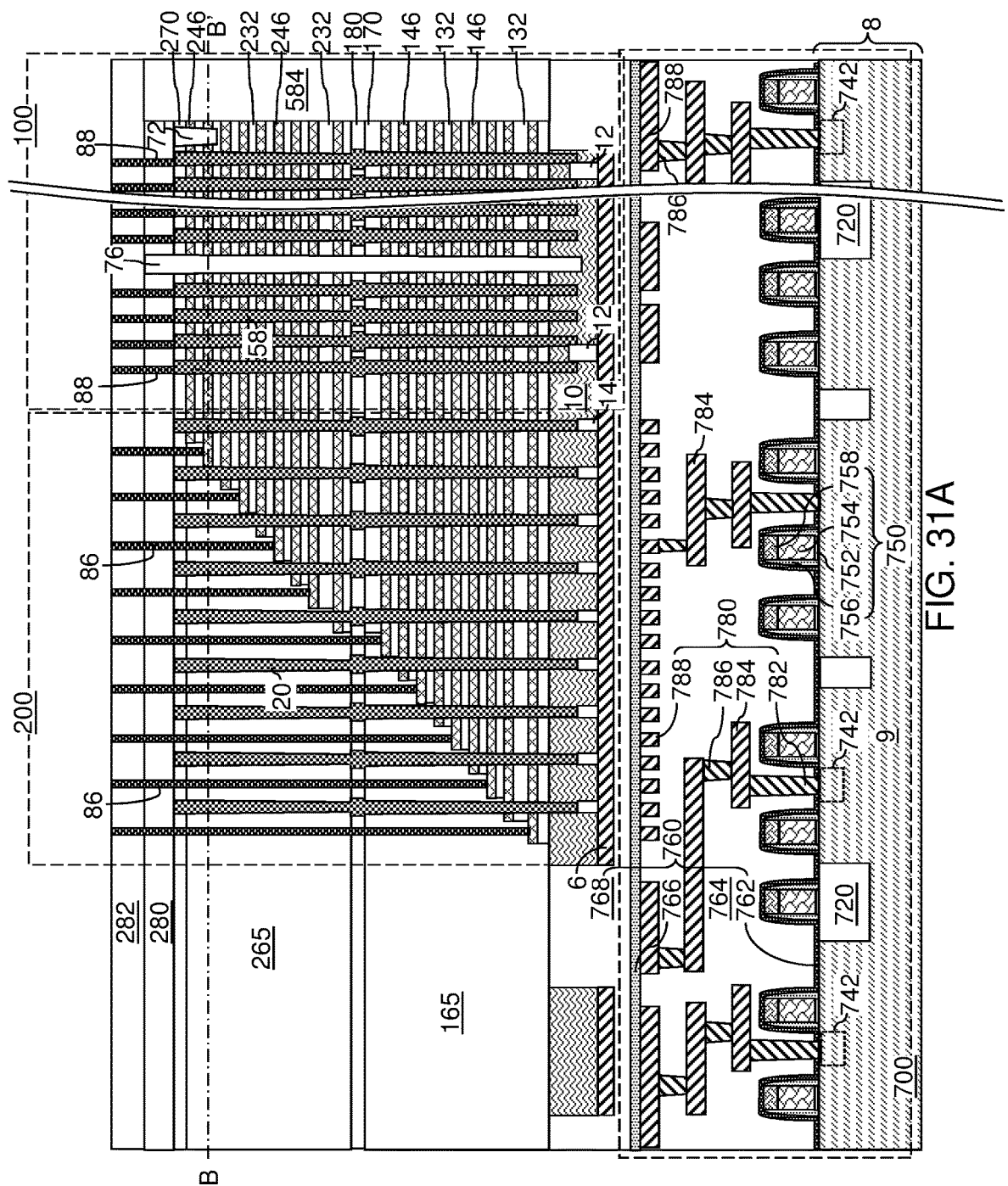
FIG. 31A is a vertical cross-sectional view of the exemplary structure after formation of drain contact via structures and staircase-region contact via structures according to an embodiment of the present disclosure.
Figure 31B:
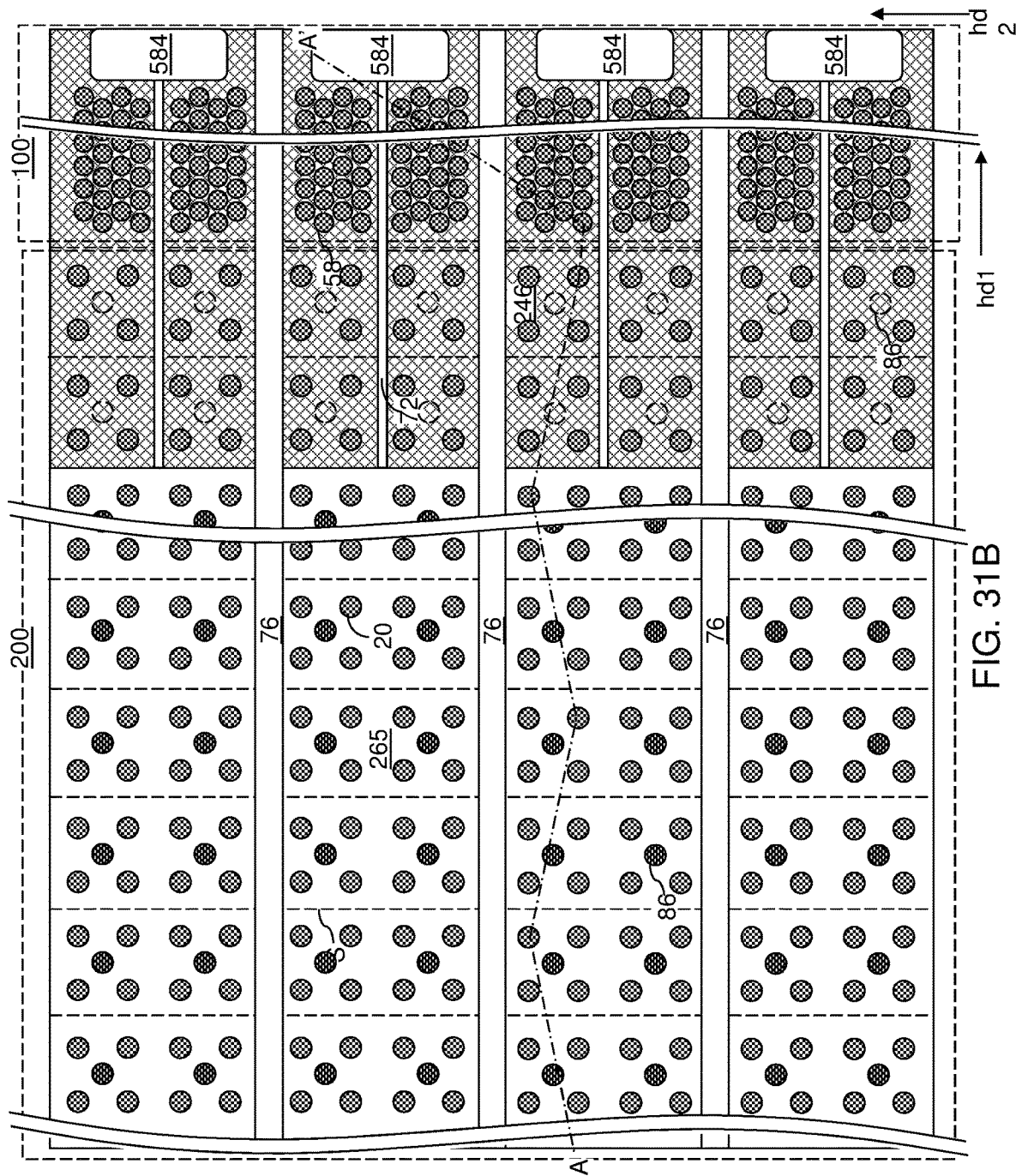
FIG. 31B is a horizontal cross-sectional view of the exemplary structure of FIG. 31A. The zig-zag vertical plane A-A' corresponds to the plane of the vertical cross-sectional view of FIG. 31A.

Referring to FIGS. 31A and 31B, drain contact via structures 88 are formed in the drain contact via cavities 87 and on a top surface of a respective one of the drain regions 63. Staircase-region contact via structures 86 are formed in the staircase-region contact via cavities 85 and on a top surface of a respective one of the electrically conductive strips (146, 246). The staircase-region contact via structures 86 can include drain select level contact via structures that contact a subset of the second electrically conductive strips 246 that function as drain select level gate electrodes. Further, the staircase-region contact via structures 86 can include word line contact via structures that contact electrically conductive strips (146, 246) that underlie the drain select level gate electrodes and function as word lines for the memory stack structures 55.

Figure 32:
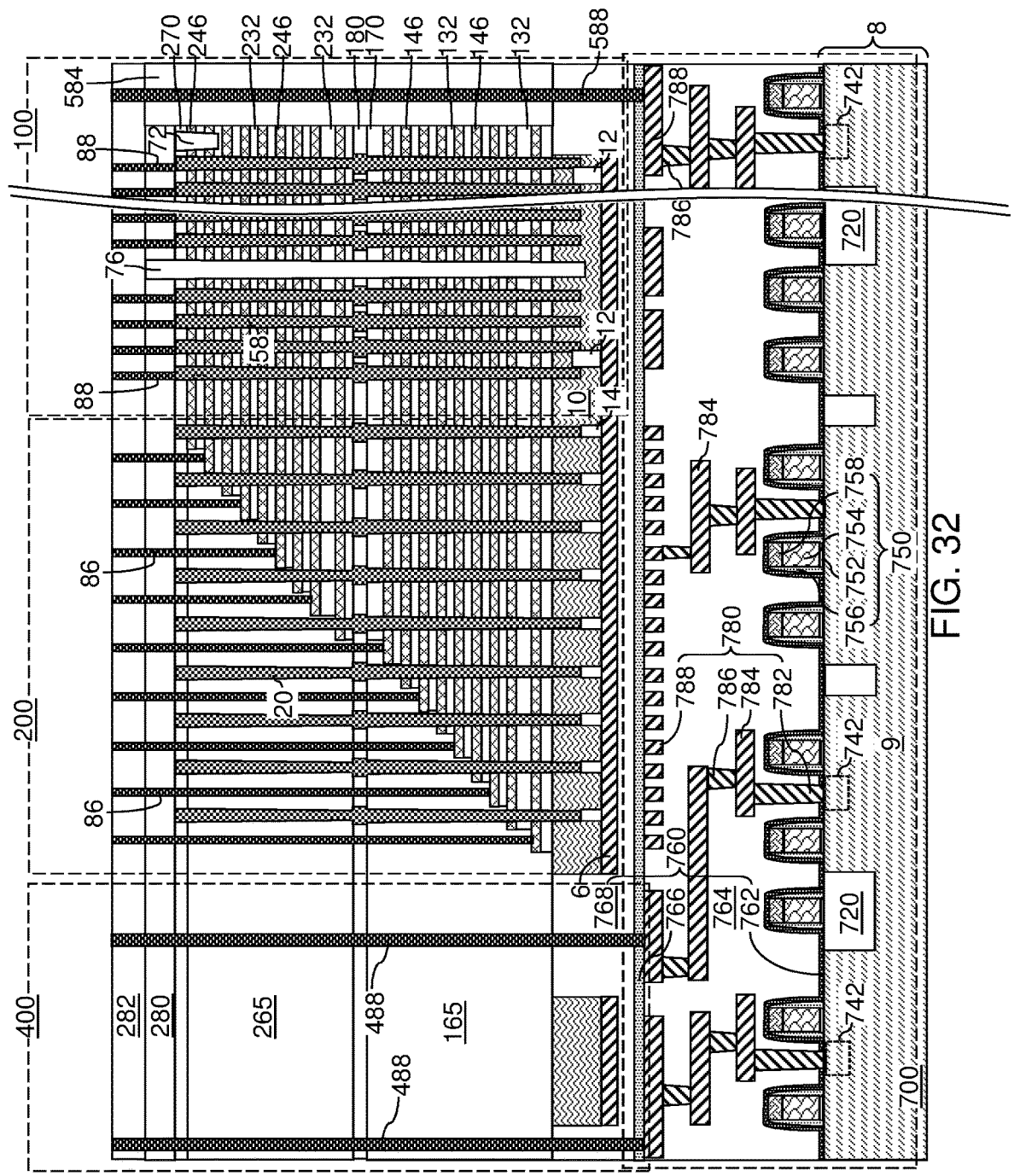
FIG. 32 is a vertical cross-sectional view of the exemplary structure after formation of through-memory-level contact via structures according to an embodiment of the present disclosure.

Referring to FIG. 32, peripheral-region via cavities can be formed through the second and first contact level dielectric layers (282, 280), the second and first retro-stepped dielectric material portions (265, 165), and the at least one second dielectric layer 768 to top surfaces of the lower metal interconnect structure 780 in the peripheral region 400. Array-region via cavities can be formed through the second contact level dielectric layer 282 and the dielectric fill structures 584 to top surfaces of the lower metal interconnect structure 780 in the memory array region 100. At least one conductive material can be deposited in the peripheral-region via cavities and the array-region via cavities to form peripheral-region contact via structures 488 and array-region contact via structures 588.

Figure 33:
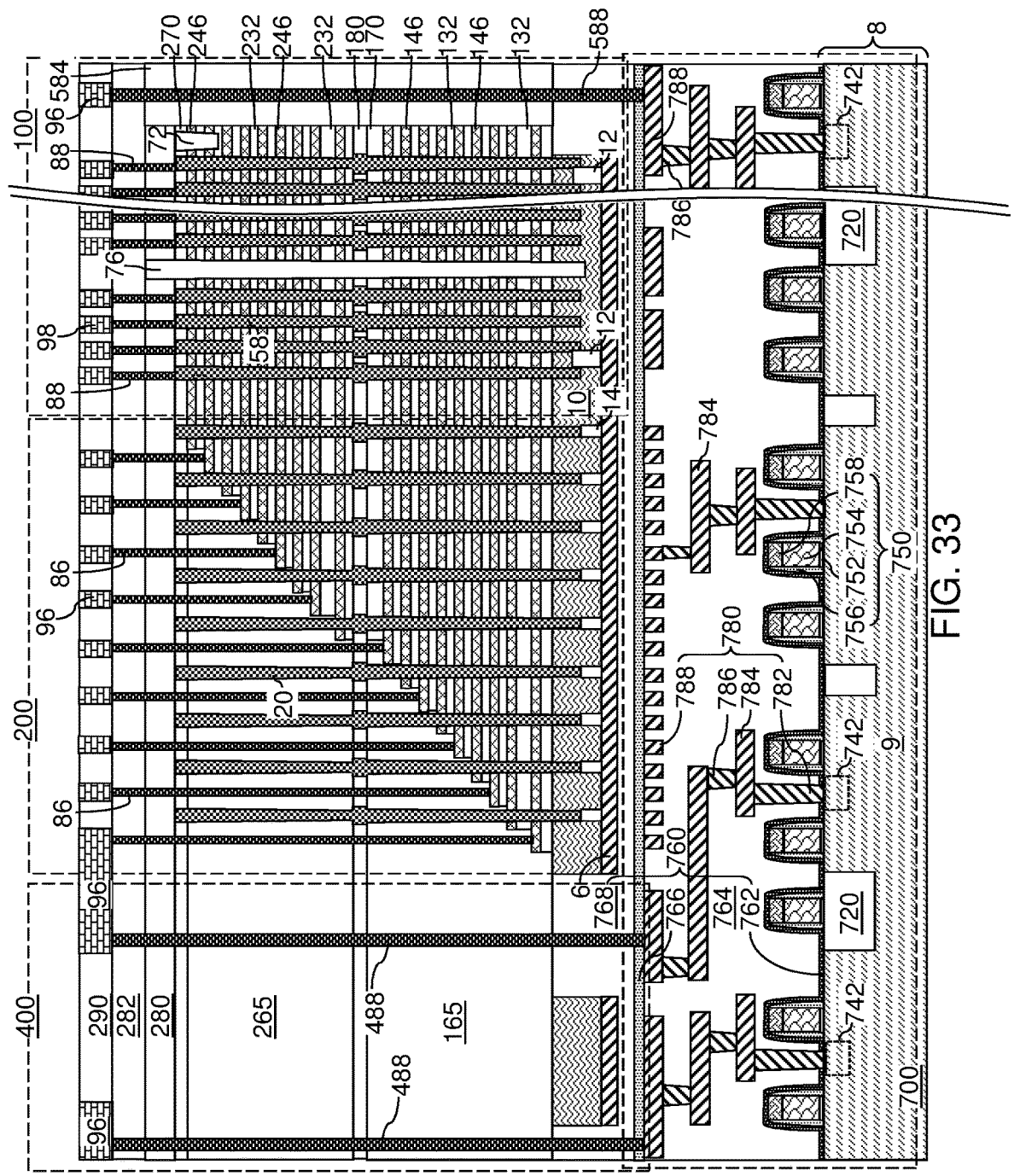
FIG. 33 is a vertical cross-sectional view of the exemplary structure after formation of upper metal line structures according to an embodiment of the present disclosure.

Referring to FIG. 33, at least one additional dielectric layer can be formed over the contact level dielectric layers (280, 282), and additional metal interconnect structures (herein referred to as upper-level metal interconnect structures) can be formed in the at least one additional dielectric layer. For example, the at least one additional dielectric layer can include a line-level dielectric layer 290 that is formed over the contact level dielectric layers (280, 282). The upper-level metal interconnect structures can include bit lines 98 contacting, or electrically connected to, a respective one of the drain contact via structures 88, and interconnection line structures 96 contacting, and/or electrically connected to, at least one of the staircase-region contact via structures 86, the peripheral-region contact via structures 488, and/or the array-region contact via structures 588.

Referring to all drawings and according to various embodiments of the present disclosure, a three-dimensional memory device is provided, which comprises: source-level material layers 10 located over a substrate 8, the source-level material layers 10 comprising a source contact layer 114; an alternating stack of insulating layers (132, 232) and electrically conductive layers (146, 246) located over the substrate-level material layers 114; memory stack structures 55 extending through the alternating stack {(132, 146), (232, 246)}, wherein each of the memory stack structures 55 comprises a memory film 50 and a vertical semiconductor channel 60 having a bottom surface that contacts a respective horizontal surface of the source contact layer 114; and dielectric pillar structures 12 embedded within the substrate-level material layers 10 and located between the memory stack structures 55.

In one embodiment, the source contact layer 114 comprises a doped semiconductor material and the dielectric pillar structures 12 are located between neighboring pairs of the memory stack structures 55.

In one embodiment, an entirety of each bottom surface of the vertical semiconductor channels 60 is in direct contact with the source contact layer 114. In one embodiment, the bottom surface 60B of the vertical semiconductor channel 60 within each of the memory stack structures 55 is adjoined to an outer sidewall 60S of the vertical semiconductor channel 60; and the outer sidewall 60S of the vertical semiconductor channel 60 includes a lateral contact region that contacts the source contact layer 114.

In one embodiment, the lateral contact region has an azimuthal angle α around a vertical axis VA passing through a geometrical center GC of the vertical semiconductor channel 60 that is less than 360 degrees. Alternatively, the lateral contact region includes an entire cylindrical surface of the outer sidewall 60S of the vertical semiconductor channel 60.

In one embodiment, the source-level material layers 10 comprise a lower source-level material layer 112 underlying the source contact layer 114; each of the dielectric pillar structures 12 comprises a first portion 121 contacting a respective sidewall of the lower source-level material layer 112 and a second portion 122 contacting a respective sidewall of the source contact layer 1114; and the second portion 122 has a lesser maximum lateral extent than the first portion.

In one embodiment, the three-dimensional memory device comprises a conductive plate layer 6 underlying the lower source-level material layer 112, wherein each of the dielectric pillar structures 12 is located on a top surface of the conductive plate layer 6.

In one embodiment, one of the dielectric pillar structures 12 continuously extends laterally between at least two of the memory films 50 of the memory stack structures 55.

In one embodiment, the source-level material layers 10 comprise a source-level insulating layer 117 overlying the source contact layer 114 and contacting sidewalls of the memory films 50 of the memory stack structures 55; and each of the dielectric pillar structures 12 contacts a bottom surface of the source-level insulating layer 117.

In one embodiment, the three-dimensional memory device comprises a monolithic three-dimensional NAND memory device; the electrically conductive layers (146, 246) comprise, or are electrically connected to, a respective word line of the monolithic three-dimensional NAND memory device; the substrate 8 comprises a silicon substrate; the monolithic three-dimensional NAND memory device comprises an array of monolithic three-dimensional NAND strings over the silicon substrate; and at least one memory cell in a first device level of the array of monolithic three-dimensional NAND strings is located over another memory cell in a second device level of the array of monolithic three-dimensional NAND strings. The silicon substrate contains an integrated circuit comprising a driver circuit for the memory device located thereon; the electrically conductive layers (146, 246) comprise a plurality of control gate electrodes having a strip shape extending substantially parallel to the top surface of the substrate 8; and the array of monolithic three-dimensional NAND strings comprises the vertical semiconductor channels 60 and a plurality of charge storage elements (comprise portions of the charge storage layers 54 that are located at levels of the electrically conductive layers (146, 246)), each charge storage element located adjacent to a respective one of the vertical semiconductor channels 60.

The source contact layer 114 contacts both the bottom surfaces 60B of the vertical semiconductor channels 60 and at bottom regions of the outer sidewalls 60S of the vertical semiconductor channels 60. Compared to prior art structures that provide contact only between sidewalls of vertical semiconductor channels and a source contact layer, the configurations of the vertical semiconductor channels 60 and the source contact layer 114 of the embodiments of the present disclosure provide a greater contact area, and thus, reduce contact resistance between the vertical semiconductor channels 60 and the source contact layer 114. The three-dimensional memory device of the embodiments of the present disclosure can have enhanced performance due to the reduced source contact resistance at the interfaces between the vertical semiconductor channels 60 and the source contact layer 114.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device comprising:
   source-level material layers located over a substrate, the source-level material layers comprising a source contact layer;
   an alternating stack of insulating layers and electrically conductive layers located over the source-level material layers;
   memory stack structures extending through the alternating stack, wherein each of the memory stack structures comprises a memory film and a vertical semiconductor channel having a bottom surface that contacts a respective horizontal surface of the source contact layer; and
   dielectric pillar structures embedded within the substrate-level material layers and located between the memory stack structures.

2. The three-dimensional memory device of claim 1, wherein an entirety of each bottom surface of the vertical semiconductor channels is in direct contact with the source contact layer.

3. The three-dimensional memory device of claim 2, wherein:
   the bottom surface of the vertical semiconductor channel within each of the memory stack structures is adjoined to an outer sidewall of the vertical semiconductor channel; and
   the outer sidewall of the vertical semiconductor channel includes a lateral contact region that contacts the source contact layer.

4. The three-dimensional memory device of claim 3, wherein the lateral contact region has an azimuthal angle around a vertical axis passing through a geometrical center of the vertical semiconductor channel that is less than 360 degrees.

5. The three-dimensional memory device of claim 3, wherein the lateral contact region includes an entire cylindrical surface of the outer sidewall of the vertical semiconductor channel.

6. The three-dimensional memory device of claim 1, wherein:
   the source contact layer comprises a doped semiconductor material;
   the source-level material layers comprise a lower source layer underlying the source contact layer;
   each of the dielectric pillar structures comprises a first portion contacting a respective sidewall of the lower source layer and a second portion contacting a respective sidewall of the source contact layer; and
   the second portion has a lesser maximum lateral extent than the first portion.

7. The three-dimensional memory device of claim 6, further comprising a conductive plate layer underlying the lower source layer, wherein each of the dielectric pillar structures is located on a top surface of the conductive plate layer.

8. The three-dimensional memory device of claim 1, wherein one of the dielectric pillar structures continuously extends laterally between at least two of the memory films of the memory stack structures, and wherein the dielectric pillar structures are located between neighboring pairs of the memory stack structures.

9. The three-dimensional memory device of claim 1, wherein:
   the source-level material layers comprise a source-level insulating layer overlying the source contact layer and contacting sidewalls of the memory films of the memory stack structures; and
   each of the dielectric pillar structures contacts a bottom surface of the source-level insulating layer.

10. The three-dimensional memory device of claim 1, wherein:
    the three-dimensional memory device comprises a monolithic three-dimensional NAND memory device;
    the electrically conductive layers comprise, or are electrically connected to, a respective word line of the monolithic three-dimensional NAND memory device;
    the substrate comprises a silicon substrate;

the monolithic three-dimensional NAND memory device comprises an array of monolithic three-dimensional NAND strings over the silicon substrate;

at least one memory cell in a first device level of the array of monolithic three-dimensional NAND strings is located over another memory cell in a second device level of the array of monolithic three-dimensional NAND strings;

the silicon substrate contains an integrated circuit comprising a driver circuit for the memory device located thereon;

the electrically conductive layers comprise a plurality of control gate electrodes having a strip shape extending substantially parallel to the top surface of the substrate; and the array of monolithic three-dimensional NAND strings comprises the vertical semiconductor channels and a plurality of charge storage elements, each charge storage element located adjacent to a respective one of the vertical semiconductor channels.

* * * * *